(12) United States Patent
Hatakeyama et al.

(10) Patent No.: US 8,426,115 B2
(45) Date of Patent: *Apr. 23, 2013

(54) PATTERNING PROCESS AND RESIST COMPOSITION

(75) Inventors: Jun Hatakeyama, Joetsu (JP); Kazuhiro Katayama, Joetsu (JP); Youichi Ohsawa, Joetsu (JP); Masaki Ohashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 326 days.

This patent is subject to a terminal disclaimer.

(21) Appl. No.: 12/849,344

(22) Filed: Aug. 3, 2010

(65) Prior Publication Data

US 2011/0033803 A1 Feb. 10, 2011

(30) Foreign Application Priority Data

Aug. 4, 2009 (JP) .................................. 2009-181504

(51) Int. Cl.
*G03F 7/004* (2006.01)
*G03F 7/039* (2006.01)
*G03F 7/20* (2006.01)
*G03F 7/26* (2006.01)
*G03F 7/40* (2006.01)

(52) U.S. Cl.
USPC ............................ 430/312; 430/326; 430/330

(58) Field of Classification Search ................ 430/270.1, 430/326, 328, 330, 331, 312, 394
See application file for complete search history.

(56) References Cited

U.S. PATENT DOCUMENTS

| | | | |
|---|---|---|---|
| 5,545,509 A | | 8/1996 | Cameron et al. |
| 6,242,153 B1* | | 6/2001 | Sato et al. .................. 430/270.1 |
| 6,448,420 B1 | | 9/2002 | Kinsho et al. |
| 7,537,880 B2 | | 5/2009 | Harada et al. |
| 2006/0110677 A1* | | 5/2006 | Houlihan et al. .......... 430/270.1 |
| 2007/0122736 A1* | | 5/2007 | Hatakeyama et al. ..... 430/270.1 |
| 2007/0231738 A1 | | 10/2007 | Kaneko et al. |
| 2008/0090172 A1 | | 4/2008 | Hatakeyama et al. |
| 2008/0199814 A1 | | 8/2008 | Brzozowy et al. |
| 2009/0155718 A1* | | 6/2009 | Chen et al. .................. 430/283.1 |
| 2009/0208886 A1* | | 8/2009 | Takemura et al. ............ 430/326 |
| 2010/0003622 A1 | | 1/2010 | Matsumaru et al. |
| 2010/0028809 A1 | | 2/2010 | Vanleenhove et al. |
| 2010/0035177 A1 | | 2/2010 | Ishikawa et al. |
| 2010/0062379 A1 | | 3/2010 | Iwashita |
| 2010/0159392 A1* | | 6/2010 | Hatakeyama et al. ..... 430/286.1 |
| 2010/0304297 A1* | | 12/2010 | Hatakeyama et al. ..... 430/270.1 |

FOREIGN PATENT DOCUMENTS

| | | |
|---|---|---|
| JP | 07-134399 A | 5/1995 |
| JP | 10-083079 A | 3/1998 |
| JP | 2000-327633 A | 11/2000 |
| JP | 2000-330270 A | 11/2000 |
| JP | 2001-166476 A | 6/2001 |
| JP | 2002-128750 A | 5/2002 |
| JP | 2002-265531 A | 9/2002 |
| JP | 2003-313464 A | 11/2003 |
| JP | 3796568 B2 | 7/2006 |
| JP | 3829913 B2 | 10/2006 |
| JP | 2007-056196 A | 3/2007 |
| JP | 2007-297590 A | 11/2007 |
| JP | 2008-033174 A | 2/2008 |
| JP | 2008-078220 A | 4/2008 |
| JP | 2008-083537 A | 4/2008 |
| JP | 2008-111103 A | 5/2008 |
| JP | 2008-122932 A | 5/2008 |
| JP | 2008-192774 A | 8/2008 |
| WO | 2008-059440 A2 | 5/2008 |
| WO | 2008-070060 A2 | 6/2008 |

OTHER PUBLICATIONS

B. J. Lin "Semiconductor Foundry, Lithography, and Partners", Proceedings of SPIE, Jul. 2002, p. xxix, vol. 4690.
Soichi Owa et al., "Immersion lithography; its potential performance and issues", Proceedings of SPIE, Jun. 2003, p. 724, vol. 5040.
Stephen Hsu et al., "Double Exposure Technique for 45nm node and Beyond", Proceedings of SPIE, Nov. 2005, p. 59921Q-1-59921Q-16, vol. 5992.
Masato Shibuya et al., "Performance of Resolution Enhancement Technique Using Both Multiple Exposure and Nonlinear Resist", Japan Journal of Applied Physics, Dec. 1994, p. 6874-6877, vol. 33 Part 1 No. 12B.
Kuang-Jung Rex Chen et al., "Resist Freezing Process for Double Exposure Lithography", Proceedings of SPIE, Mar. 2008, p. 69230G-1-69230G-10, vol. 6923.
Masafumi Hori et al., "Sub-40nm Half-Pitch Double Patterning with Resist Freezing Process", Proceedings of SPIE, Mar. 2008, p. 69230H-1-69230H-8, vol. 6923.

(Continued)

Primary Examiner — Anca Eoff
(74) Attorney, Agent, or Firm — Westerman, Hattori, Daniels & Adrian, LLP

(57) ABSTRACT

A pattern is formed by coating a first positive resist composition comprising a copolymer comprising lactone-containing recurring units, acid labile group-containing recurring units and carbamate-containing recurring units, and a photoacid generator onto a substrate to form a first resist film, patternwise exposure, PEB, and development to form a first resist pattern, heating the first resist pattern for inactivation to acid, coating a second positive resist composition comprising a $C_3$-$C_8$ alcohol and an optional $C_6$-$C_{12}$ ether onto the first resist pattern-bearing substrate to form a second resist film, patternwise exposure, PEB, and development to form a second resist pattern.

13 Claims, 8 Drawing Sheets

OTHER PUBLICATIONS

Nikolaos Bekiaris et al., "A Lithographic and Process Assessment of Photoresist Stabilization for Double-Patterning using 172 nm Photoresist Curing", Proceedings of SPIE, Mar. 2008, p. 692321-1-692321-8, vol. 6923.

Hiroko Nakamura et al., "Ion implantation as insoluble treatment for resist stacking process", Proceedings of SPIE, Mar. 2008, p. 692322-1-692322-12, vol. 6923.

Satoru Shimura et al., "Advanced Resist process enabling implementation of CD controllability for 32nm and beyond", Proceedings of SPIE, Mar. 2008, p. 69233C-1-69233C-6, vol. 6923.

David J. Abdallah et al., "A Novel Resist Freeze Process for Double Imaging", Journal of Photopolymer Science and Technology, May 2008, p. 655-663, vol. 21 No. 5.

James F. Cameron et al., "Photogeneration of Organic Bases from o—Nitrobenzyl-Derived Carbamates", Journal of the American Chemical Society, May 1991, p. 4303-4313, vol. 113 Issue 11.

K. A. Graziano, et al., "Novel Acid-Hardening Positive Photoresist Technology", Proceedings of SPIE, Jun. 1991, p. 75, vol. 1466.

\* cited by examiner

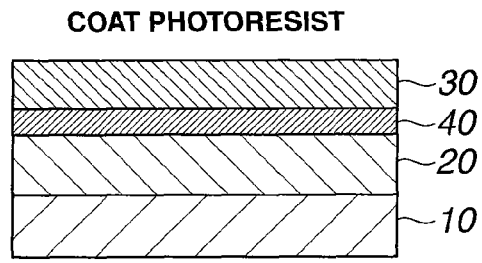
FIG.1A COAT PHOTORESIST
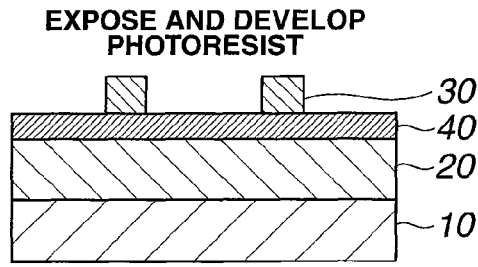
FIG.1B EXPOSE AND DEVELOP PHOTORESIST
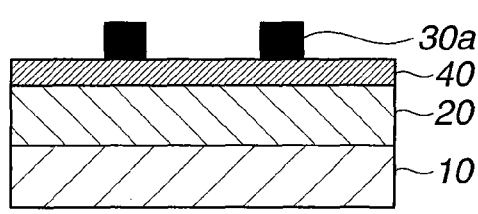
FIG.1C BAKE FOR INACTIVATING ACID
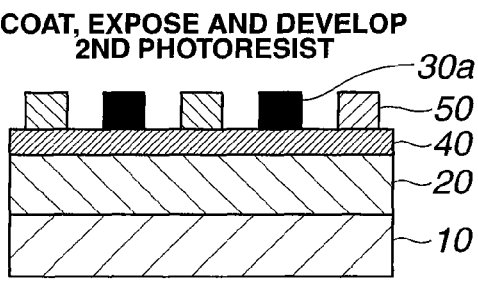
FIG.1D COAT, EXPOSE AND DEVELOP 2ND PHOTORESIST
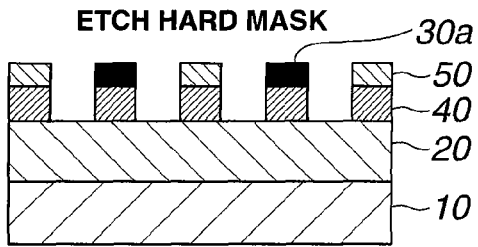
FIG.1E ETCH HARD MASK
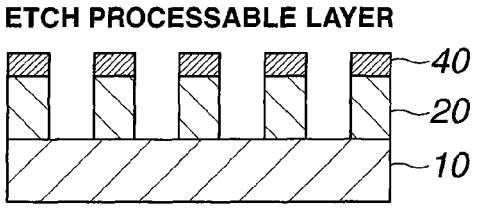
FIG.1F ETCH PROCESSABLE LAYER

FIRST PATTERN

SECOND PATTERN

FIRST PATTERN

SECOND PATTERN

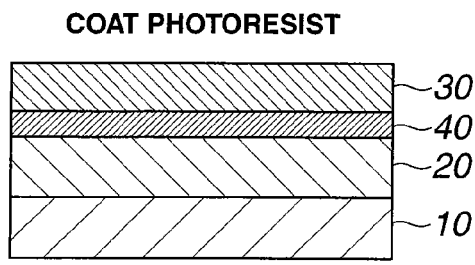
FIG.4A PRIOR ART — COAT PHOTORESIST
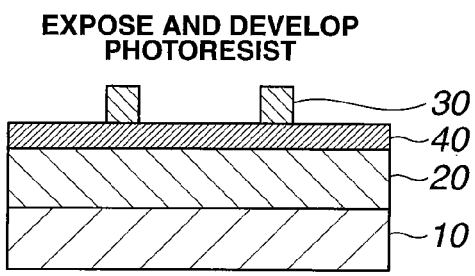
FIG.4B PRIOR ART — EXPOSE AND DEVELOP PHOTORESIST
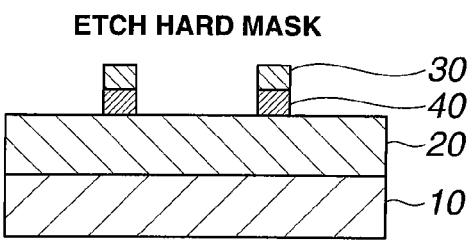
FIG.4C PRIOR ART — ETCH HARD MASK
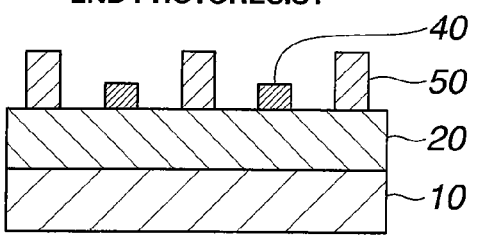
FIG.4D PRIOR ART — COAT, EXPOSE AND DEVELOP 2ND PHOTORESIST
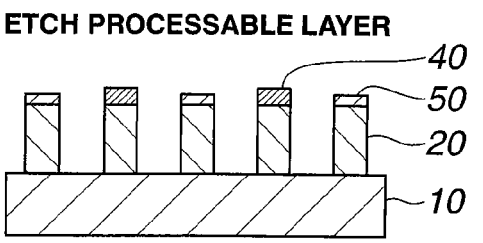
FIG.4E PRIOR ART — ETCH PROCESSABLE LAYER

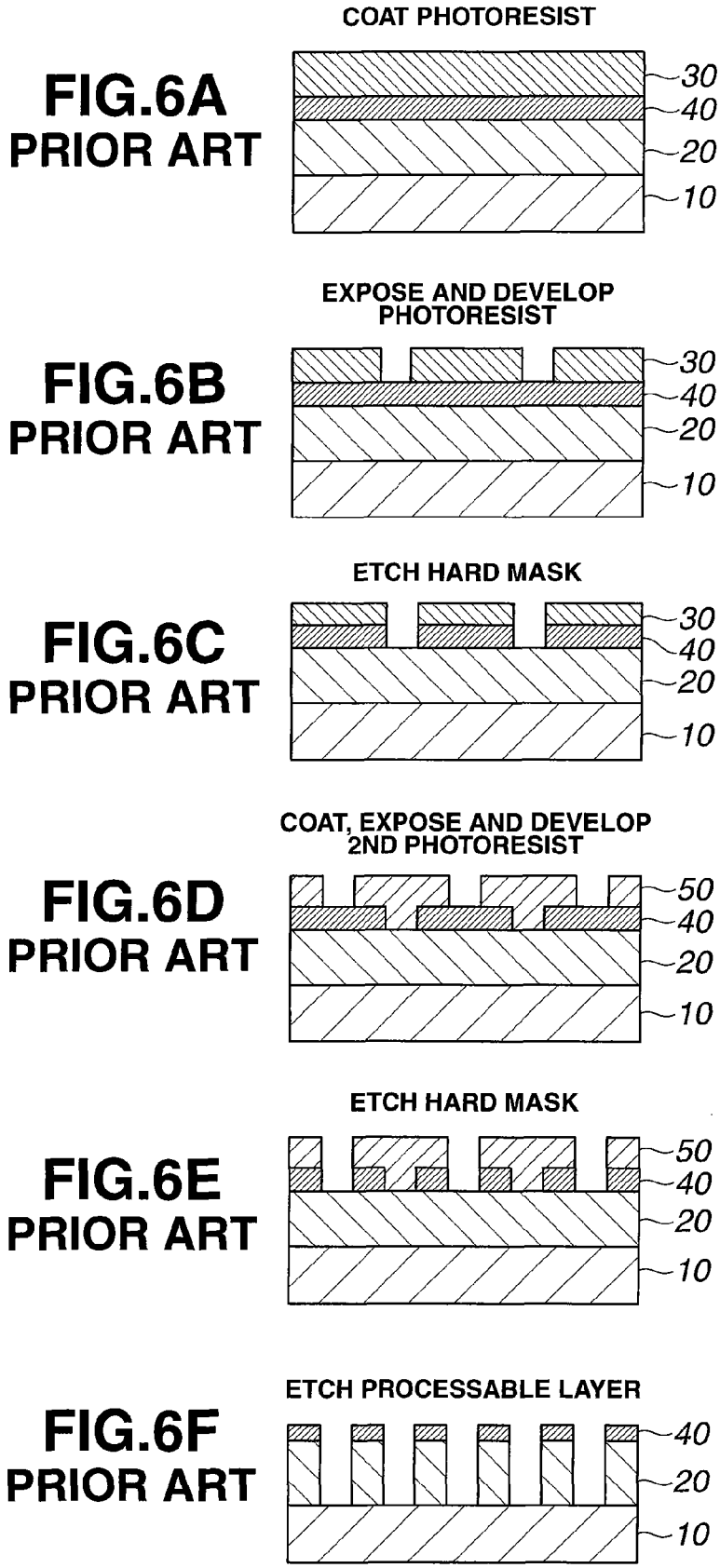

A (FIRST PATTERN)   B (SECOND PATTERN)

A (FIRST PATTERN)   B (SECOND PATTERN)

PATTERNING PROCESS AND RESIST COMPOSITION

CROSS-REFERENCE TO RELATED APPLICATION

This non-provisional application claims priority under 35 U.S.C. §119(a) on Patent Application No. 2009-181504 filed in Japan on Aug. 4, 2009, the entire contents of which are hereby incorporated by reference.

TECHNICAL FIELD

This invention relates to a patterning process involving the steps of forming a first resist pattern from a first resist film through exposure and development, heating the first resist pattern to generate a base for inactivation to acid, coating a second positive resist composition comprising a solvent containing a $C_3$-$C_8$ alcohol and an optional $C_6$-$C_{12}$ ether and not dissolving away the first resist pattern, and forming a second resist pattern in a selected area of the first resist pattern where no pattern features are formed, thereby reducing the distance between pattern features. It also relates to a resist composition used in the process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix, 2002).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus could be shifted by a variation of water's refractive index with a temperature change. The problem of refractive index variation could be solved by controlling the water temperature within a tolerance of ¹/₁₀₀° C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE Vol. 5040, p 724, 2003). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge or width roughness (LER or LWR) of resist film, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between features of the first pattern. See Proc. SPIE Vol. 5992, 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in an alcohol that does not dissolve away the positive resist material in a second exposure. Since negative resist materials with low resolution are used, these methods entail degradation of resolution (see JP-A 2008-078220).

If first exposure is followed by second exposure at a half-pitch shifted position, the optical energy of second exposure offsets the optical energy of first exposure so that the contrast becomes zero. If a contrast enhancement layer (CEL) is formed on the resist film, the incident light to the resist film becomes nonlinear so that the first and second exposures do not offset each other. Thus an image having a half pitch is formed. See Jpn. J. Appl. Phy. Vol. 33 (1994) p 6874-6877. It is expected that similar effects are produced by using an acid generator capable of two photon absorption to provide a nonlinear contrast.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

Now under investigation is the resist pattern freezing technology involving forming a first resist pattern on a substrate, taking any suitable means for insolubilizing the resist pattern with respect to the resist solvent and alkaline developer, applying a second resist thereon, and forming a second resist pattern in space portions of the first resist pattern. With this freezing technology, etching of the substrate is required only once, leading to improved throughputs and avoiding the problem of misregistration due to stress relaxation of the hard mask during etching.

With respect to the freezing technology, a number of reports have been published. Known are thermal insolubilization (Proc. SPIE Vol. 6923, p 69230G (2008)); coating of a cover film and thermal insolubilization (Proc. SPIE Vol. 6923, p 69230H (2008)); insolubilization by irradiation of light having an extremely short wavelength, for example, 172 nm wavelength (Proc. SPIE Vol. 6923, p 692321 (2008)); insolubilization by ion implantation (Proc. SPIE Vol. 6923, p 692322 (2008)); insolubilization through formation of thin-film oxide film by CVD; insolubilization by light irradiation and special gas treatment (Proc. SPIE Vol. 6923, p 69233C1 (2008)); insolubilization of a resist pattern by treatment of resist pattern surface with a metal alkoxide or metal halide (e.g., titanium, zirconium or aluminum) or an isocyanate-containing silane compound (JP-A 2008-033174); insolubilization of a resist pattern by coating its surface with water-soluble resin (JP-A 2008-083537); insolubilization by ethylene diamine gas and baking (J. Photopolym. Sci. Technol., Vol. 21, No. 5, p 655 (2008)); and insolubilization by coating of an amine-containing solution and hard-baking for crosslinking (WO 2008/070060).

With respect to the freezing technology, one basic idea is proposed in WO 2008/059440. JP-A 2008-192774 discloses a method including insolubilizing a first resist pattern by application of radiation and heat, coating the insolubilized pattern with a resist solution comprising a base polymer comprising recurring units having hexafluoroalcohol groups and acid labile groups in an alcohol solvent, and forming a second resist pattern therefrom. These insolubilization methods, which involve heat treatment at elevated temperature, give rise to problems of pattern deformation, especially film slimming, and size narrowing or widening, which must be overcome.

Also known in the art are nitrobenzyl carbamates as a photobase generator (J. Am. Chem. Soc. 1991, 113, p 4303-4313) and photoresist compositions comprising the same (JP-A H07-134399 and Proc. SPIE Vol. 1466, p 75 (1991)). Specifically, JP-A H07-134399 discloses a chemically amplified resist composition comprising a polymer having a base labile functional group and a photobase generator. In Proc. SPIE Vol. 1466, p 75 (1991), a resist film is coated and then heated to decompose a thermal acid generator to generate an acid and to generate a base in the exposed area for neutralizing the acid, and the portion where the acid is present is crosslinked to form a positive pattern. It is also proposed in JP-A H10-083079 to add a photobase generator to a conventional positive photoresist composition comprising a base polymer having acid labile groups and a photoacid generator. JP-A 2003-313464 discloses an ink composition for UV ink-jet printing comprising a photoacid generator and a thermal base generator. JP-A 2007-056196 discloses a composition comprising a polyimide precursor and a thermal base generator wherein polyimide is formed by heating.

Base amplifiers capable of generating a basic substance under the action of an amine are proposed in JP-A 2000-330270 and JP-A 2002-128750. Polymerizable monomers having a base amplifying function and polymers resulting therefrom are described in JP-A 2002-265531.

Citation List
Patent Document 1: JP-A 2008-033174
Patent Document 2: JP-A 2008-083537
Patent Document 3: WO 2008/070060
Patent Document 4: WO 2008/059440
Patent Document 5: JP-A 2008-192774
Patent Document 6: JP-A 2008-078220
Patent Document 7: JP-A H07-134399
Patent Document 8: JP-A H10-083079
Patent Document 9: JP-A 2003-313464
Patent Document 10: JP-A 2007-056196
Patent Document 11: JP-A 2000-330270
Patent Document 12: JP-A 2002-128750
Patent Document 13: JP-A 2002-265531
Non-Patent Document 1: Proc. SPIE Vol. 4690, xxix, 2002
Non-Patent Document 2: Proc. SPIE Vol. 5040, p 724, 2003
Non-Patent Document 3: Proc. SPIE Vol. 5992, 59921Q-1-16, 2005
Non-Patent Document 4: Jpn. J. Appl. Phy., Vol. 33 (1994), p 6874-6877
Non-Patent Document 5: Proc. SPIE Vol. 6923, p 69230G (2008)
Non-Patent Document 6: Proc. SPIE Vol. 6923, p 69230H (2008)
Non-Patent Document 7: Proc. SPIE Vol. 6923, p 692321 (2008)
Non-Patent Document 8: Proc. SPIE Vol. 6923, p 692322 (2008)
Non-Patent Document 9: Proc. SPIE Vol. 6923, p 69233C1 (2008)
Non-Patent Document 10: J. Photopolym. Sci. Technol., Vol. 21, No. 5, p 655 (2008)
Non-Patent Document 11: J. Am. Chem. Soc. 1991, 113, p 4303-4313
Non-Patent Document 12: Proc. SPIE Vol. 1466, p 75 (1991)

SUMMARY OF INVENTION

It is understood that when substrate processing is carried out by double dry etchings using resist patterns fabricated by double exposures and developments, the throughput is reduced to one half. Also an issue of pattern misregistration by dry etchings occurs.

The above-mentioned methods of insolubilizing a resist pattern utilize high temperature and light irradiation which cause the pattern to be deformed due to shrinkage. Upon heating and irradiation, the resist pattern undesirably experiences a reduction in pattern height or line width and longitudinal shrinkage.

Therefore, an object of the invention is to provide a pattern forming process in order to enable a double patterning process of processing a substrate by a single dry etching. Another object is to provide a resist composition for use in the pattern forming process.

The inventors have found that a pattern forming process comprising coating a first positive resist composition comprising a copolymer comprising recurring units having lactone as an adhesive group, recurring units having an acid labile group, and recurring units having a carbamate structure, effecting first exposure and development to form a first resist pattern, baking the first resist pattern to generate an amine compound from the recurring units having a carbamate structure for inactivating the pattern to acid, coating a second positive resist composition comprising a solvent containing an alcohol of 3 to 8 carbon atoms and an optional ether of 6 to 12 carbon atoms onto the first resist pattern, and effecting second exposure and development to form a second resist pattern is advantageous in that the inactivation treatment prevents intermixing between the first and second resist films and also prevents the first resist pattern from being dissolved in the second developer even when the acid is generated in the first resist pattern upon second exposure.

In one aspect, the invention provides a process for forming a pattern, comprising the steps of:

coating a first positive resist composition comprising a copolymer comprising recurring units having lactone as an adhesive group, recurring units having an acid labile group, and recurring units having a carbamate structure, and a photoacid generator onto a substrate to form a first resist film, exposing the first resist film to high-energy radiation, post-exposure baking, and developing the first resist film with a developer to form a first resist pattern, heating the first resist pattern at 100 to 200° C. for 3 to 200 seconds for inactivating the first resist pattern to acid, coating a second positive resist composition comprising a solvent containing an alcohol of 3 to 8 carbon atoms and an optional ether of 6 to 12 carbon atoms onto the first resist pattern-bearing substrate to form a second resist film, exposing the second resist film to high-energy radiation, post-exposure baking, and developing the second resist film with a developer to form a second resist pattern.

In a preferred embodiment, the recurring units having a carbamate structure are represented by formula (a1) or (a2) in the following general formula (1):

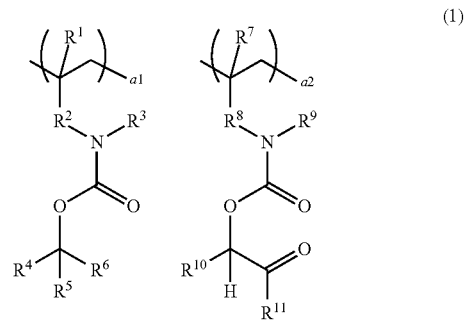

wherein R¹ and R⁷ are hydrogen or methyl, R² and R⁸ are a single bond, methylene, ethylene, phenylene, phenylmethylene, phenylethylene, phenylpropylene, or —C(=O)—R¹²—, wherein R¹² is a straight, branched or cyclic $C_1$-$C_{10}$ alkylene, $C_6$-$C_{10}$ arylene, or $C_2$-$C_{12}$ alkenylene group, R³ and R⁹ are hydrogen or a straight, branched or cyclic $C_1$-$C_{10}$ alkyl, or when R² and R⁸ are —C(=O)—R¹²—, R³ and R⁹ may bond with R¹² to form a ring with the nitrogen atom to which they are attached, R⁴, R⁵ and R⁶ are hydrogen or a straight, branched or cyclic $C_1$-$C_{10}$ alkyl, $C_6$-$C_{14}$ aryl, or $C_7$-$C_{14}$ alkenyl group, which may contain a straight, branched or cyclic $C_1$-$C_6$ alkyl, nitro, halogen, cyano, trifluoromethyl, carbonyl, ester, lactone ring, carbonate, maleimide, amide, $C_1$-$C_6$ alkoxy, or sulfo group, R⁴ and R⁵, R⁵ and R⁶, or R⁴ and R⁶ may bond together to form a ring with the carbon atom to which they are attached, exclusive of the case where all of R⁴, R⁵ and R⁶ are hydrogen or alkyl, R¹⁰ and R¹¹ are a $C_6$-$C_{14}$ aryl or $C_7$-$C_{14}$ aralkyl group, which may contain a straight, branched or cyclic $C_1$-$C_6$ alkyl, nitro, halogen, cyano, trifluoromethyl, $C_1$-$C_6$ alkoxy, or carbonyl group.

In a preferred embodiment, the first resist pattern includes spaces where no pattern features are formed, and the second resist pattern is formed in the spaces of the first resist pattern, thereby reducing the distance between the first and second pattern features. In another preferred embodiment, the second resist pattern is formed so as to cross the first resist pattern. In a further preferred embodiment, the second resist pattern is formed in an area where the first resist pattern is not formed and in a different direction from the first resist pattern.

In a preferred embodiment, one or both of the exposure steps to form the first and second resist patterns are by immersion lithography using water.

In a preferred embodiment, the second positive resist composition comprises a base polymer having a 2,2,2-trifluoro-1-hydroxyethyl group. More preferably, the base polymer in the second positive resist composition comprises recurring units having a 2,2,2-trifluoro-1-hydroxyethyl group, represented by the general formula (2):

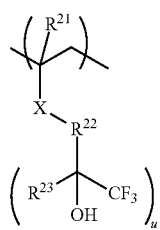

(2)

wherein R²¹ is hydrogen or methyl, X is a single bond, —O— or —C(=O)—O—, u is 1 or 2, in the case of u=1, R²² is a straight, branched or cyclic $C_1$-$C_{10}$ alkylene group which may contain an ester group, ether group or fluorine atom, or R²² may bond with R²³ to form a ring with the carbon atom to which they are attached, and in the case of u=2, R²² is the foregoing alkylene group, with one carbon-bonded hydrogen atom eliminated, and R²³ is hydrogen, $C_1$-$C_6$ alkyl or trifluoromethyl, or R²³ is $C_1$-$C_6$ alkylene when it bonds with R²².

In a more preferred embodiment, the base polymer in the second positive resist composition is a copolymer comprising recurring units (b) having a 2,2,2-trifluoro-1-hydroxyethyl group and recurring units (c) having an acid labile group, represented by the general formula (3):

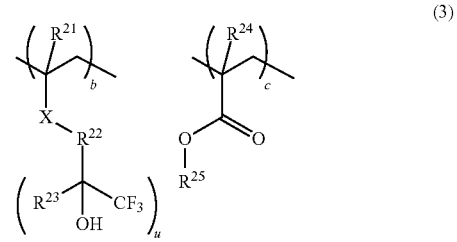

(3)

wherein X, R²¹, R²², R²³, and u are as defined above, R²⁴ is hydrogen or methyl, R²⁵ is an acid labile group, b and c are numbers in the range: 0<b<1.0, 0<c<1.0, and 0<b+c≦1.0.

In a further preferred embodiment, the base polymer in the second positive resist composition is a copolymer comprising recurring units (b) having a 2,2,2-trifluoro-1-hydroxyethyl group, recurring units (c) having an acid labile group, and recurring units (d-1) having a phenol, carboxyphenyl, hydroxynaphthyl or carboxynaphthyl group, represented by the general formula (4):

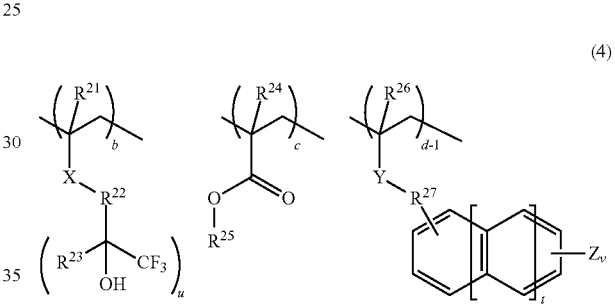

(4)

wherein X, R²¹, R²², R²³, R²⁴, R²⁵, and u are as defined above, R²⁶ is hydrogen or methyl, Y is a single bond, —C(=O)—O— or —C(=O)—NH—, R²⁷ is a single bond or a straight or branched $C_1$-$C_6$ alkylene group, Z is hydroxyl or carboxyl, t is 0 or 1, v is 1 or 2, b, c and d-1 are numbers in the range: 0<b<1.0, 0<c<1.0, 0<(d-1)<1.0, and 0<b+c+(d-1) ≦1.0.

In a further preferred embodiment, the base polymer in the second positive resist composition is a copolymer comprising recurring units (b) having a 2,2,2-trifluoro-1-hydroxyethyl group, recurring units (c) having an acid labile group, and recurring units (d-2) derived from hydroxyacenaphthylene or carboxyacenaphthylene, represented by the general formula (5):

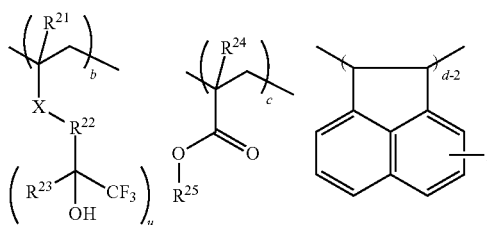

(5)

wherein X, $R^{21}$, $R^{22}$, $R^{23}$, $R^{24}$, $R^{25}$, and u are as defined above, Z is hydroxyl or carboxyl, w is 1 or 2, b, c and d-2 are numbers in the range: $0<b<1.0$, $0<c<1.0$, $0<(d-2)<1.0$, and $0<b+c+(d-2)\leq 1.0$.

In a preferred embodiment, the alcohol of 3 to 8 carbon atoms is selected from the group consisting of n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol, and mixtures of two or more of the foregoing.

In a preferred embodiment, the ether of 6 to 12 carbon atoms is selected from the group consisting of methyl cyclopentyl ether, methyl cyclohexyl ether, diisopropyl ether, diisobutyl ether, diisopentyl ether, di-n-pentyl ether, methyl cyclopentyl ether, methyl cyclohexyl ether, di-n-butyl ether, di-sec-butyl ether, di-sec-pentyl ether, di-tert-amyl ether, di-n-hexyl ether, anisole, 2-methylanisole, 3-methylanisole, 4-methylanisole, 2,3-dimethylanisole, 2,4-dimethylanisole, 3,4-dimethylanisole, 2,5-dimethylanisole, 2,6-dimethylanisole, 3,5-dimethylanisole, 3,6-dimethylanisole, 2,3,4-trimethylanisole, 2,3,6-trimethylanisole, 2,4,6-trimethylanisole, 2,4,5,6-tetramethylanisole, 2-ethylanisole, 3-ethylanisole, 4-ethylanisole, 2-isopropylanisole, 3-isopropylanisole, 4-isopropylanisole, 4-propylanisole, 2-butylanisole, 3-butylanisole, 4-butylanisole, 2-tert-butylanisole, 3-tert-butylanisole, 4-tert-butylanisole, pentamethylanisole, 2-vinylanisole, 3-vinylanisole, 4-methoxystyrene, ethyl phenyl ether, propyl phenyl ether, butyl phenyl ether, ethyl 3,5-xylyl ether, ethyl 2,6-xylyl ether, ethyl 2,4-xylyl ether, ethyl 3,4-xylyl ether, ethyl 2,5-xylyl ether, methyl benzyl ether, ethyl benzyl ether, isopropyl benzyl ether, propyl benzyl ether, methyl phenethyl ether, ethyl phenethyl ether, isopropyl phenethyl ether, propyl phenethyl ether, butyl phenethyl ether, vinyl phenyl ether, allyl phenyl ether, vinyl benzyl ether, allyl benzyl ether, vinyl phenethyl ether, allyl phenethyl ether, 4-ethylphenetole, and tert-butyl phenyl ether, and mixtures of two or more of the foregoing.

In a further preferred embodiment, the solvent containing an alcohol of 3 to 8 carbon atoms and an optional ether of 6 to 12 carbon atoms in the second positive resist composition does not dissolve away the first resist pattern, allows components of the second resist composition to be dissolved therein, and is such that the first resist film experiences a slimming of not more than 10 nm when the solvent is dispensed on the first resist film for 30 seconds and then removed by spin drying and baking at a temperature not higher than 130° C.

In another aspect, the invention provides a resist composition comprising a base resin, a photoacid generator, and an organic solvent, wherein the base resin is a copolymer comprising recurring units having lactone as an adhesive group, recurring units having an acid labile group, and recurring units represented by formula (a1) or (a2) in the following general formula (1):

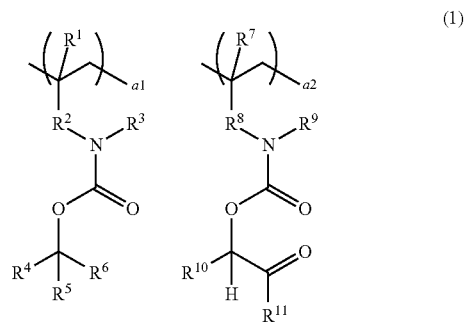

wherein $R^1$ to $R^{11}$ are as defined above.

ADVANTAGEOUS EFFECTS OF INVENTION

The pattern forming process ensures that as a result of double patterning including two exposures, a second resist pattern can be formed in a space portion of a first resist pattern without deformation of the first resist pattern.

According to the invention, a pattern is formed by coating a first positive resist composition comprising a copolymer comprising recurring units having lactone as an adhesive group, recurring units having an acid labile group, and recurring units having a carbamate structure onto a substrate to form a first resist film, exposing the first resist film to high-energy radiation, PEB, and developing the first resist film with a developer to form a first resist pattern, heating the first resist pattern to generate a base from the recurring units having a carbamate structure for inactivating the pattern to acid, coating a second positive resist composition comprising a $C_3$-$C_8$ alcohol or a mixture of a $C_3$-$C_8$ alcohol and a $C_6$-$C_{12}$ ether as a solvent onto the first resist pattern-bearing substrate to form a second resist film, exposing the second resist film to high-energy radiation, PEB, and developing the second resist film with a developer to form a second resist pattern. When the second pattern is formed in an area of the first pattern where first pattern features have not been formed, for example, this double patterning reduces the pitch between pattern features to one half. The substrate can be processed by a single dry etching.

BRIEF DESCRIPTION OF THE DRAWINGS

FIG. 1 is a cross-sectional view of a double patterning process according one embodiment of the invention. FIG. 1A shows a laminate of substrate, processable layer, hard mask and first resist film, FIG. 1B shows the first resist film being exposed and developed, FIG. 1C shows the first resist film being inactivated to acid, FIG. 1D shows a second resist film being formed, exposed and developed, FIG. 1E shows the hard mask being etched, and FIG. 1F shows the processable layer being etched.

FIG. 2 is a schematic view of a double patterning process according one embodiment of the invention.

FIG. 3 is a schematic view of a double patterning process according another embodiment of the invention.

FIG. 4 is a cross-sectional view of an exemplary prior art double patterning process. FIG. 4A shows a laminate of substrate, processable layer, hard mask and resist film, FIG. 4B shows the resist film being exposed and developed, FIG. 4C shows the hard mask being etched, FIG. 4D shows a second resist film being formed, exposed and developed, and FIG. 4E shows the processable layer being etched.

FIG. 5 is a cross-sectional view of another exemplary prior art double patterning process.

FIG. 6 is a cross-sectional view of a further exemplary prior art double patterning process. FIG. 6A shows a laminate of substrate, processable layer, hard mask and resist film, FIG. 6B shows the resist film being exposed and developed, FIG. 6C shows the hard mask being etched, FIG. 6D shows, after removal of the first resist film, a second resist film being formed, exposed and developed, FIG. 6E shows the hard mask being etched, and FIG. 6F shows the processable layer being etched.

DESCRIPTION OF THE PREFERRED EMBODIMENT

Figure 2A:
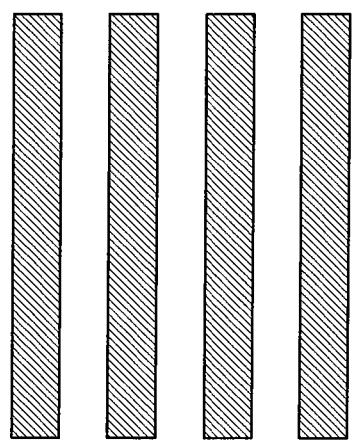
FIG. 2A shows a first pattern being formed.

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. As used herein, the terminology "($C_x$-$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer." The term "processable layer" is interchangeable with patternable layer and refers to a layer that can be processed such as by etching to form a pattern therein.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
TMAH: tetramethylammonium hydroxide
PGMEA: propylene glycol monomethyl ether acetate In connection with the double patterning lithography involving double exposures and developments to form a half-pitch pattern, the inventors made efforts to develop a positive resist material which enables to process a substrate by a single dry etching and a patterning process using the same.

The inventors have discovered that a double patterning process capable of reducing the pitch between pattern features to one half can be practiced by coating a first positive resist composition on a substrate, forming a first resist pattern through exposure and development, heating the first resist pattern to generate a basic compound to neutralize the acid, coating a second positive resist composition comprising a solvent which contains a $C_3$-$C_8$ alcohol or a mixture of a $C_3$-$C_8$ alcohol and a $C_6$-$C_{12}$ ether onto the first resist pattern-bearing substrate, and forming a second resist pattern through exposure and development while retaining the first resist pattern. Then the substrate can be processed by a single dry etching. The present invention is predicated on this discovery.

The first and second positive resist compositions are chemically amplified positive resist compositions each comprising a base polymer and a solvent. At least the first positive resist composition should not be dissolvable in the solvent of the second positive resist composition. When the first positive resist composition comprises a base polymer containing lactone as the main adhesive group, it is not dissolvable in alcohol and ether solvents. On the other hand, in order that the second positive resist composition be dissolvable in alcohol and ether solvents, the presence of weakly acidic hydroxyl groups in the base polymer of the second positive resist composition is essential. The weakly acidic hydroxyl groups include hexafluoroalcohol groups as typified by 2,2,2-trifluoro-1-hydroxyethyl, phenol groups, and carboxyl groups. Although benzene rings cannot be used as the base polymer for resist material on account of their strong absorption at wavelength 193 nm or can be copolymerized only in a limited amount, naphthalene rings can be applied to the resist base polymer because the absorption peak wavelength is shifted toward the longer wavelength side.

Most methods of insolubilizing the first resist pattern which have been proposed thus far rely on heat treatment to induce crosslinking reaction for curing. The heat treatment to induce crosslinking reaction is often at high temperatures above 140° C. If heated at temperatures above the glass transition temperature, the pattern may flow or the pattern may shrink due to deprotection of acid labile groups. Shrinkage of the pattern leads to a problem of reducing the line width, pattern height, and pattern length and a problem that an elbow pattern is deformed and rounded at its corner. To minimize pattern deformation, a means for insolubilizing the first resist pattern without resorting to heat treatment or at a sufficiently low temperature to cause no pattern deformation is desired.

Upon patternwise exposure of the second resist film to radiation, the first resist pattern is also exposed to radiation. If a solvent which does not dissolve away the first resist pattern is used in the second resist composition, this prevents intermixing with the first resist pattern or dissolution of the first resist pattern during coating of the second resist composition. However, since the acid is generated in the first resist pattern upon exposure of the second resist film, the first resist pattern can be dissolved away during development of the second resist film.

If an amine component is present in the first resist pattern and in excess relative to the acid generated upon second exposure, it inactivates or neutralizes the acid generated upon second exposure, preventing the first resist pattern from being dissolved away during development of the second resist film. Usually, an amine quencher is added to photoresist material for the purposes of increasing contrast and inhibiting acid diffusion, but in a smaller amount than the acid generator. In order that amine be available in a larger amount than the amount of the acid formed by decomposition of the acid generator in the first resist pattern, it is contemplated to previously add a thermal base generator to the first resist material so that an amine compound may be generated in the first resist pattern by heating after its formation. If the amine compound is bound to the backbone of the polymer, the acid neutralizing ability is enhanced because the amine does not volatilize. Then a polymer having a base generator copolymerized therewith is necessary as the base resin for resist materials.

The base generator used herein is ideally a compound having a double bond for copolymerization which is photo-insensitive, non-basic in itself, and decomposable to generate an amine by heating at 100 to 200° C. Although salts of amines with carboxylic acids and salts of amines with sulfonic acids are photo-insensitive and function as a thermal base generator, they are inadequate in that they function as a quencher by ion exchange with a fluorosulfonic acid generated in the resist film upon exposure. The amine compound in the form of t-butylcarbamate described in JP-A 2001-166476 is decomposed with an acid to form an amine compound. It is undesirable that an amine is produced during PEB, because the amine is lost at this stage. Methyl carbamate is so heat stable that its decomposition requires heat treatment at a high temperature above 200° C. The heat treatment at a high temperature above 200° C., however, causes thermal flow to the resist pattern or induces shrinkage due to decomposition of acid labile groups. In contrast, base generators in the form of benzylcarbamate or benzoincarbamate are desirably used for the object of the invention since their pyrolysis temperature is about 150° C. or lower. Potential generation of a base at a temperature below 100° C. is undesirable because this indicates that an amine generates during pre-baking after spin coating, resulting in the first photoresist being reduced in sensitivity. An amine amplifier which is catalyzed by an amine to generate another amine compound is desirably used for the object of the invention. The amine amplifiers are described in JP-A 2000-330270 and JP-A 2002-265531. For the object of the invention, benzylcarbamate or benzoincarbamate type base generators having a polymerizable double bond must be copolymerized.

Accordingly, the first positive resist composition used herein for forming the first resist pattern comprises a copolymer comprising recurring units having a lactone adhesive group, recurring units having an acid labile group, and recurring units having a carbamate structure as the base resin, and a photoacid generator.

Preferably the recurring units having a carbamate structure are represented by formula (a1) or (a2) in the following general formula (1).

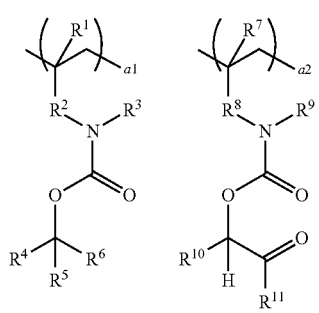

(1)

Herein $R^1$ and $R^7$ are hydrogen or methyl. $R^2$ and $R^8$ are a single bond, methylene, ethylene, phenylene, phenylmethylene, phenylethylene, phenylpropylene, or —C(=O)—$R^{12}$—, wherein $R^{12}$ is a straight, branched or cyclic $C_1$-$C_{10}$ alkylene, $C_6$-$C_{10}$ arylene, or $C_2$-$C_{12}$ alkenylene group. $R^3$ and $R^9$ are hydrogen or a straight, branched or cyclic $C_1$-$C_{10}$ alkyl, or when $R^2$ and $R^8$ are —C(=O)—$R^{12}$—, $R^3$ and $R^9$ may bond with $R^{12}$ to form a ring with the nitrogen atom to which they are attached, preferably a non-aromatic ring composed of 3 to 8 carbon atoms and one nitrogen atom. $R^4$, $R^5$ and $R^6$ are hydrogen or a straight, branched or cyclic $C_1$-$C_{10}$ alkyl, $C_6$-$C_{14}$ aryl, or $C_7$-$C_{14}$ alkenyl group, which may contain a straight, branched or cyclic $C_1$-$C_6$ alkyl, nitro, halogen, cyano, trifluoromethyl, carbonyl, ester, lactone ring, carbonate, maleimide, amide, $C_1$-$C_6$ alkoxy, or sulfo group, a pair of $R^4$ and $R^5$, $R^5$ and $R^6$, or $R^4$ and $R^6$ may bond together to form a ring with the carbon atom to which they are attached, specifically a non-aromatic or aromatic ring of 3 to 10 carbon atoms. The case where all of $R^4$, $R^5$ and $R^6$ are hydrogen or alkyl is excluded. $R^{10}$ and $R^{11}$ are a $C_6$-$C_{14}$ aryl or $C_7$-$C_{14}$ aralkyl group, which may contain a straight, branched or cyclic $C_1$-$C_6$ alkyl, nitro, halogen, cyano, trifluoromethyl, $C_1$-$C_6$ alkoxy, or carbonyl group. The subscripts a1 and a2 are numbers in the range: $0 \leq a1 < 1.0$, $0 \leq a2 < 1.0$, and $0 < a1 + a2 < 1.0$.

Of the compounds of formula (1), the carbamate type base generator having a polymerizable double bond generates an amine via a decomposition mechanism as illustrated by the following scheme (6), and the benzoincarbamate type base generator generates an amine via a decomposition mechanism as illustrated by the following scheme (7). Decomposition yields carbon dioxide, a secondary or primary amine compound bound to a polymer backbone, and another compound.

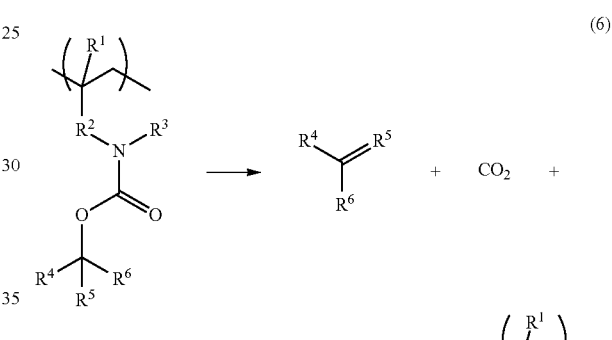

(6)

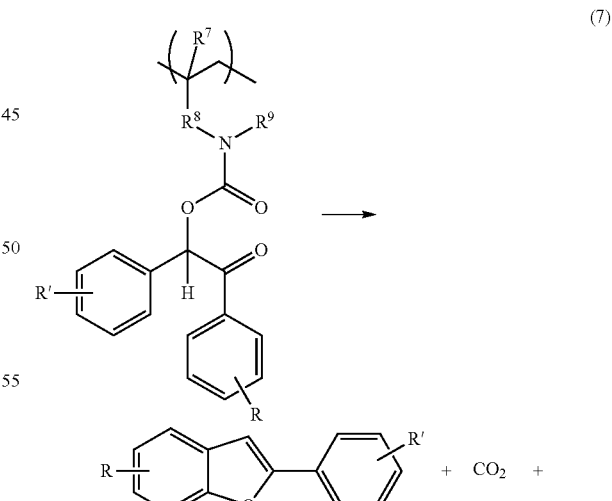

(7)

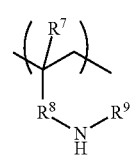

Herein $R^1$ to $R^9$ are as defined above. R and R' are hydrogen, a straight, branched or cyclic $C_1$-$C_6$ alkyl, nitro, halogen, cyano, trifluoromethyl, carbonyl group, or $C_1$-$C_6$ alkoxy group.

Shown below are examples of the monomers from which the carbamate type base generators represented by recurring units (a1) in formula (1) are derived. Herein, $R^1$ to $R^6$ are as defined above.

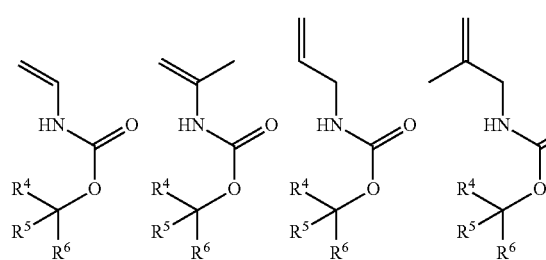
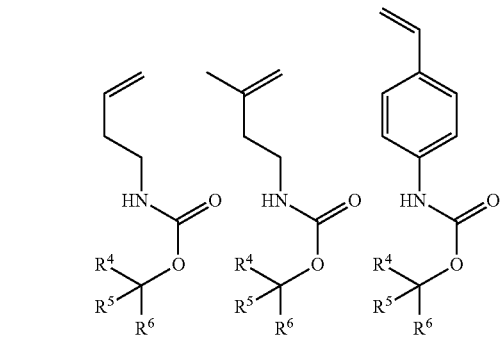
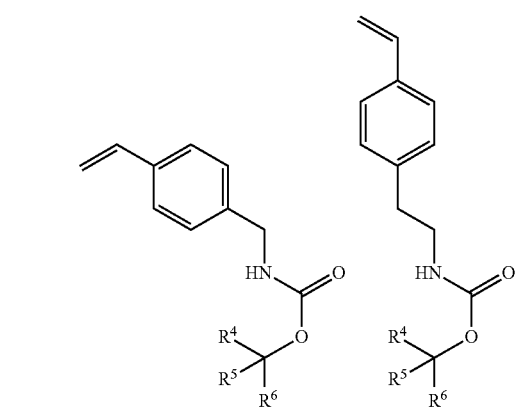
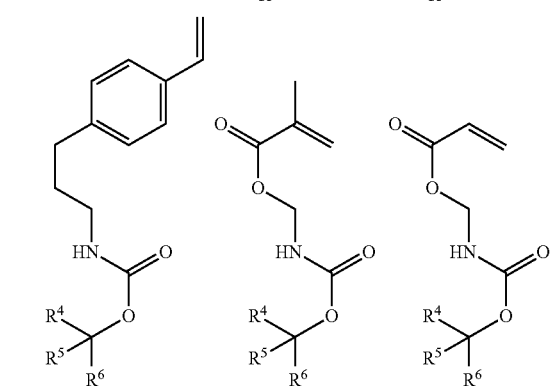

-continued

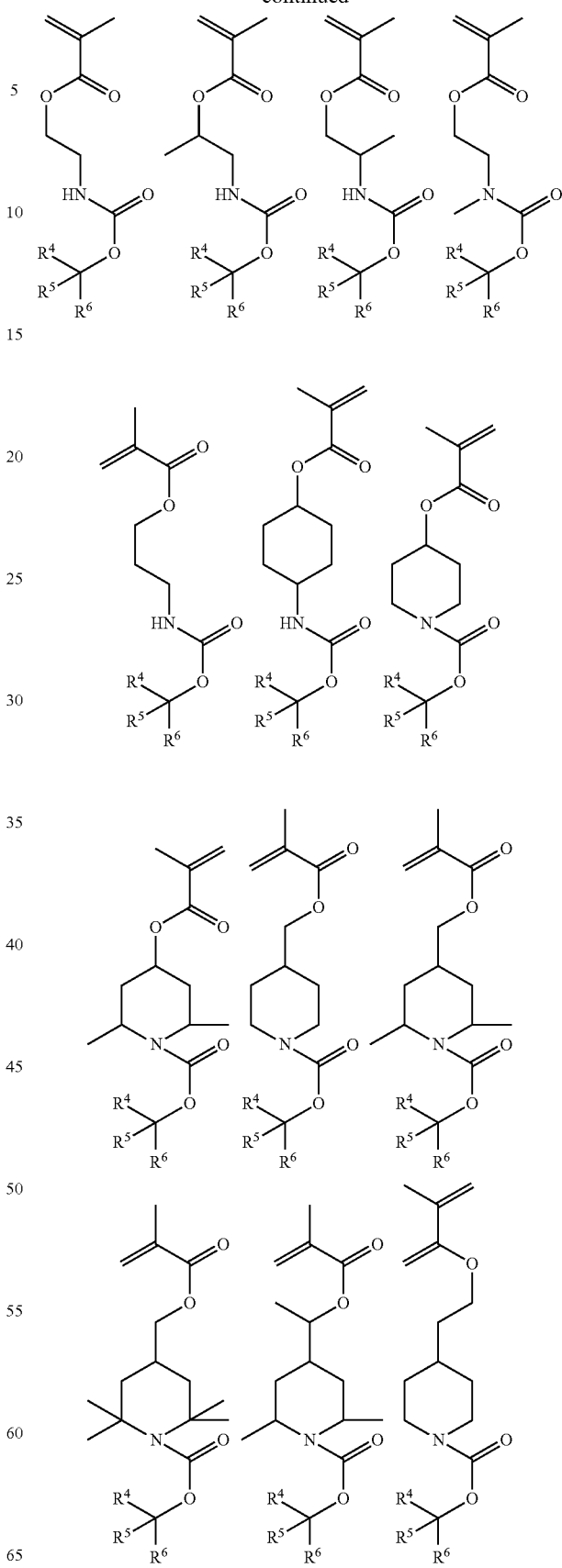

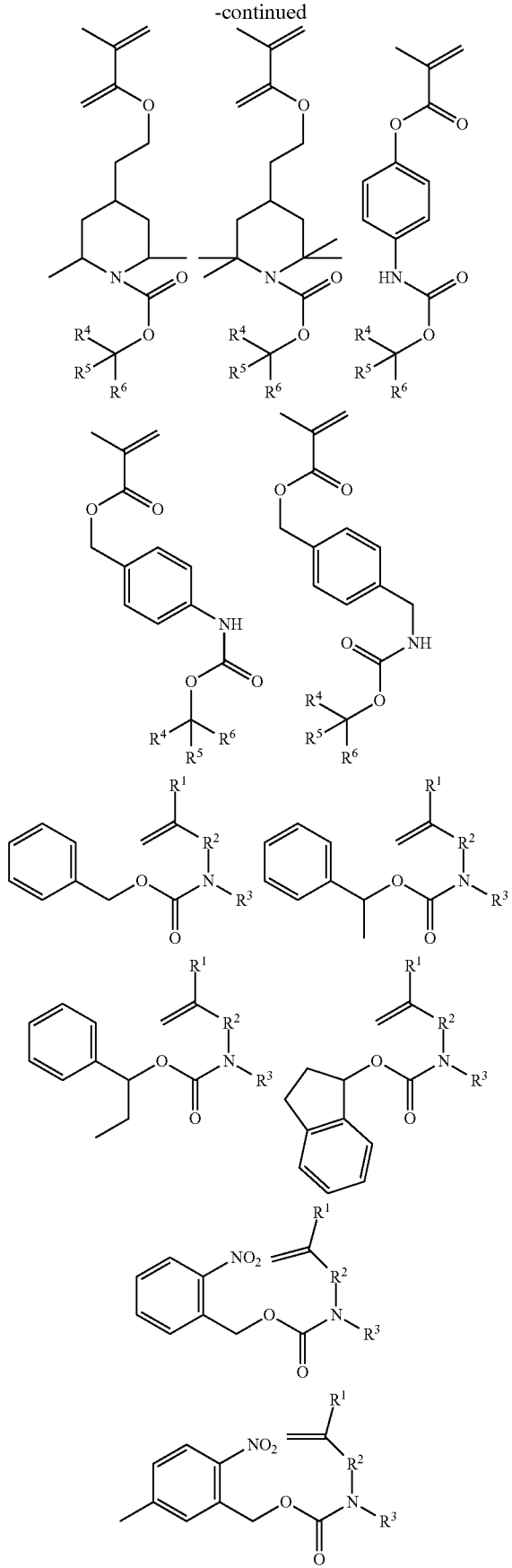

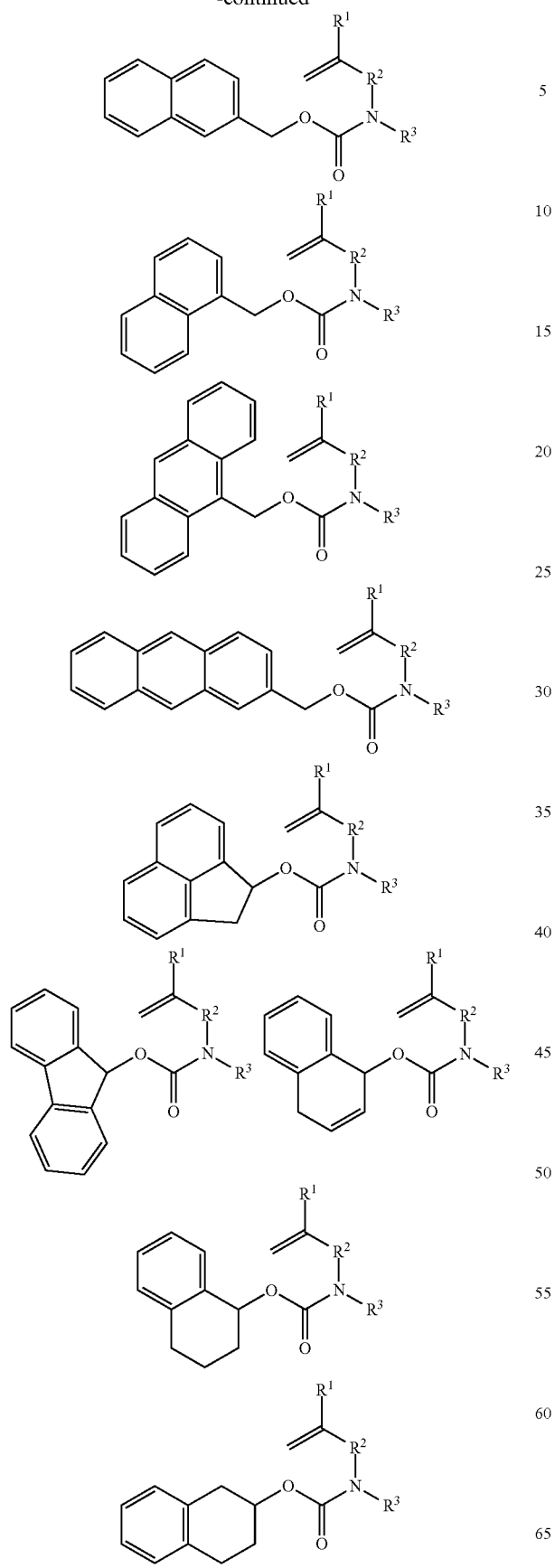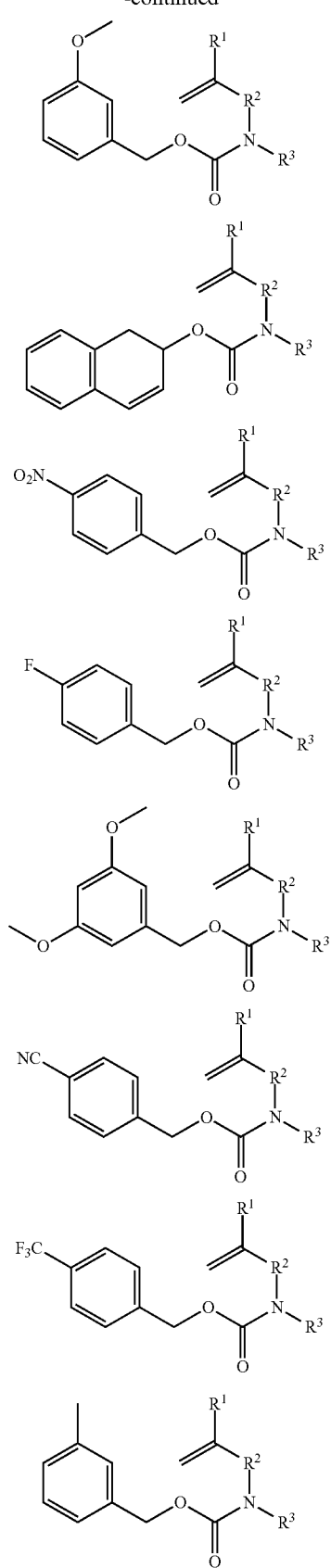

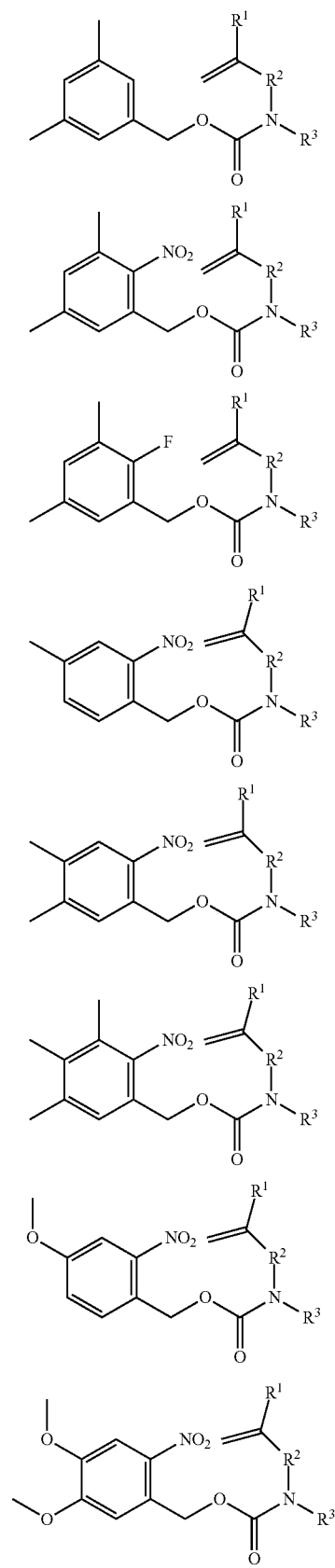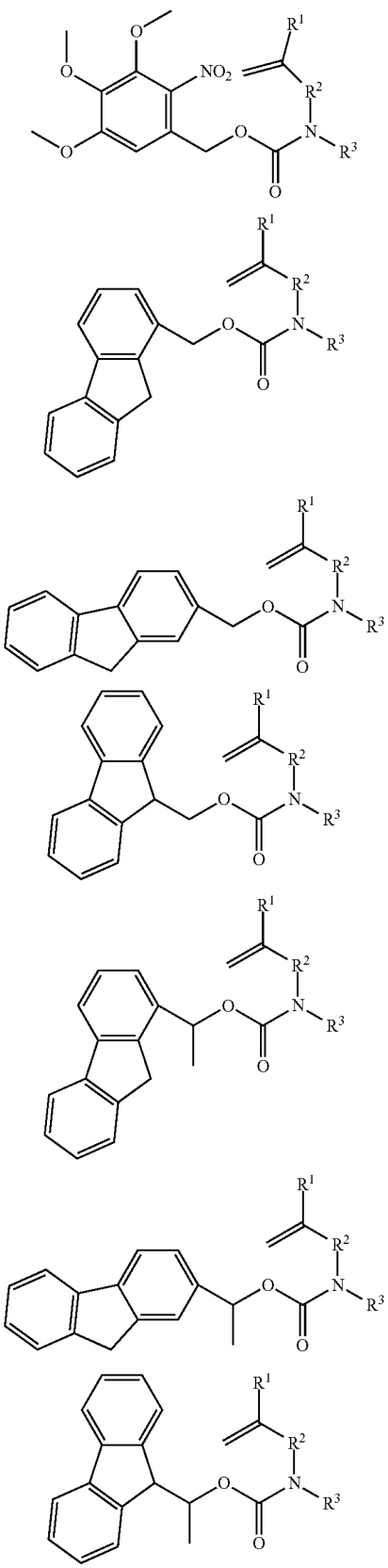

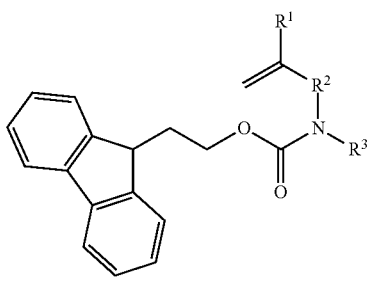
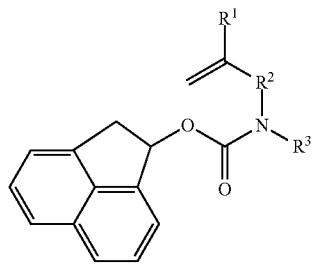
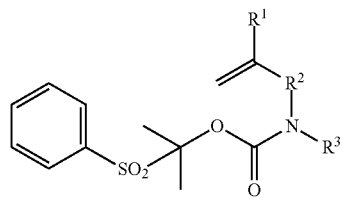
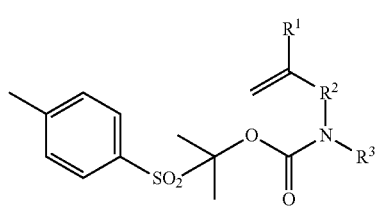
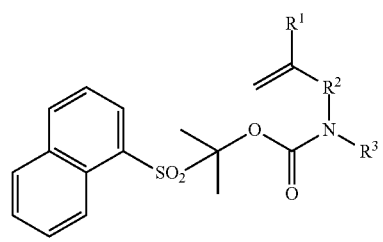
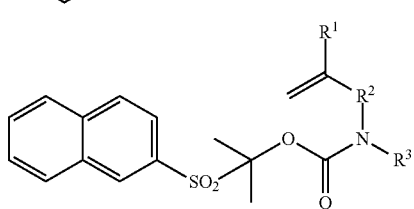
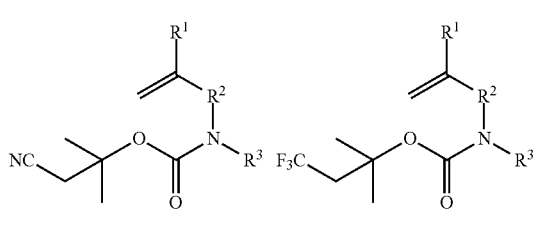
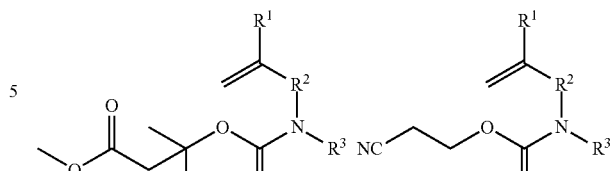
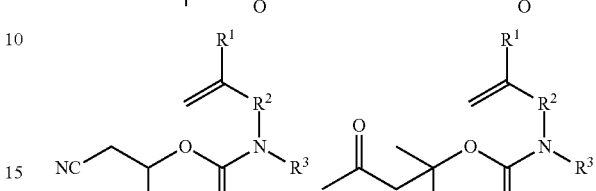
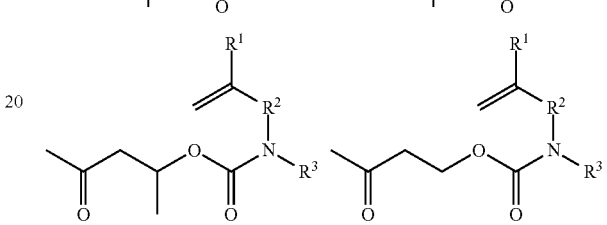
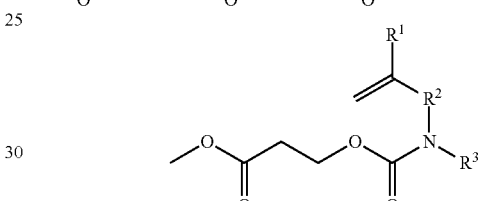
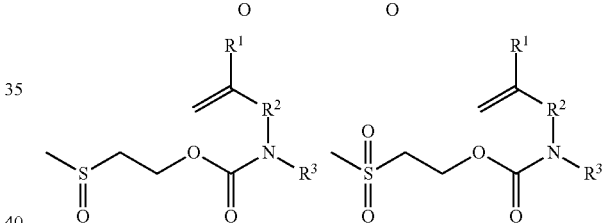
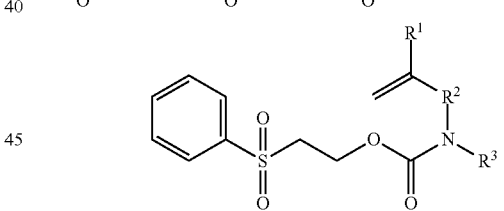
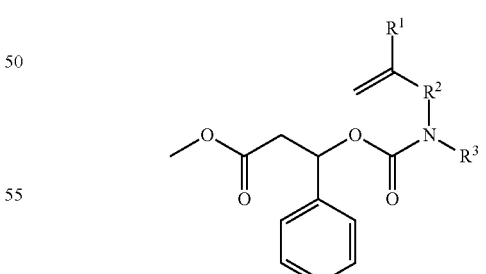
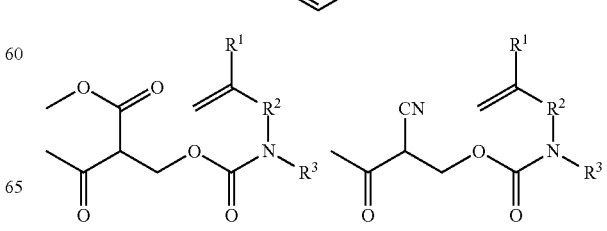

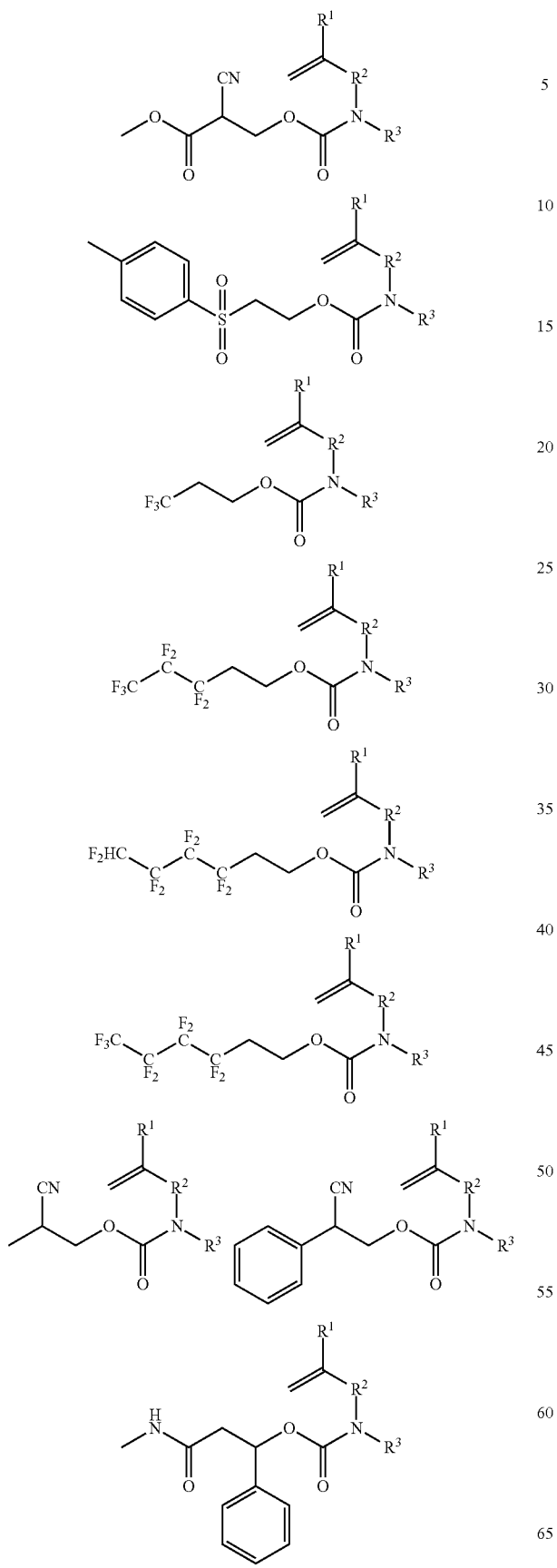
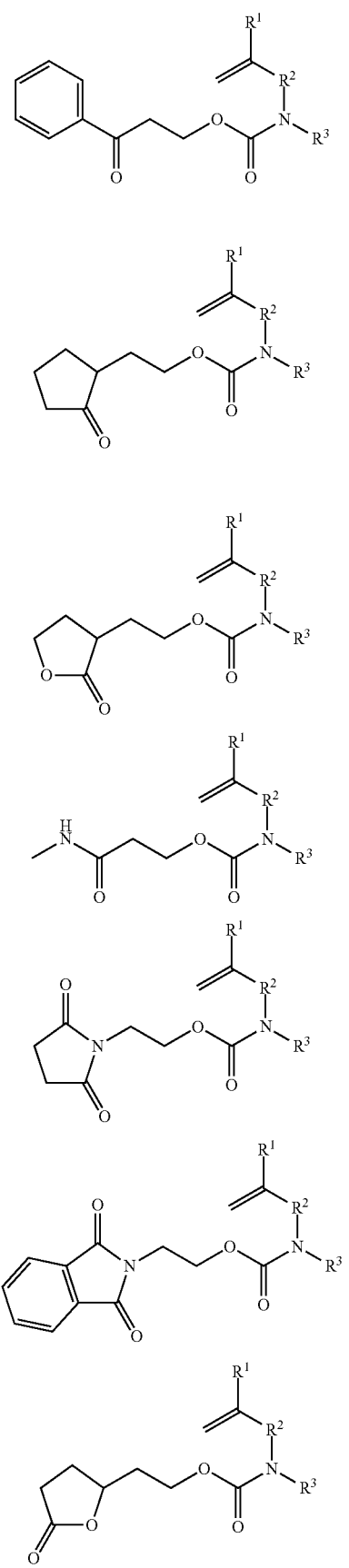

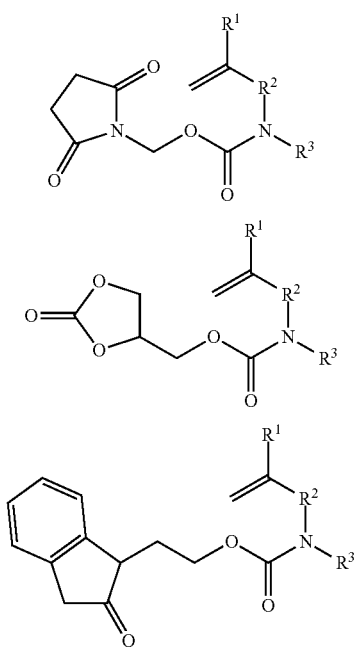
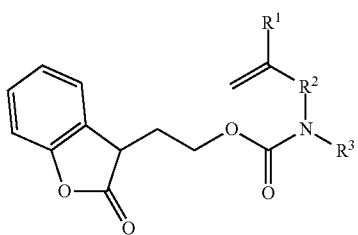
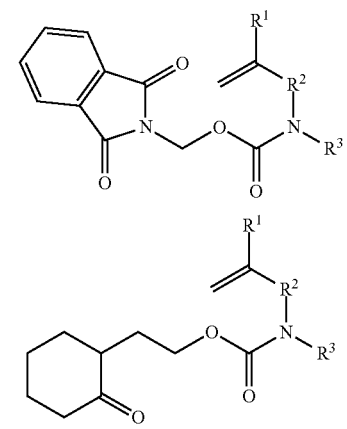
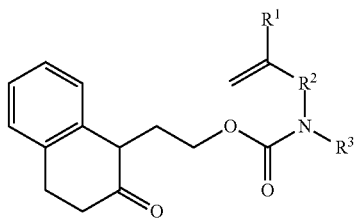
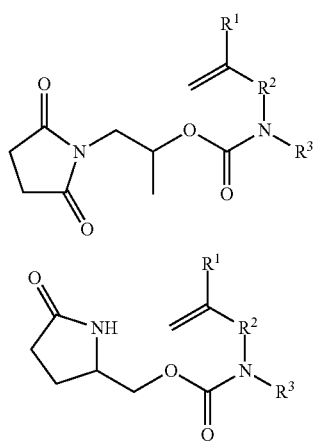
Shown below are examples of the monomers from which the benzoincarbamate type base generators represented by recurring units (a2) in formula (1) are derived. Herein, $R^7$ to $R^{11}$ are as defined above.
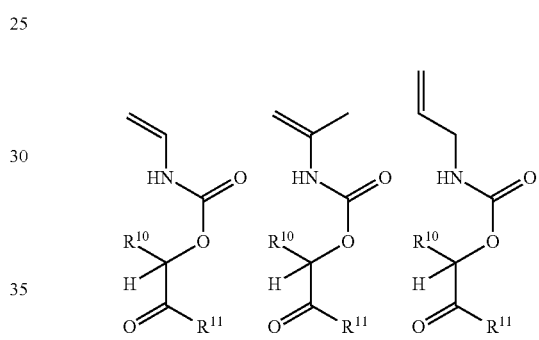
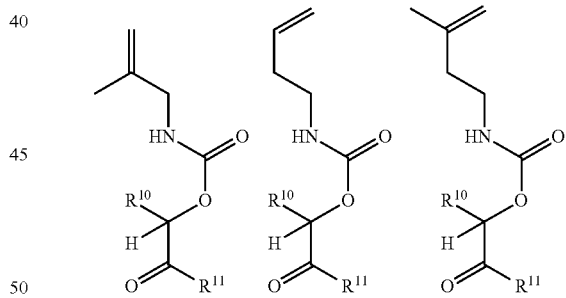
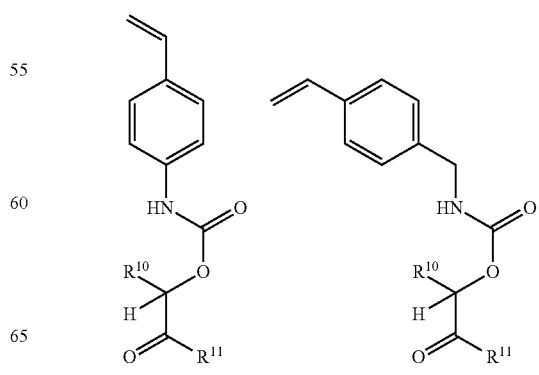

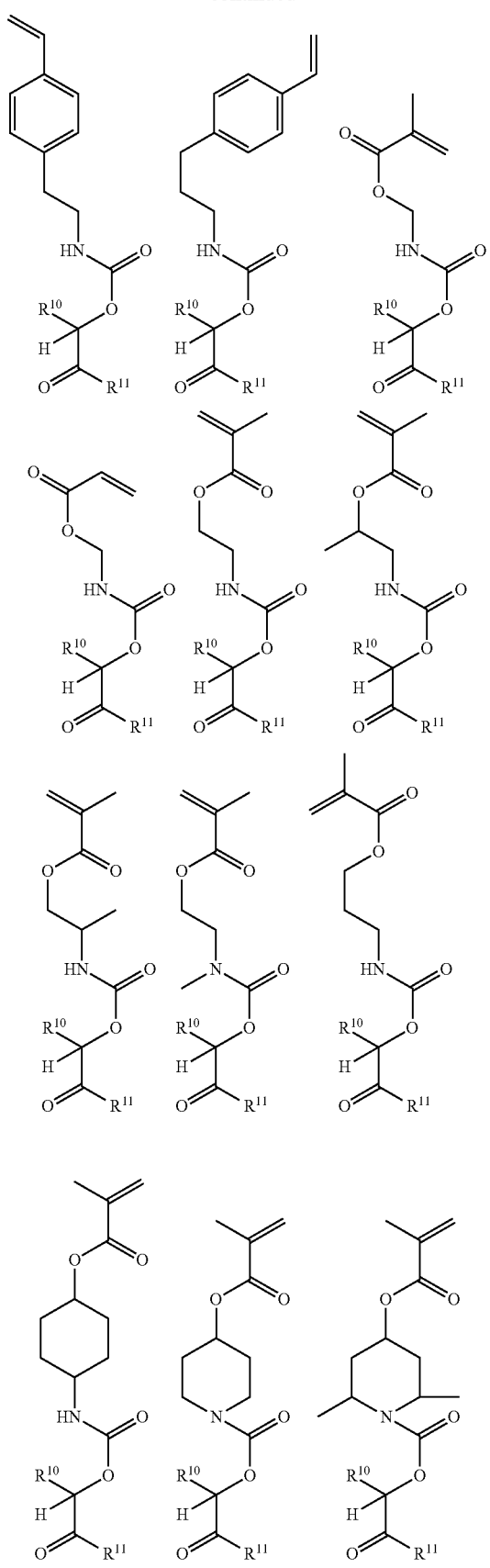
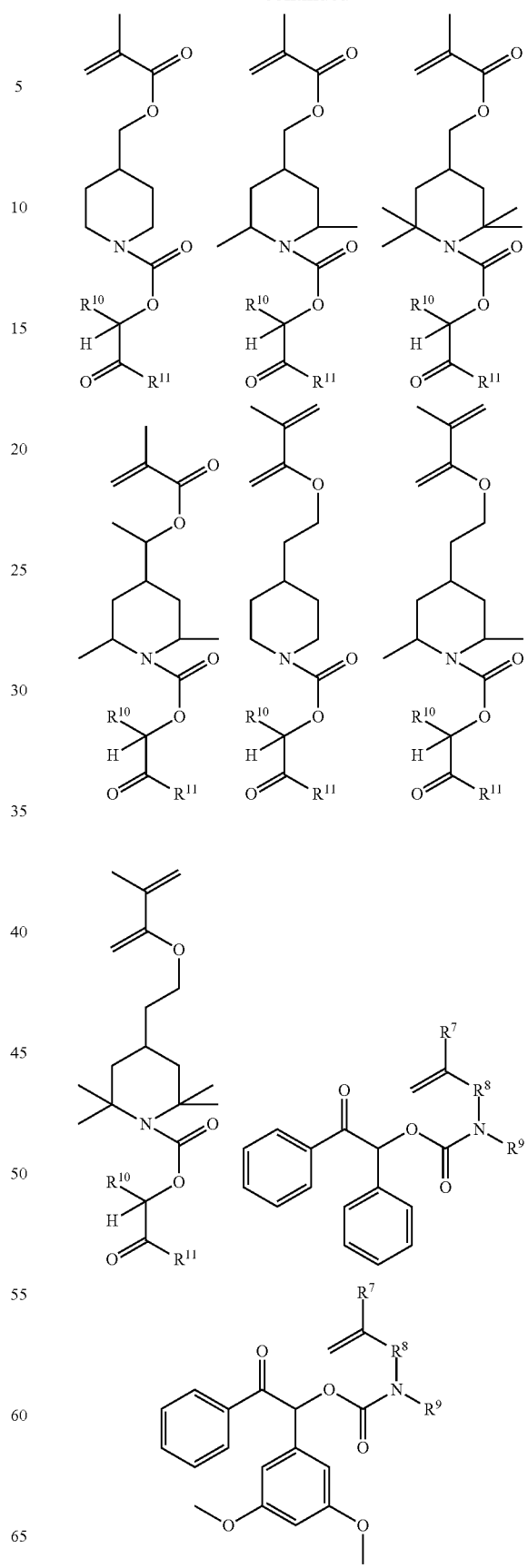

31
-continued
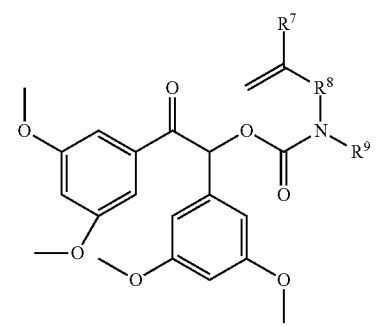
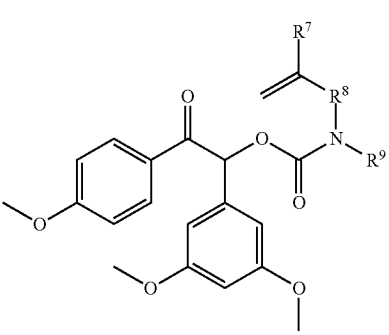
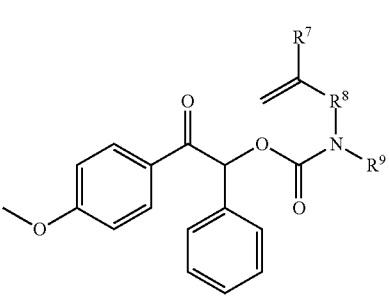
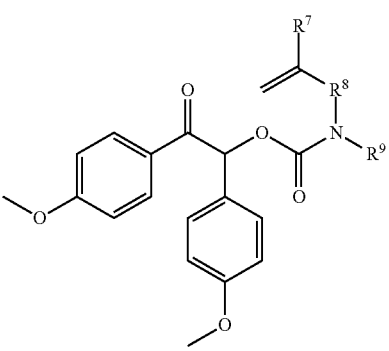
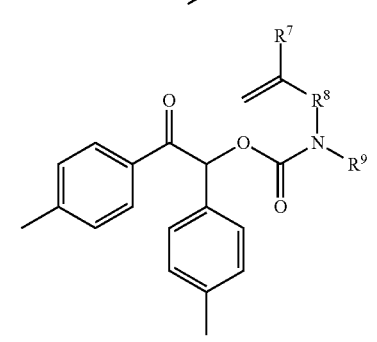
32
-continued
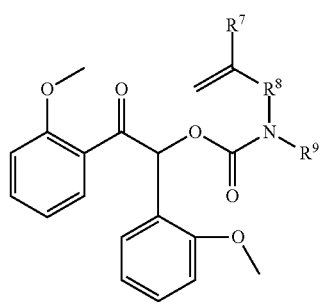
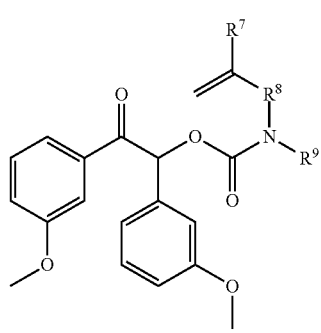
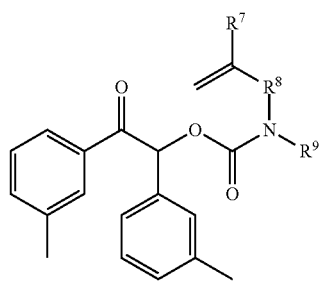
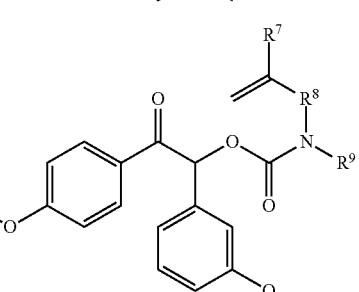
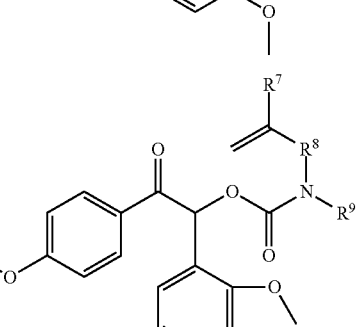

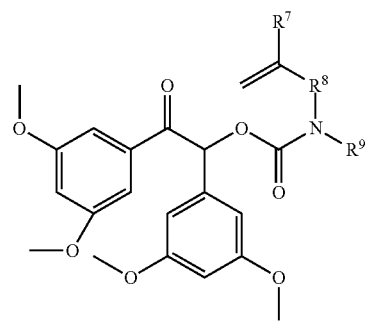
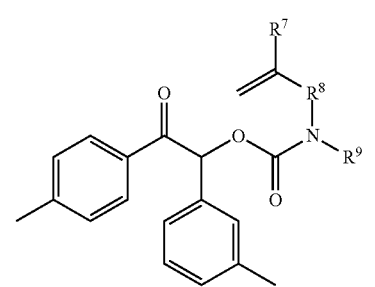
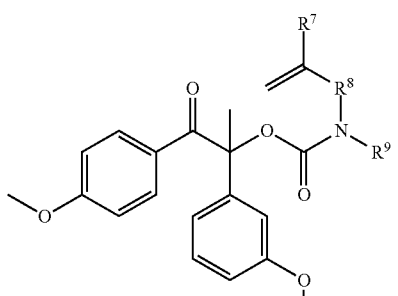
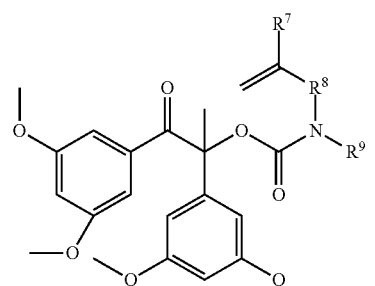
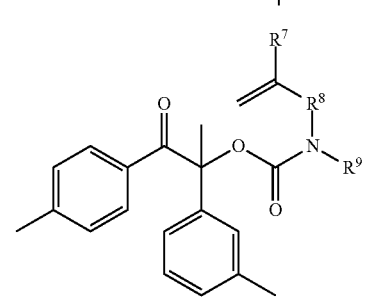
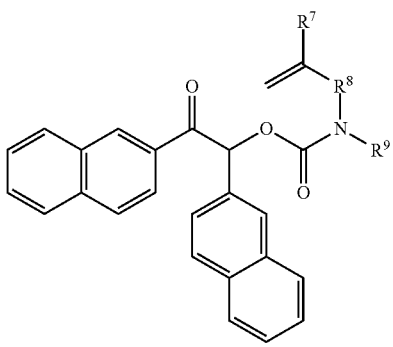
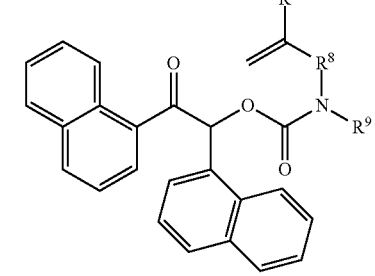
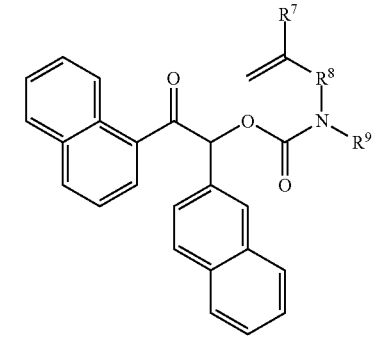
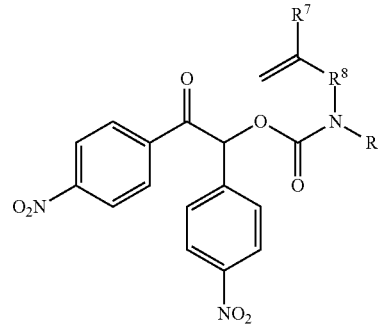
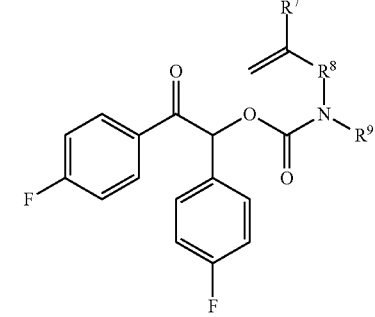

-continued

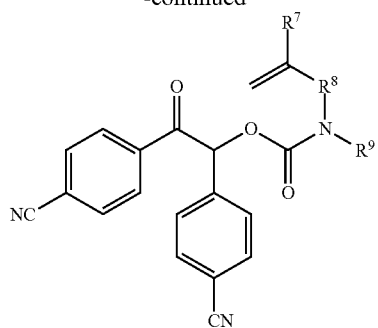

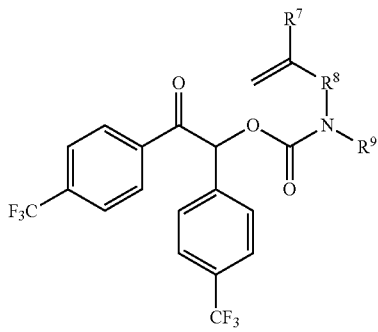

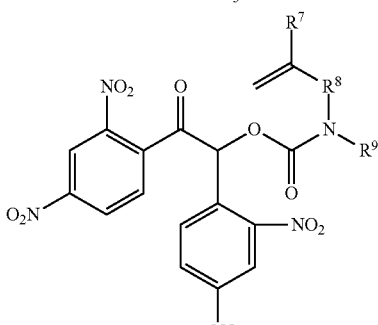

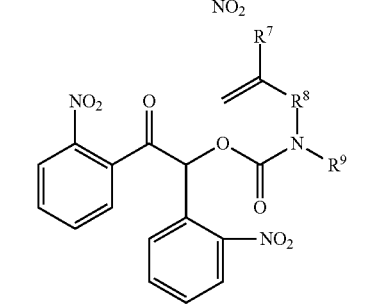

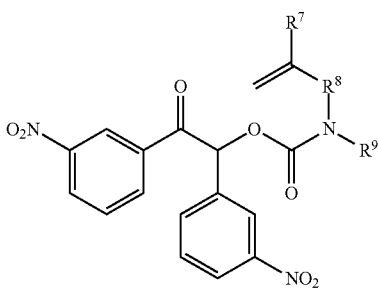

While o-nitrobenzylcarbamate and benzoincarbamate are known as a photobase generator, they also function as a thermal base generator. Since the efficiency of base generation of o-nitrobenzylcarbamate or benzoincarbamate upon light exposure is of the order of ½ to ¼ of the efficiency of acid generation of triphenylsulfonium onium salts upon light exposure, the o-nitrobenzylcarbamate or benzoincarbamate base generator, when combined with the triphenylsulfonium onium salt photoacid generator, is left for the most part undecomposed at the end of exposure, allowing the base to be generated by subsequent heating.

The first resist composition for forming the first resist pattern comprises as a base resin a polymer further comprising recurring units)(b⁰) having lactone as an adhesive group and recurring units (c) having an acid labile group, preferably represented by the formula (A), in addition to the recurring units (a1) or (a2) defined above.

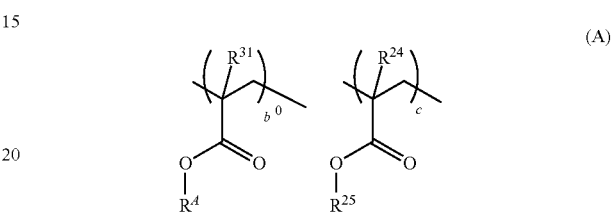

(A)

Herein $R^{31}$ and $R^{24}$ are hydrogen or methyl, $R^A$ is a monovalent organic group having lactone structure, $R^{25}$ is an acid labile group, $b^0$ and $c$ are numbers in the range: $0<b^0<1.0$, $0<c<1.0$, and $0<b^0<1.0$.

Examples of recurring units)(b⁰) are the same as will be later exemplified for the recurring units having lactone structure among recurring units (e). Recurring units (c) will be described later. In addition to the recurring units) (b⁰) and (c), the base resin in the first resist composition may further comprise recurring units (e) free of lactone structure to be described later.

The second resist composition is used to form a second resist pattern through second coating, exposure and development steps. The second positive resist composition comprises a base resin and a solvent which contains an alcohol of 3 to 8 carbon atoms or a mixture of an alcohol of 3 to 8 carbon atoms and an ether of 6 to 12 carbon atoms and which does not dissolve away the first resist pattern. The base polymer must be dissolved in this solvent. The polymer to be dissolvable in this solvent should preferably have a 2,2,2-trifluoro-1-hydroxyethyl group, or hydroxyl or carboxyl-bearing naphthyl group, and is typically a copolymer comprising at least recurring units having the general formula (8).

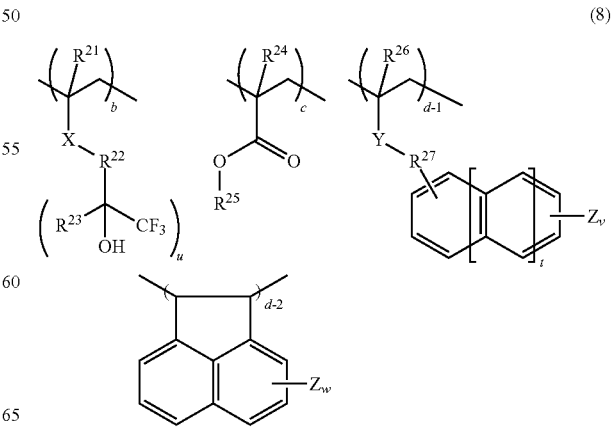

(8)

Herein $R^{21}$, $R^{24}$ and $R^{26}$ are hydrogen or methyl. X is a single bond, —O— or —C(=O)—O—. The subscript u is 1 or 2. In the case of u=1, $R^{22}$ is a straight, branched or cyclic $C_1$-$C_{10}$ alkylene group which may contain an ester group, ether group or fluorine atom, or $R^{22}$ may bond with $R^{23}$ to form a non-aromatic ring with the carbon atom to which they are attached. In the case of u=2, $R^{22}$ is the foregoing alkylene group, with one carbon-bonded hydrogen atom eliminated. $R^{23}$ is hydrogen, $C_1$-$C_6$ alkyl or trifluoromethyl, or $R^{23}$ is $C_1$-$C_6$ alkylene when it bonds with $R^{22}$. $R^{25}$ is an acid labile group. Y is a single bond, —C(=O)—O— or —C(=O)—NH—. $R^{27}$ is a single bond or a straight or branched $C_1$-$C_6$ alkylene group. Z is hydroxyl or carboxyl. The subscripts v and w each are 1 or 2, t is 0 or 1, b, c, d-1 and d-2 are numbers in the range: $0<b<1.0$, $0<c<1.0$, $0\leq(d-1)<1.0$, $0\leq(d-2)<1.0$, and $0<b+c+(d-1)+(d-2)\leq1.0$.

Monomers from which recurring units (b) are derived include the following monomers wherein $R^{21}$ is as defined above.

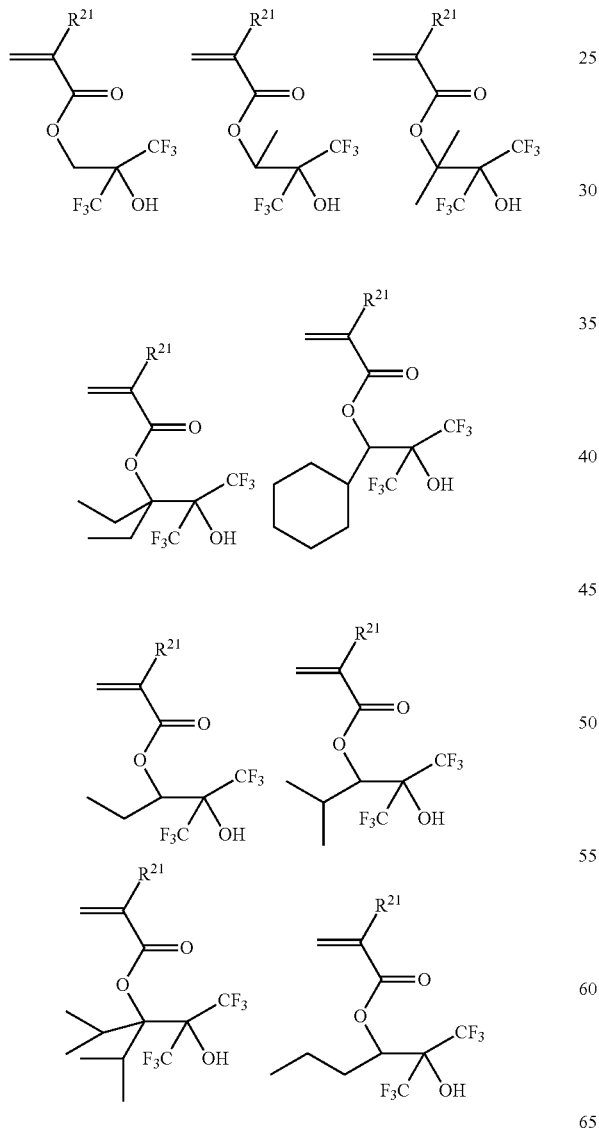

-continued

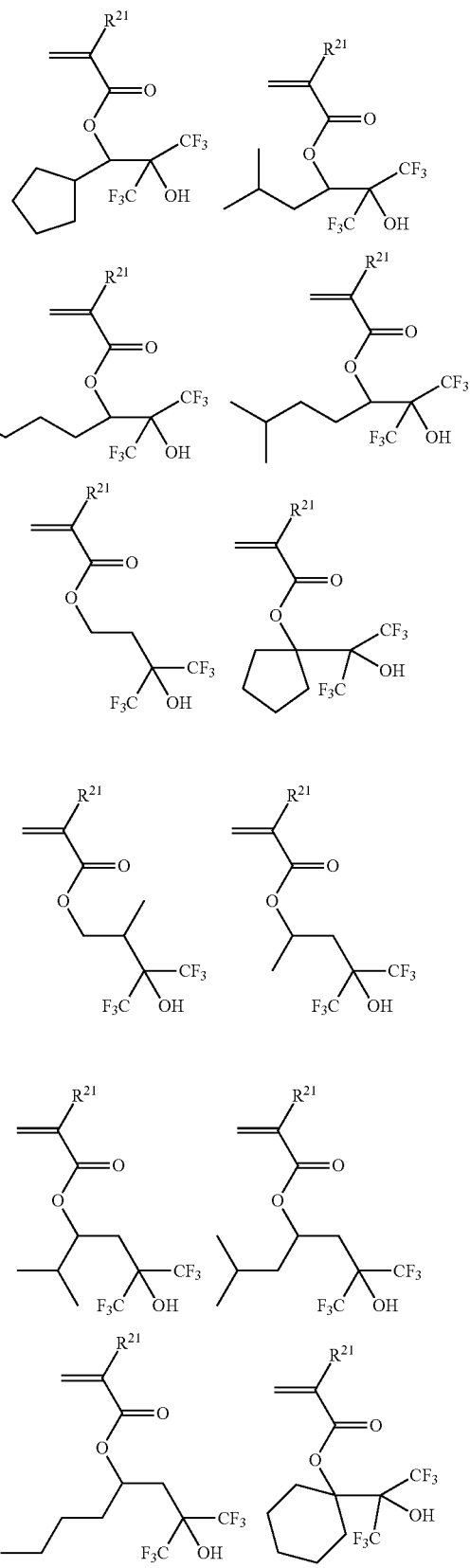

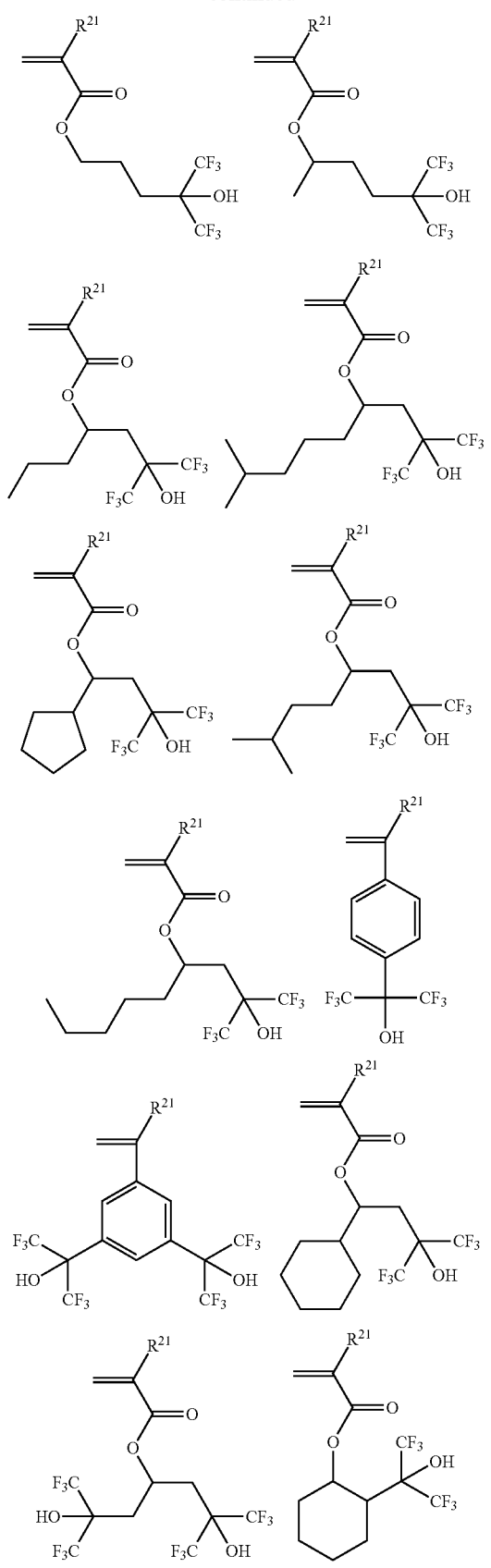
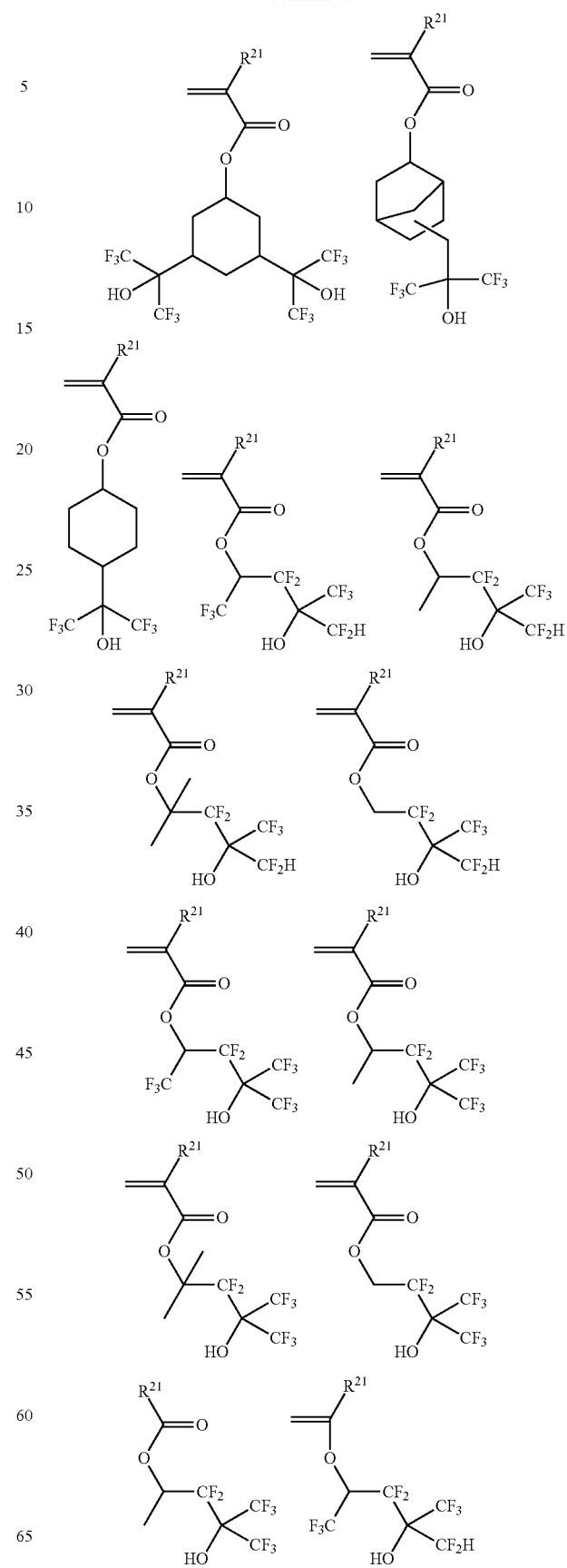

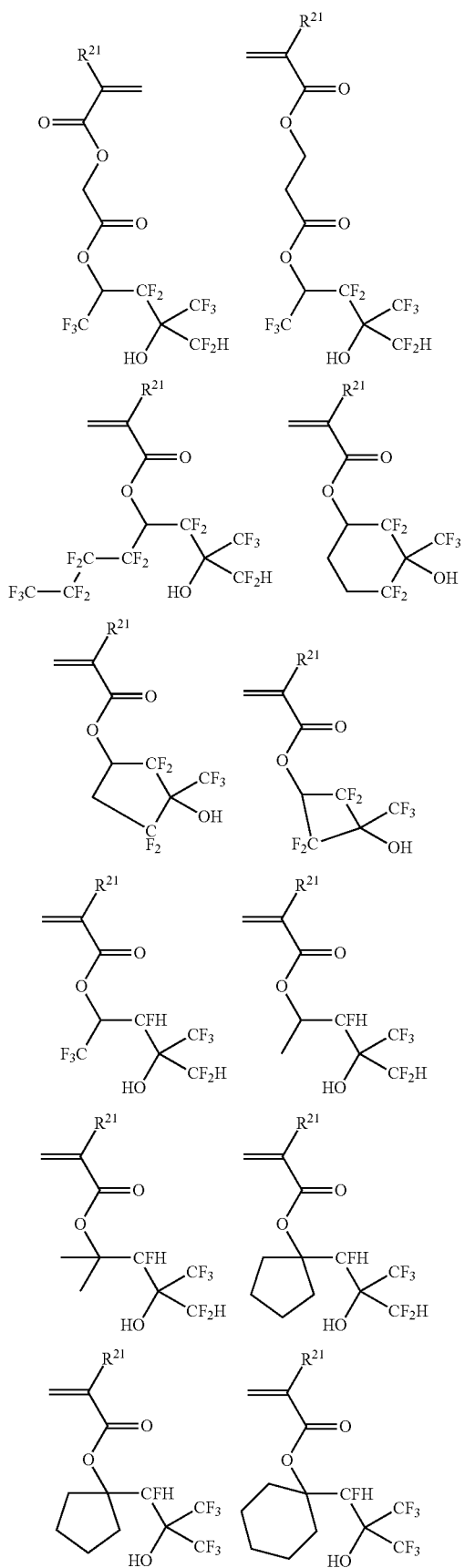
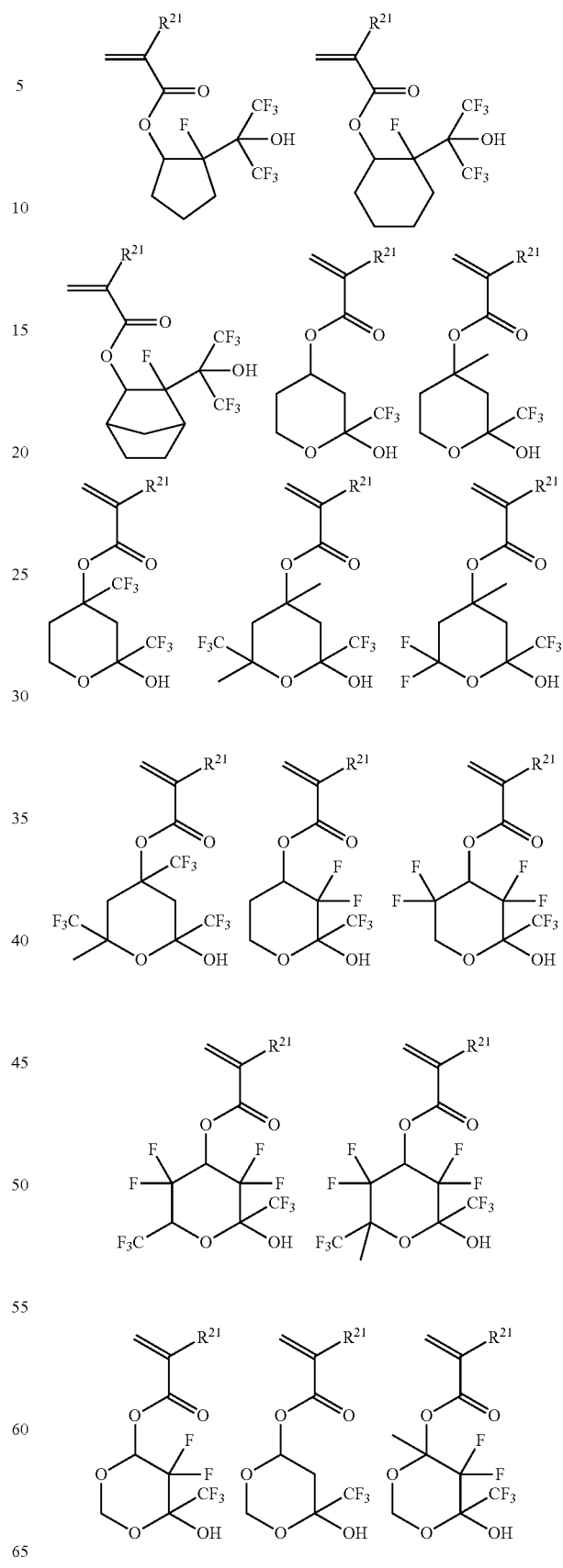

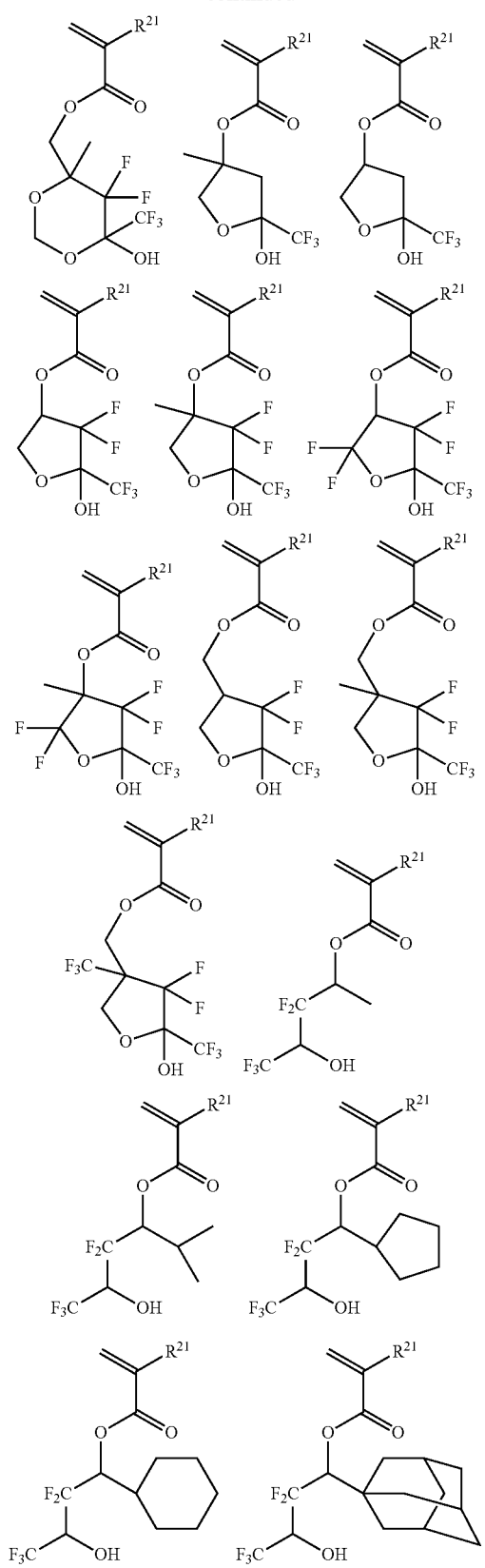
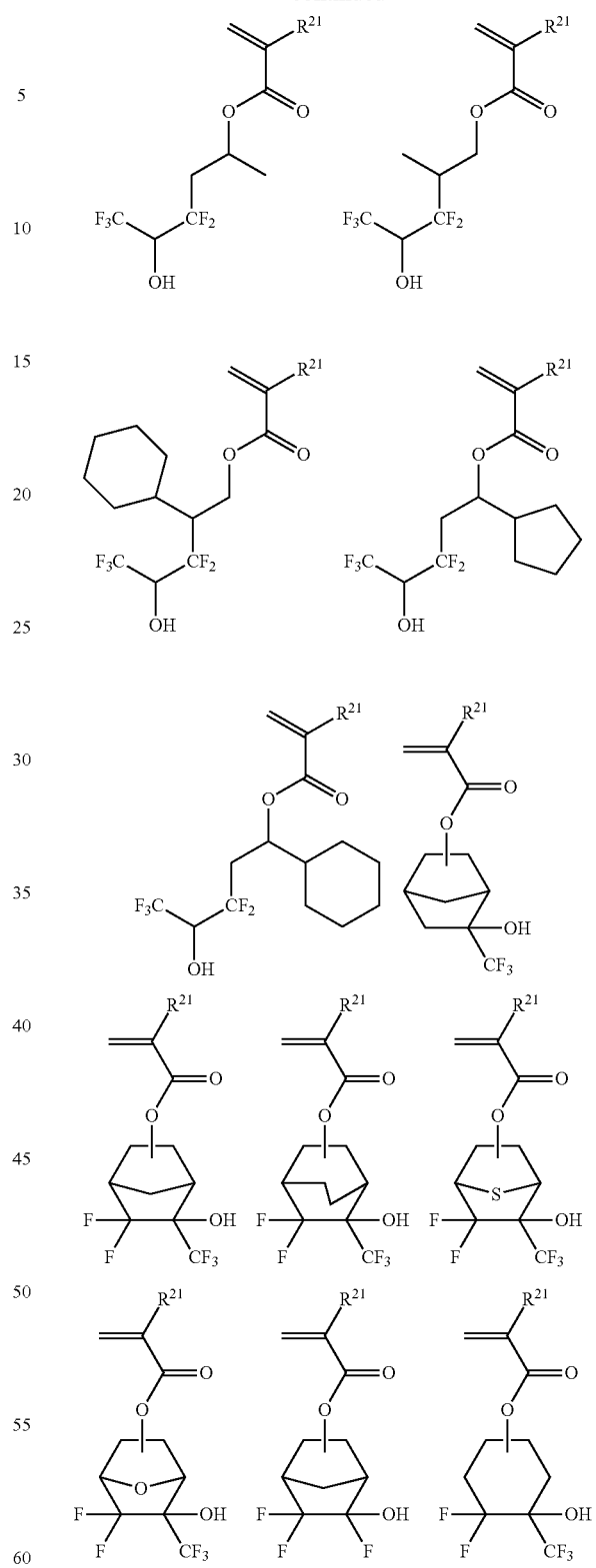
Monomers from which recurring units (d-1) and (d-2) are derived are given below wherein $R^{26}$ is as defined above. It is noted that hydroxyvinylnaphthalene copolymers are described in JP 3829913 and hydroxyacenaphthylene copolymers are described in JP 3796568.

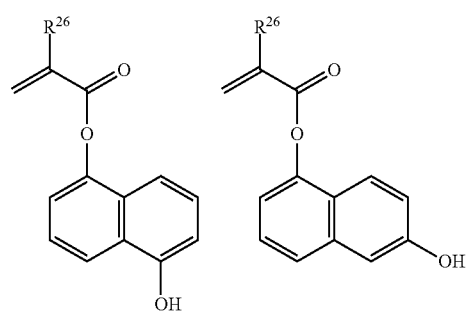
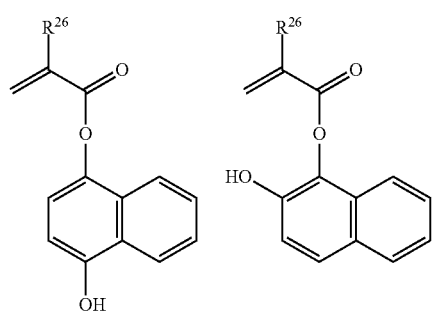
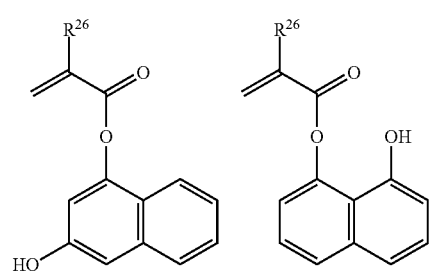
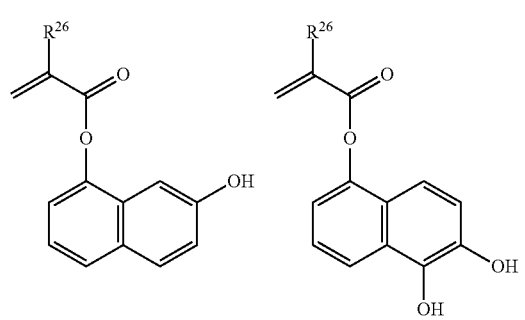
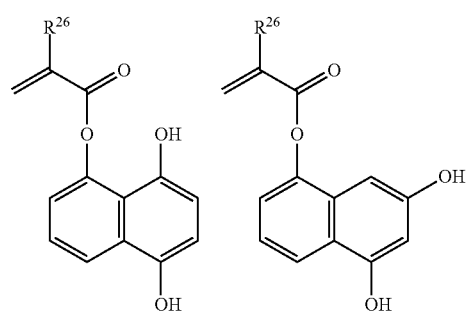
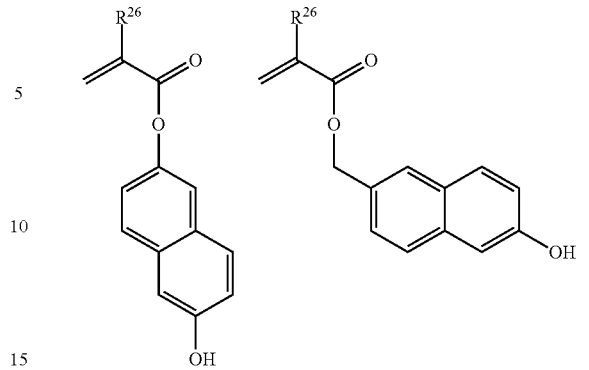
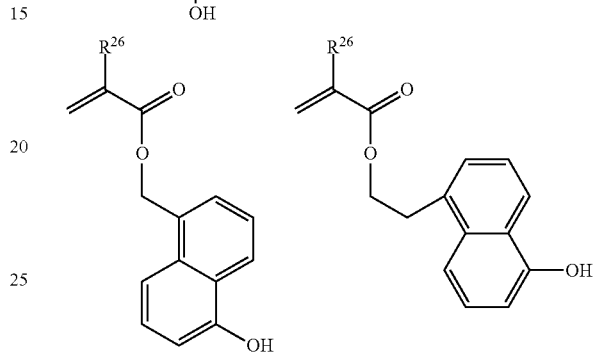
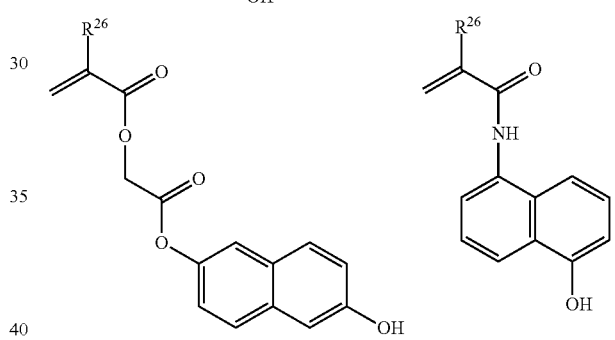
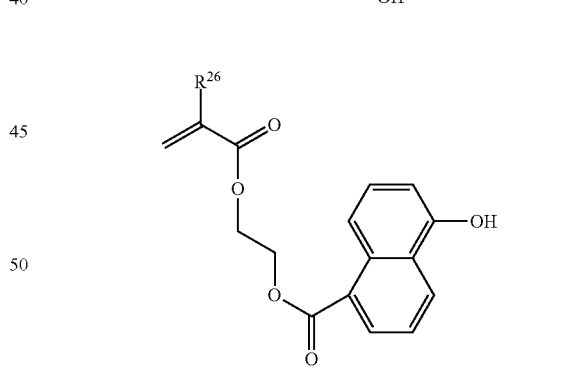
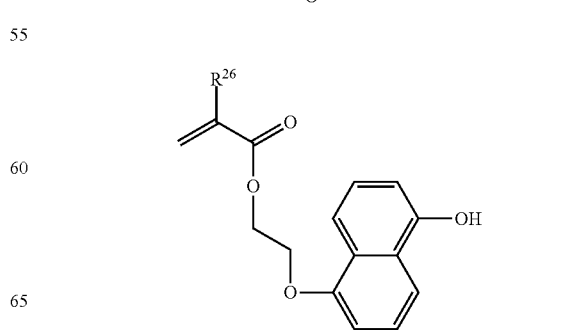

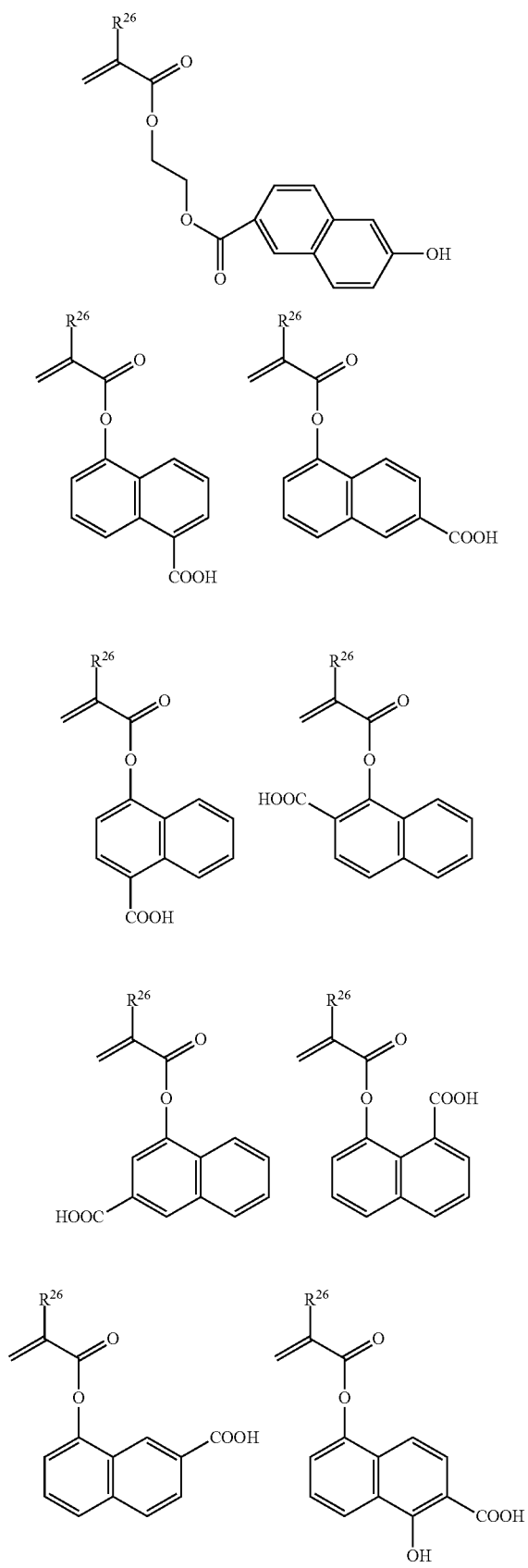
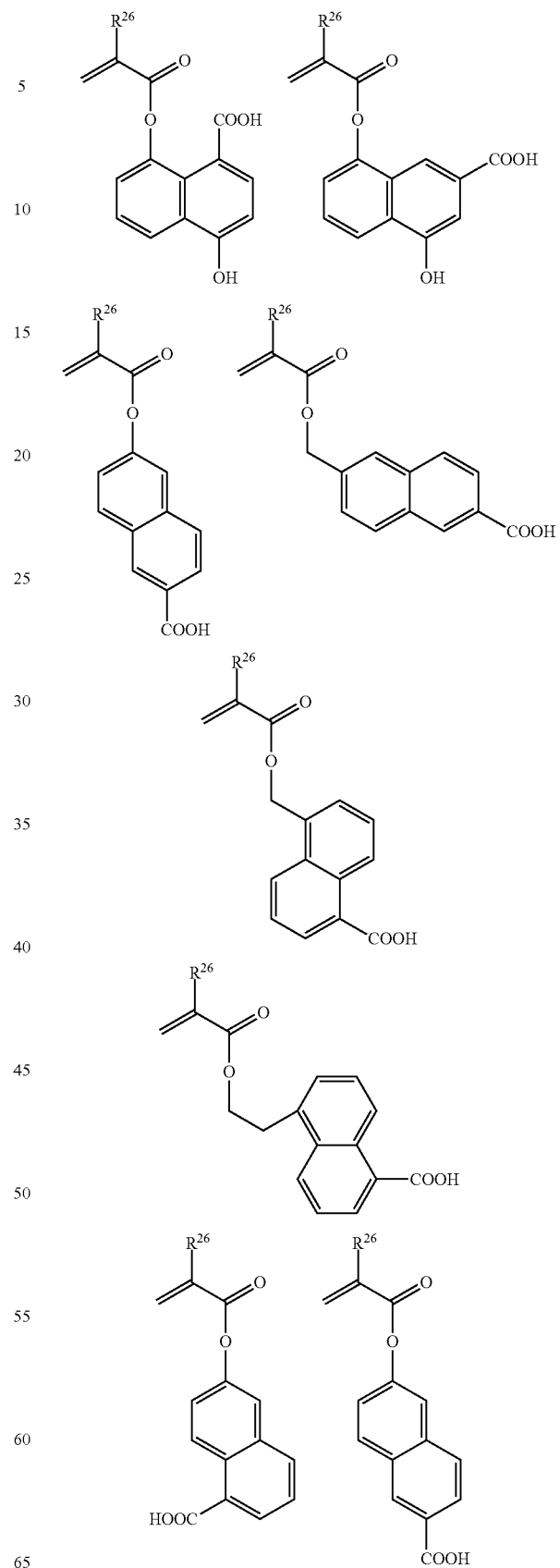

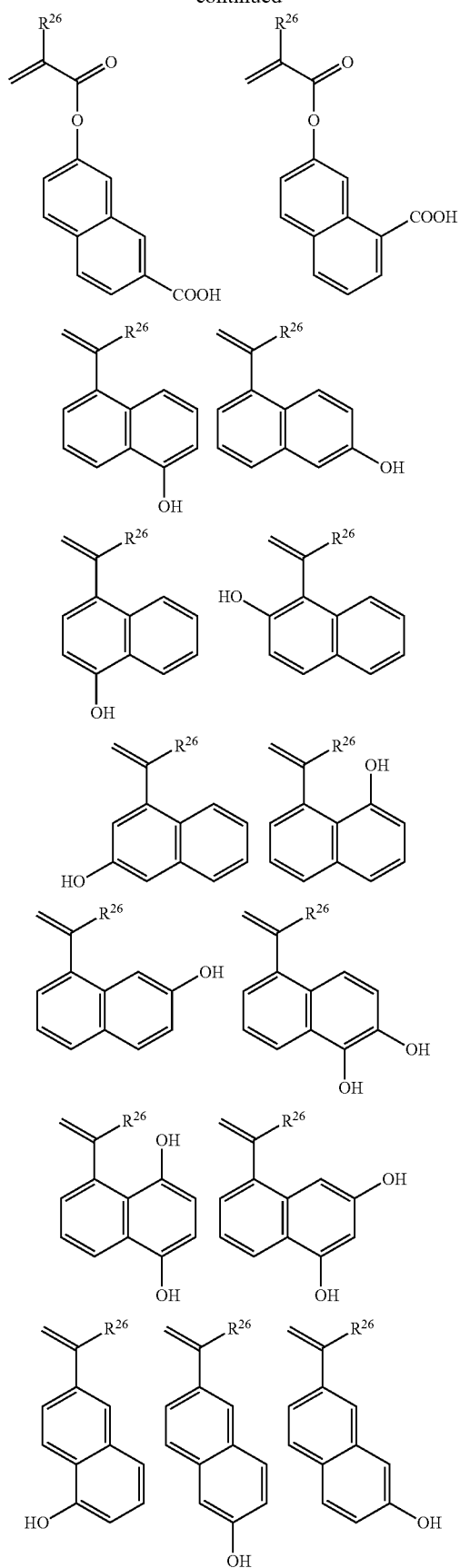
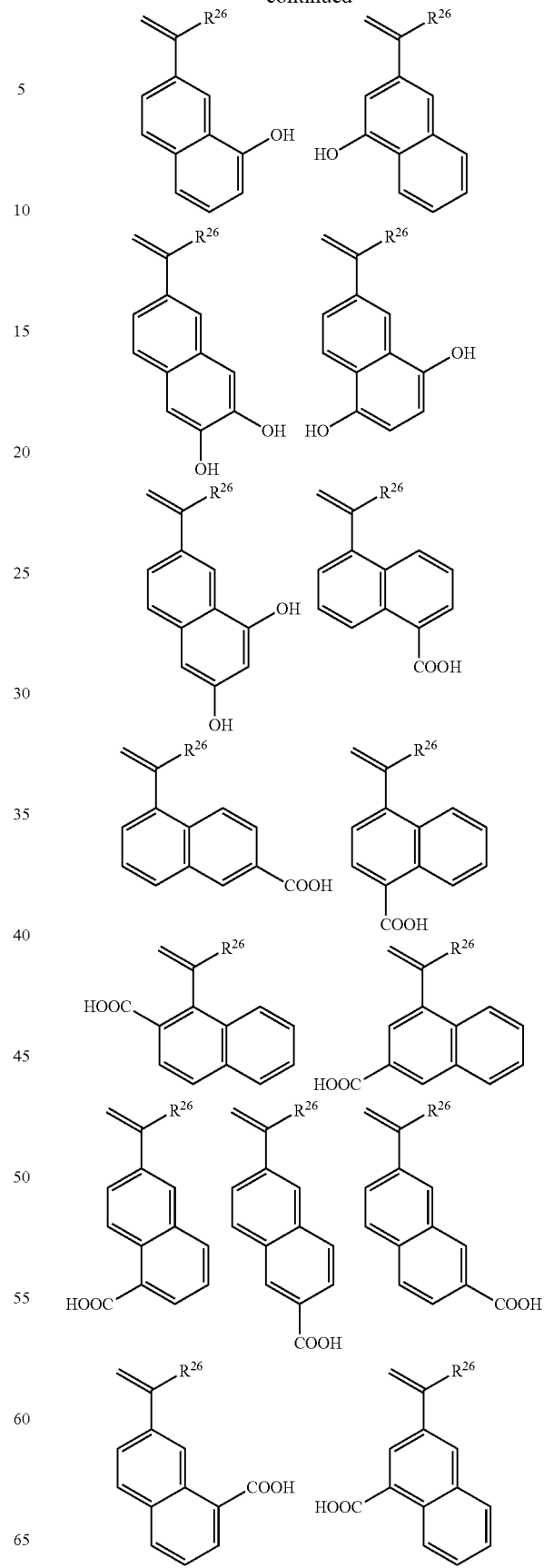

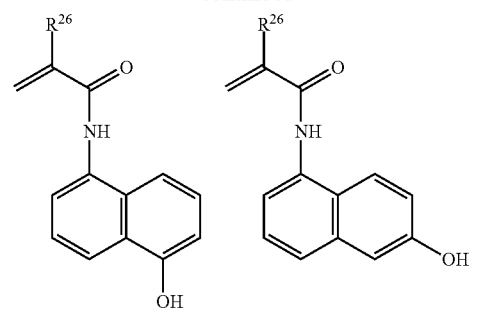
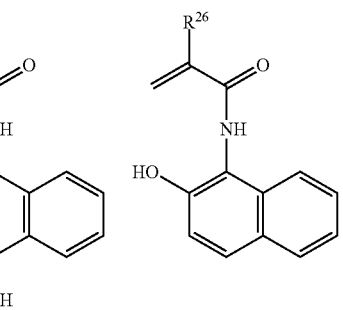
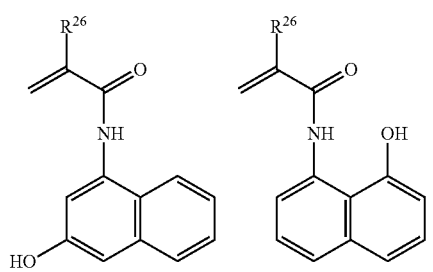
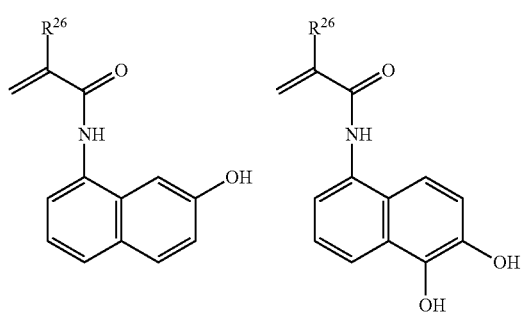
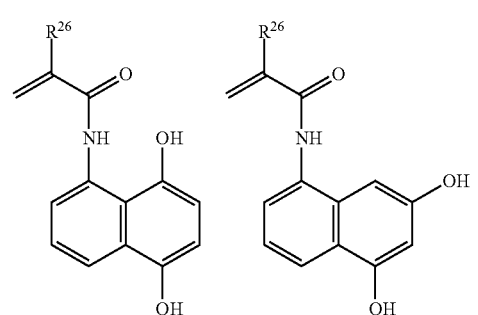
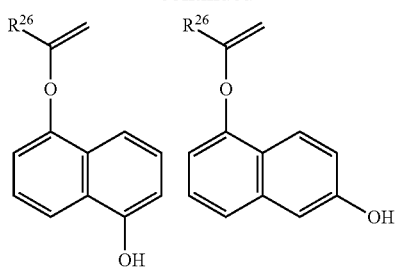
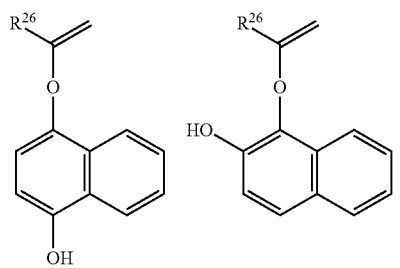
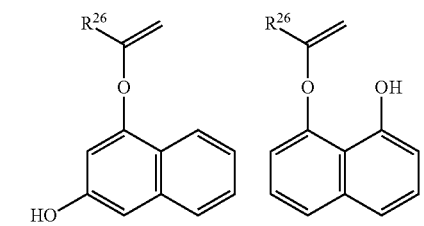
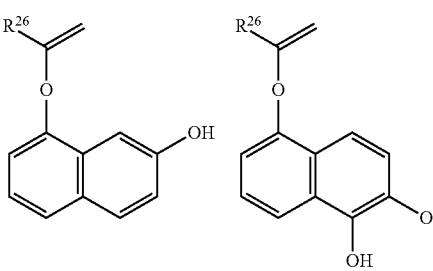
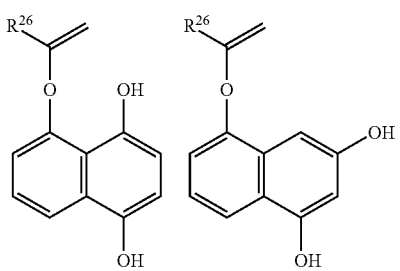
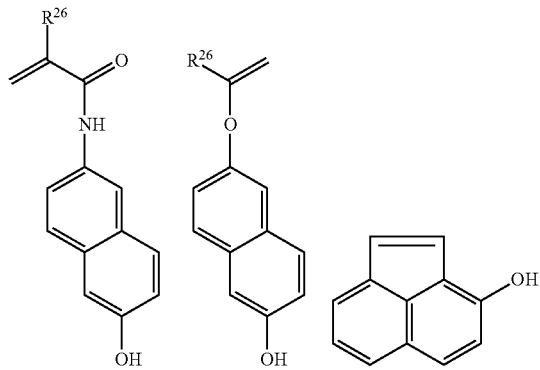

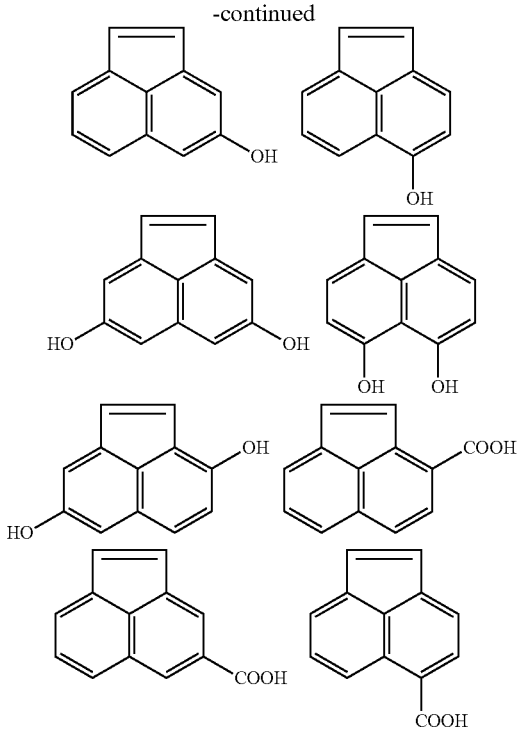

As the monomers corresponding to recurring units (b), (d-1) and (d-2), those monomers wherein a hydroxyl group is substituted by an acetal group or a formyl, acetyl or pivaloyl group may be used in polymerization. After polymerization, the acetal group can be converted back to a hydroxy group by hydrolysis with an acid. The formyl, acetyl or pivaloyl group can be converted back to a hydroxy group by alkaline hydrolysis.

The polymer which can be used as the base resin in the second resist composition comprises recurring units (c) having an acid labile group in addition to the recurring units (b).

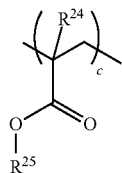

Herein $R^{24}$ is hydrogen or methyl, and $R^{25}$ is an acid labile group.

Monomers Mc from which recurring units (c) (included in the first and second resist compositions) are derived are given below wherein $R^{24}$ and $R^{25}$ are as defined above.

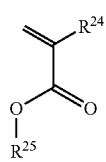

Mc

The acid labile group represented by $R^{25}$ may be selected from a variety of such groups. The acid labile groups may be the same or different between the first and second resist compositions and preferably include groups of the following formulae (A-1) to (A-3).

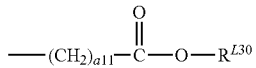

(A-1)

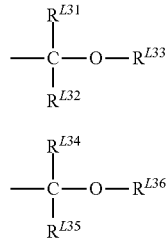

(A-2)

(A-3)

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter a11 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

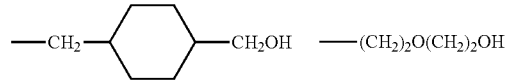

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

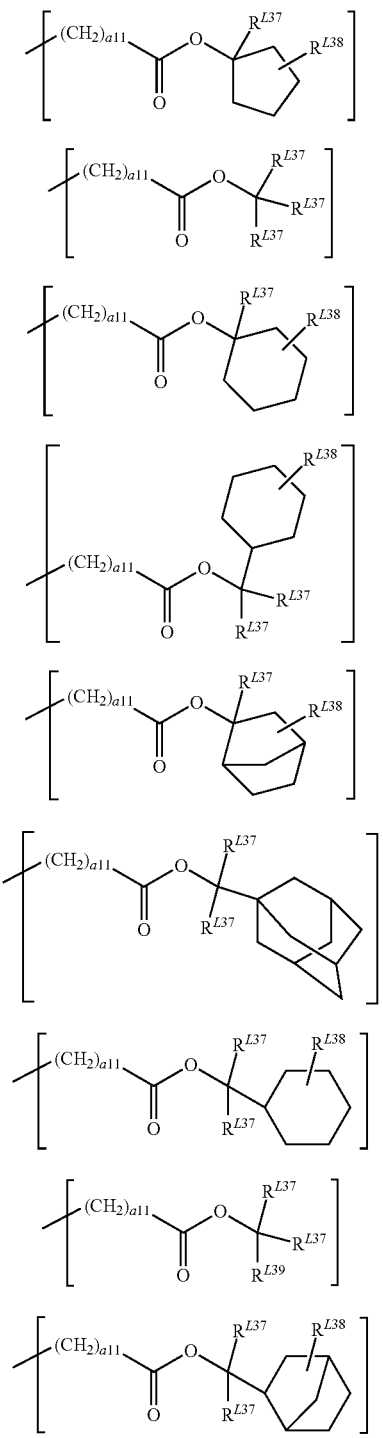

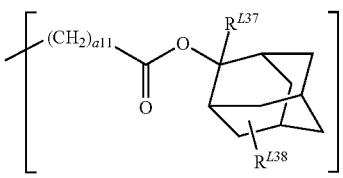

Herein $R^{L37}$ is each independently a straight, branched or cyclic $C_1$-$C_{10}$ alkyl group or $C_6$-$C_{20}$ aryl group, $R^{L38}$ is hydrogen or a straight, branched or cyclic $C_1$-$C_{10}$ alkyl group, $R^{L39}$ is each independently a straight, branched or cyclic $C_2$-$C_{10}$ alkyl group or $C_6$-$C_{20}$ aryl group, and a11 is as defined above.

Of the acid labile groups of formula (A-2), the straight and branched ones are exemplified by the following groups having formulae (A-2)-1 to (A-2)-35.

$$—CH_2—O—CH_3 \quad (A\text{-}2)\text{-}1$$

$$—CH_2—O—CH_2—CH_3 \quad (A\text{-}2)\text{-}2$$

$$—CH_2—O—(CH_2)_2—CH_3 \quad (A\text{-}2)\text{-}3$$

$$—CH_2—O—(CH_2)_3—CH_3 \quad (A\text{-}2)\text{-}4$$

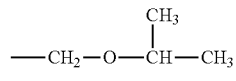
(A-2)-5

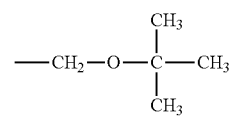
(A-2)-6

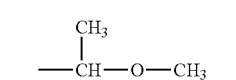
(A-2)-7

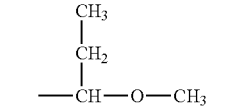
(A-2)-8

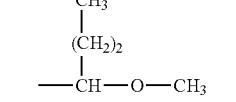
(A-2)-9

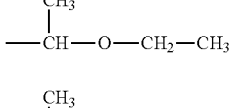
(A-2)-10

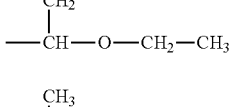
(A-2)-11

(A-2)-12

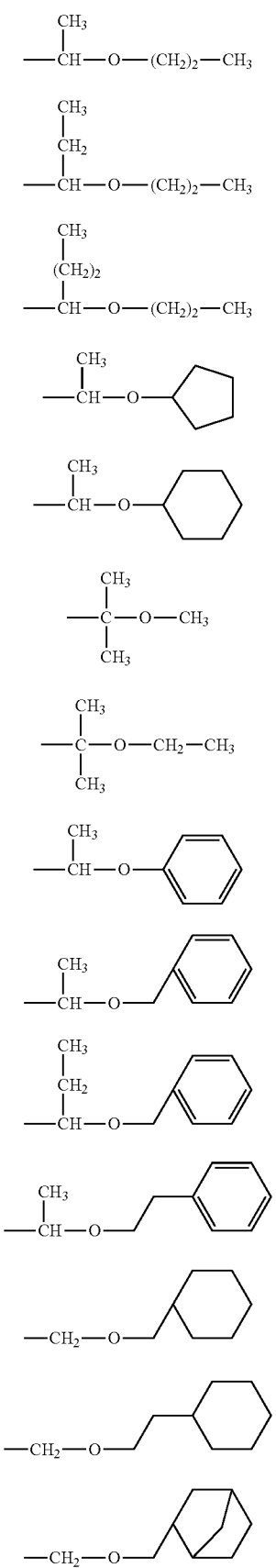

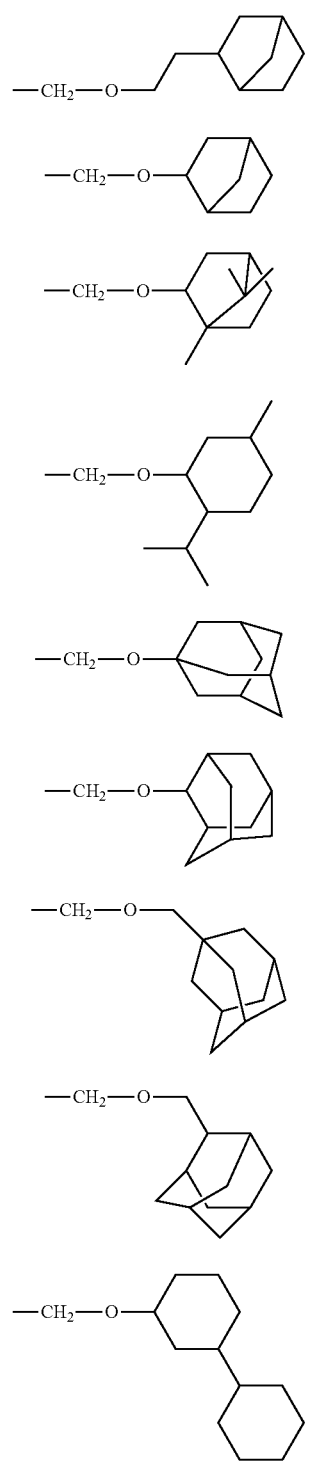

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

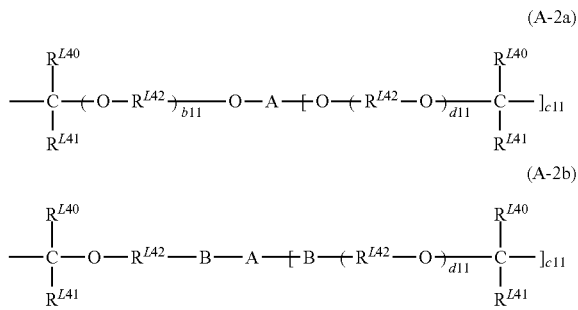

(A-2a)

(A-2b)

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of b11 and d11 is 0 or an integer of 1 to 10, preferably 0 or an integer of 1 to 5, and c11 is an integer of 1 to 7. "A" is a (c11+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some of the hydrogen atoms attached to carbon atoms may be substituted by hydroxyl, carboxyl, acyl groups or halogen atoms. The subscript c11 is preferably an integer of 1 to 3.

The crosslinking acetal groups of formulae (A-2a) and (A-2b) are exemplified by the following formulae (A-2)-36 through (A-2)-43.

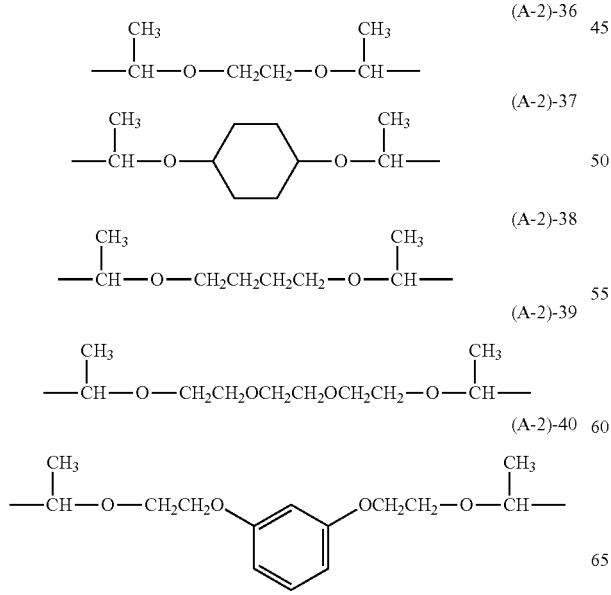

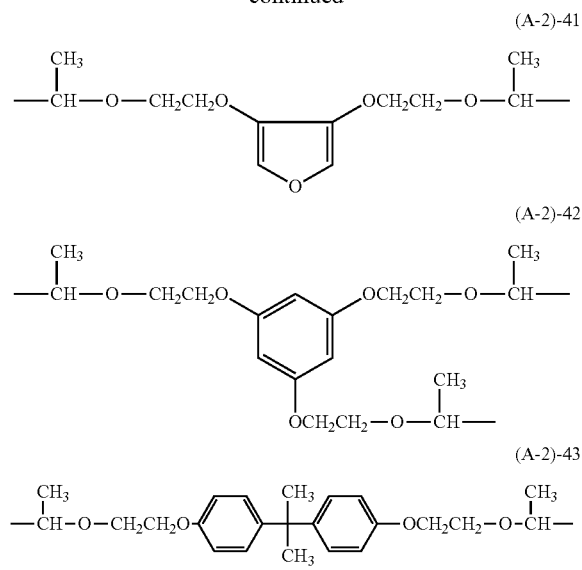

In formula (A-3), $R^{L34}$, $R^{L35}$ and $R^{L36}$ each are a monovalent hydrocarbon group, typically a straight, branched or cyclic $C_1$-$C_{20}$ alkyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ alicyclic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

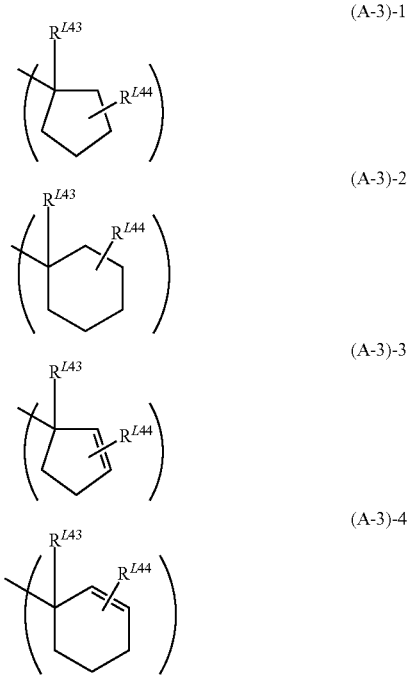

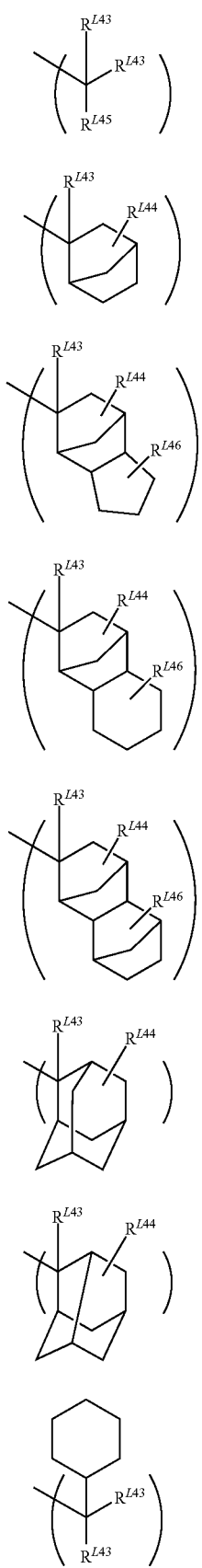
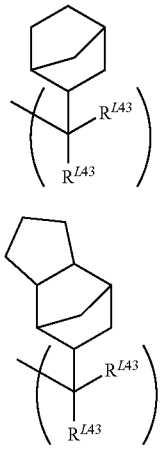
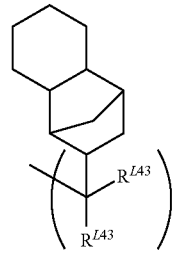
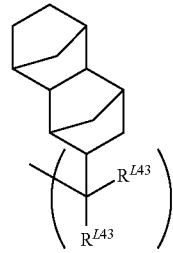
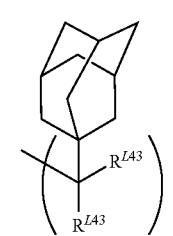
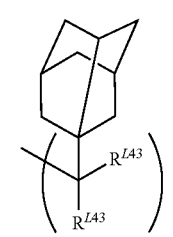

Herein $R^{L43}$ is each independently a straight, branched or cyclic $C_1$-$C_8$ alkyl group or $C_6$-$C_{20}$ aryl group, typically phenyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

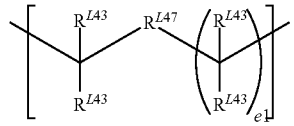
(A-3)-19

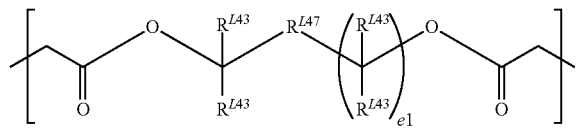
(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

In formulae (A-1), (A-2), and (A-3), $R^{L30}$, $R^{L33}$, and $R^{L36}$ also stand for substituted or unsubstituted aryl groups such as phenyl, p-methylphenyl, p-ethylphenyl and alkoxy-substituted phenyl, typically p-methoxyphenyl, and aralkyl groups such as benzyl and phenethyl, which may contain an oxygen atom, or in which hydrogen atoms attached to carbon atoms are replaced by hydroxyl groups, or in which two hydrogen atoms are replaced by an oxygen atom to form a carbonyl group, as exemplified by alkyl groups and oxoalkyl groups of the following formulae.

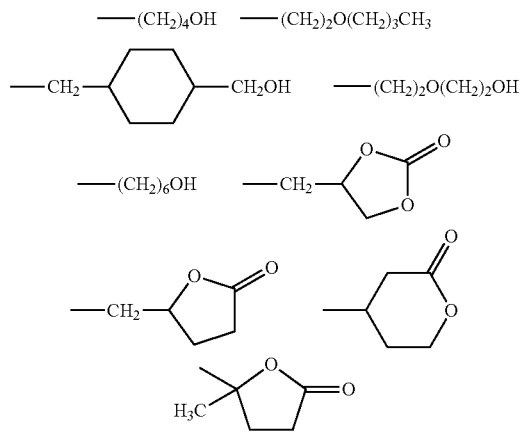

Of recurring units having acid labile groups of formula (A-3), recurring units of (meth)acrylate having an exo-form structure represented by the formula (A-3)-21 are preferred.

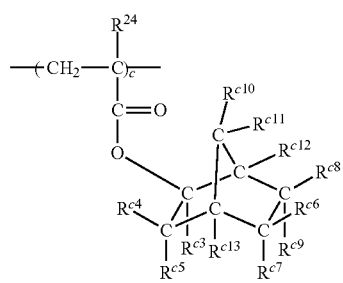
(A-3)-21

Herein, $R^{24}$ and c are as defined above; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in this case, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

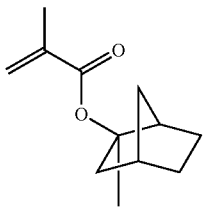 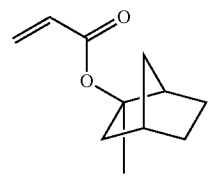

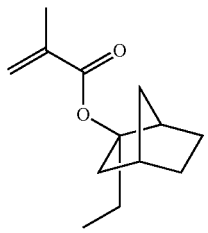 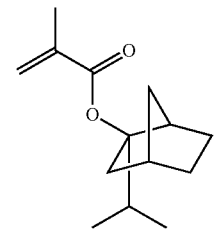

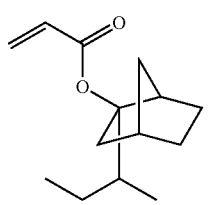 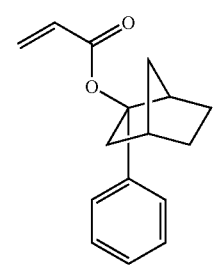

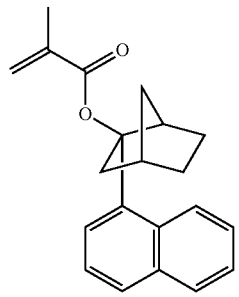 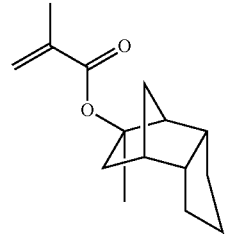

-continued

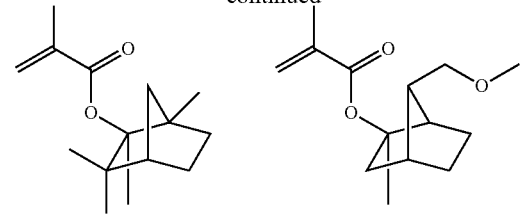
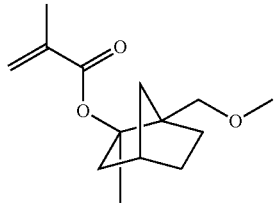
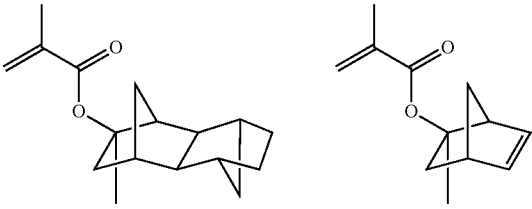
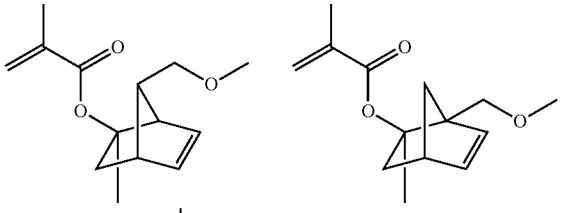
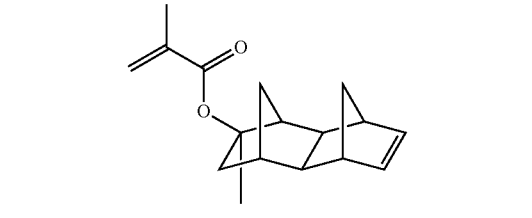
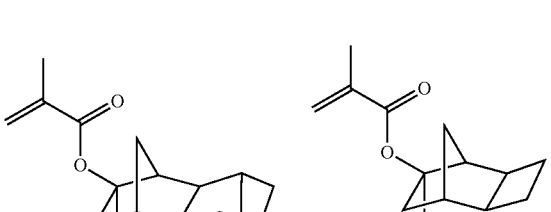
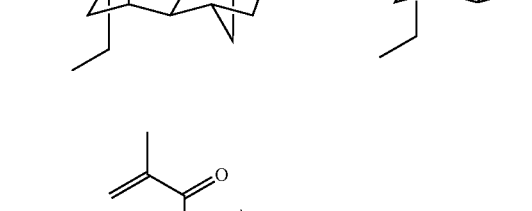
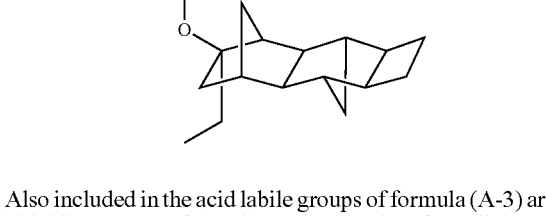

Also included in the acid labile groups of formula (A-3) are acid labile groups of (meth)acrylate having furandiyl, tetrahydrofurandiyl or oxanorbornanediyl as represented by the following formula (A-3)-22.

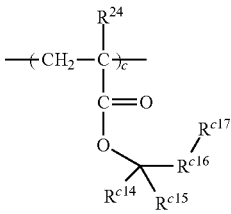

(A-3)-22

Herein, $R^{24}$ and c are as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

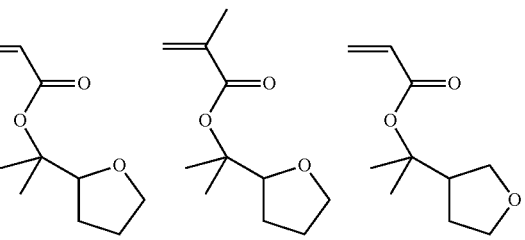
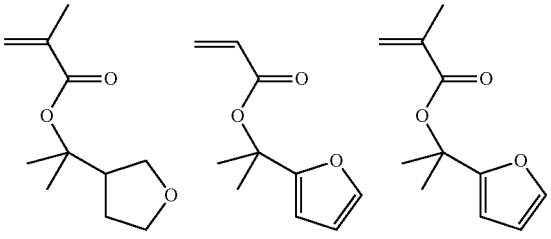
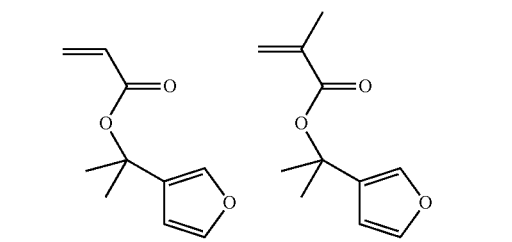
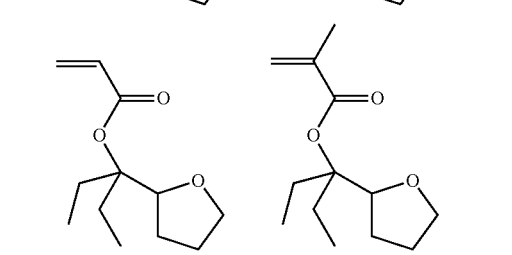

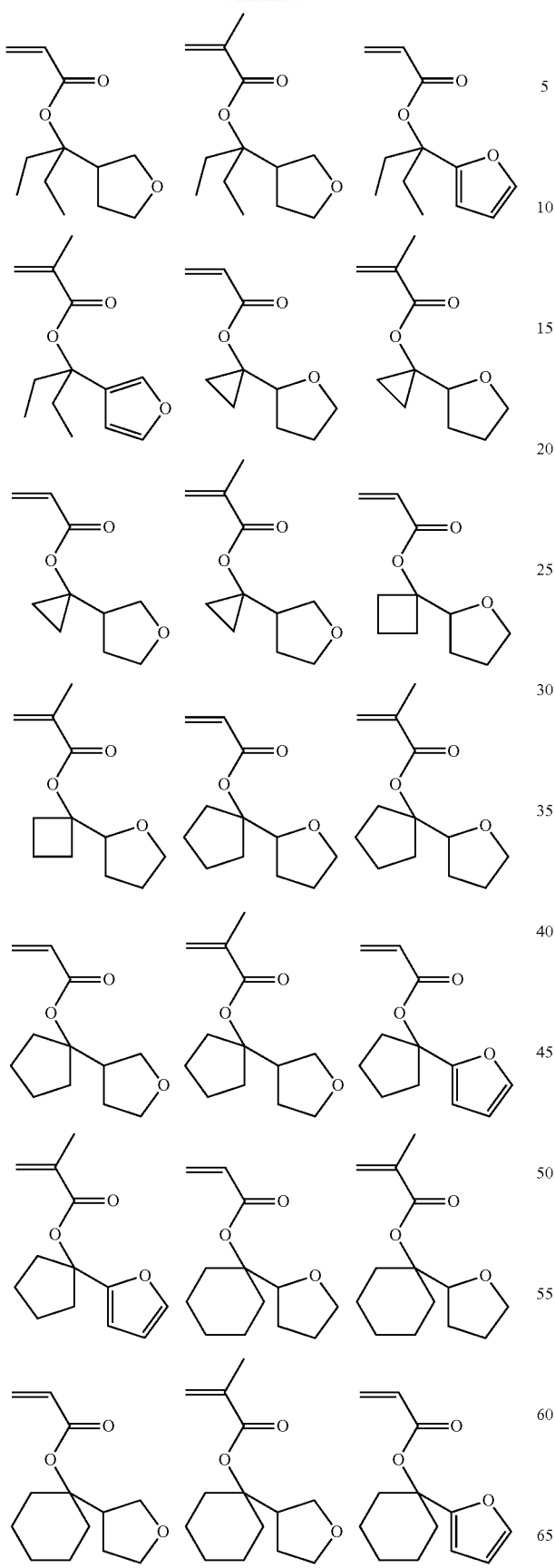
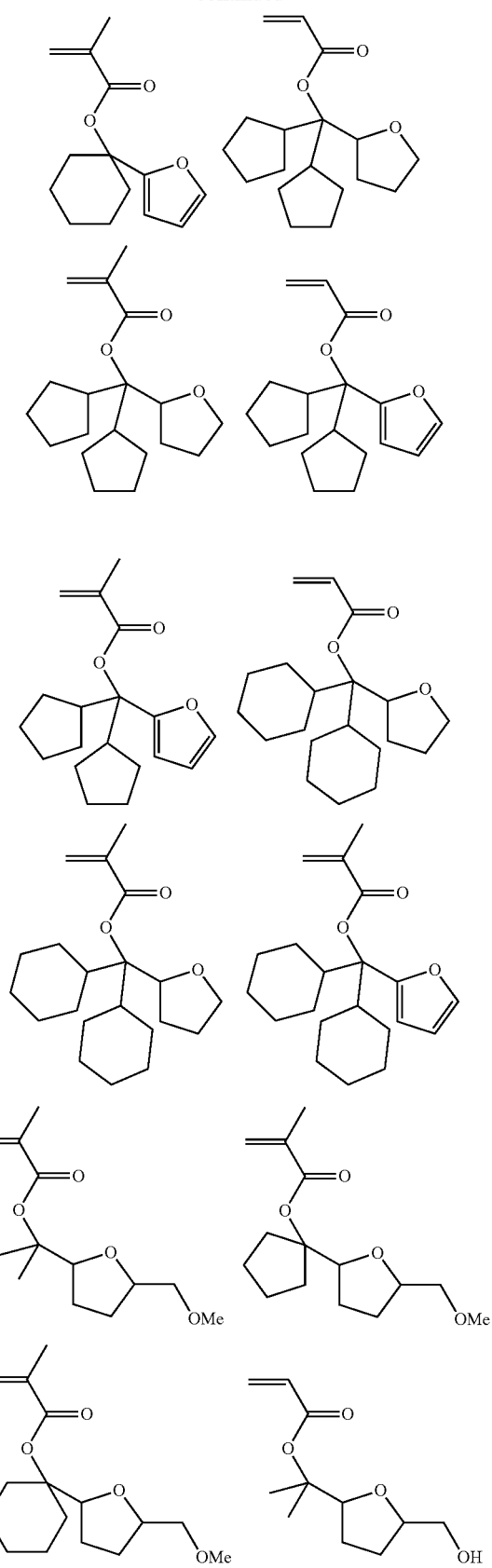

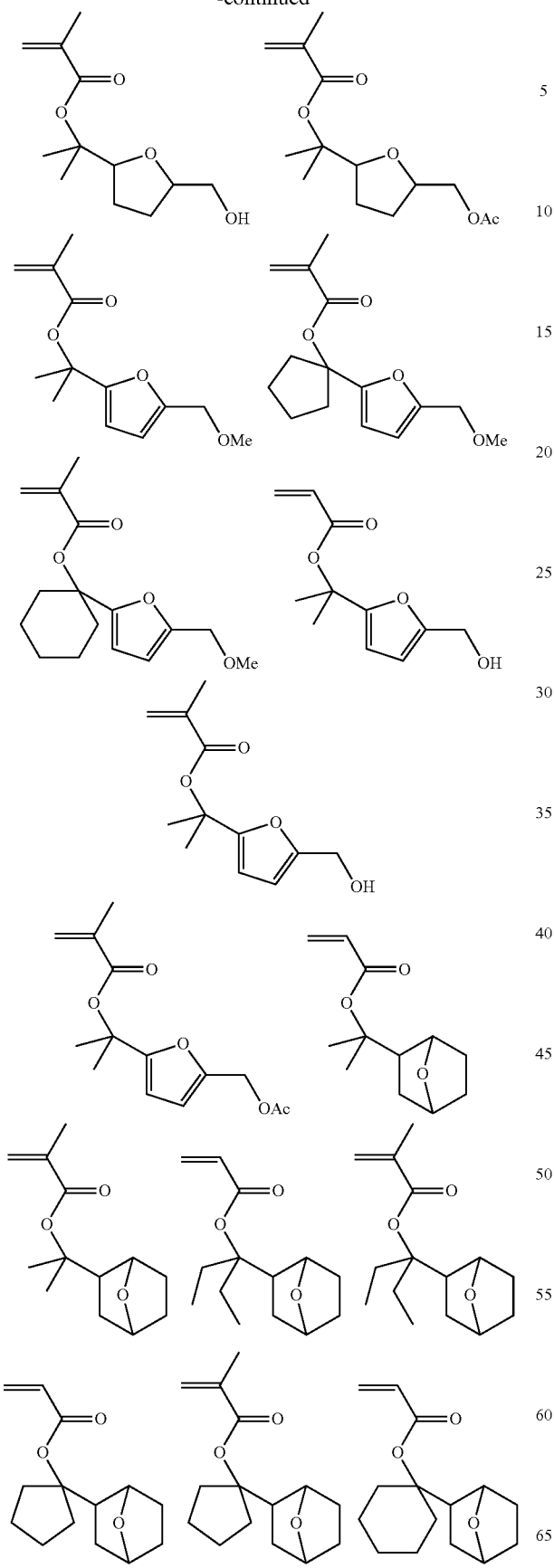
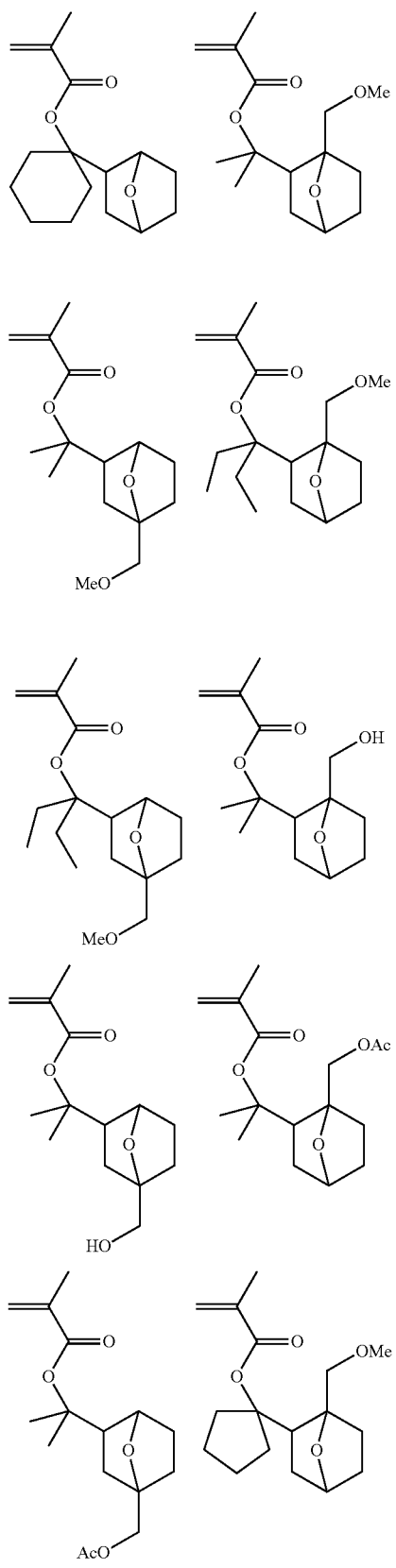

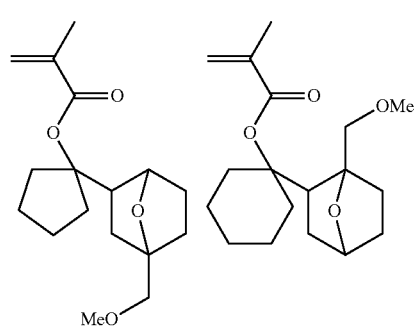
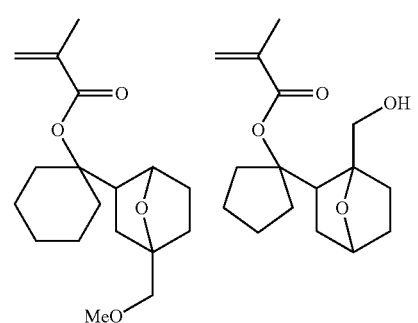
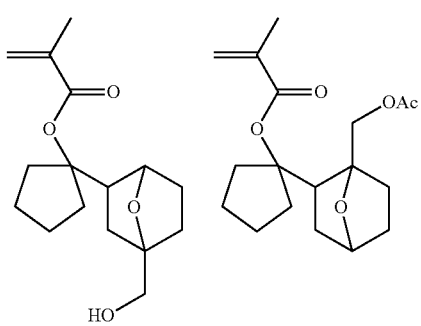
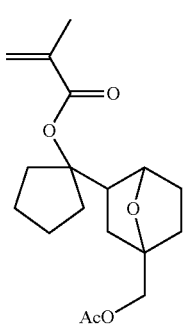
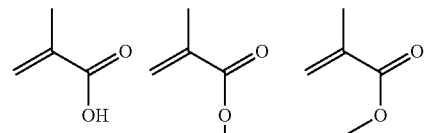
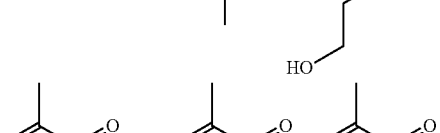
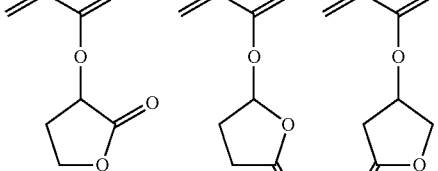
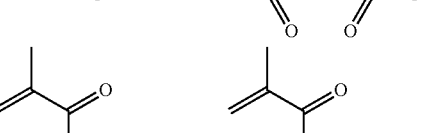
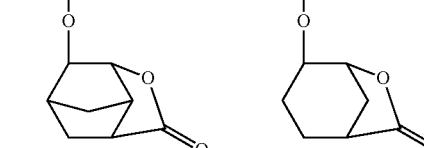
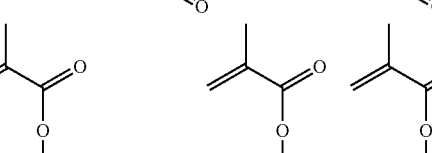
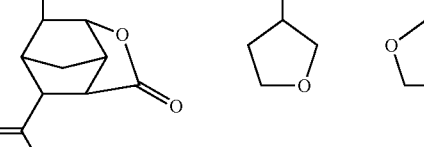
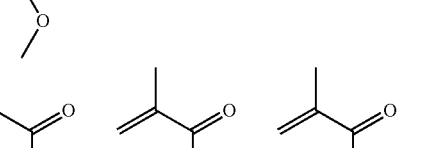
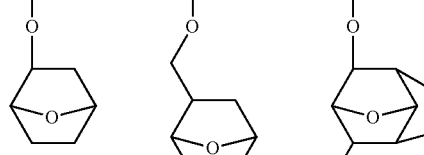
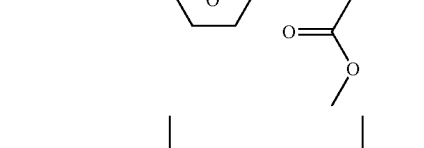
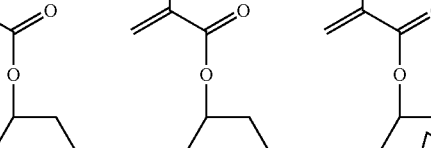
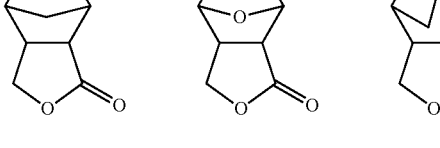
While the polymer used in the second resist composition preferably includes recurring units (b), (c) (d-1), and (d-2) as shown in formula (8), it may have copolymerized therein recurring units (e) derived from a monomer having a hydroxy, lactone ring, carbonate, cyano, ether or ester group. Examples of the monomers from which recurring units (e) are derived are given below.

73
-continued
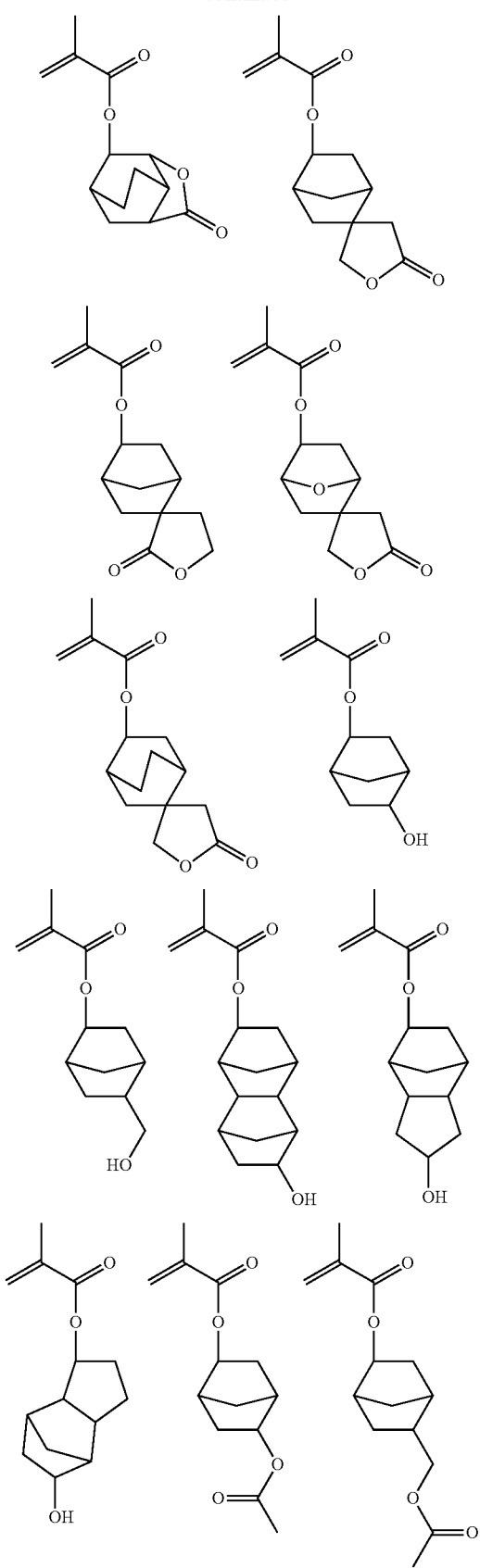
74
-continued
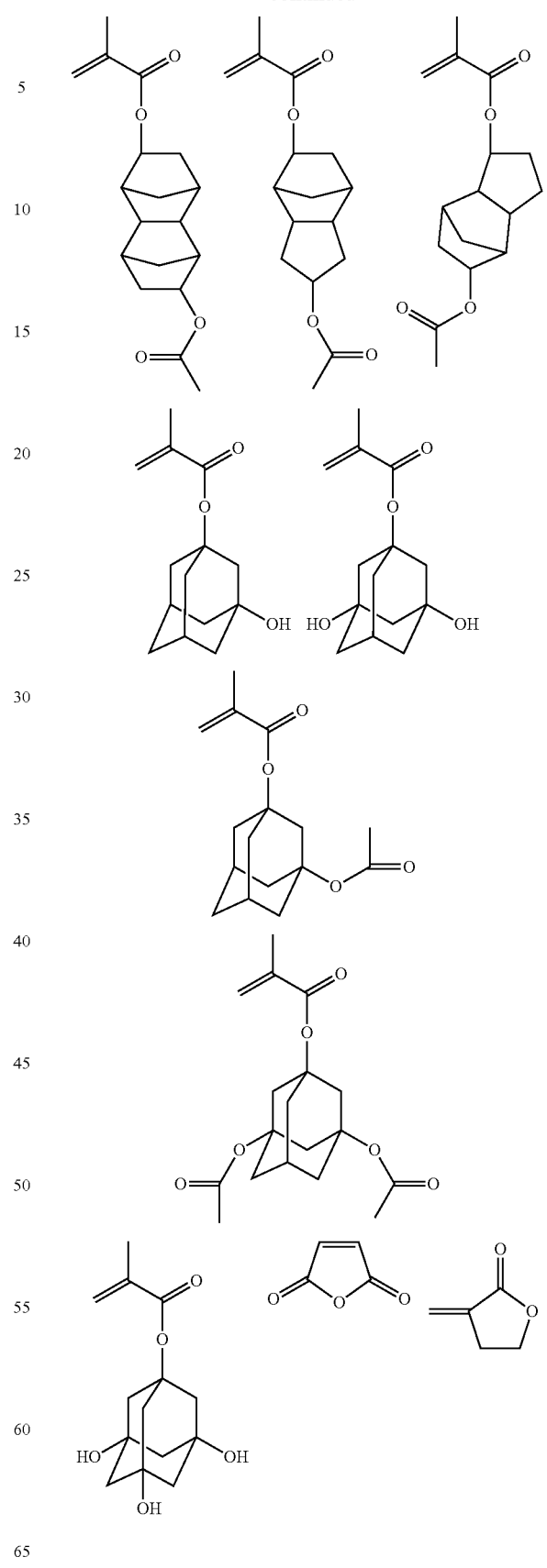

75
-continued
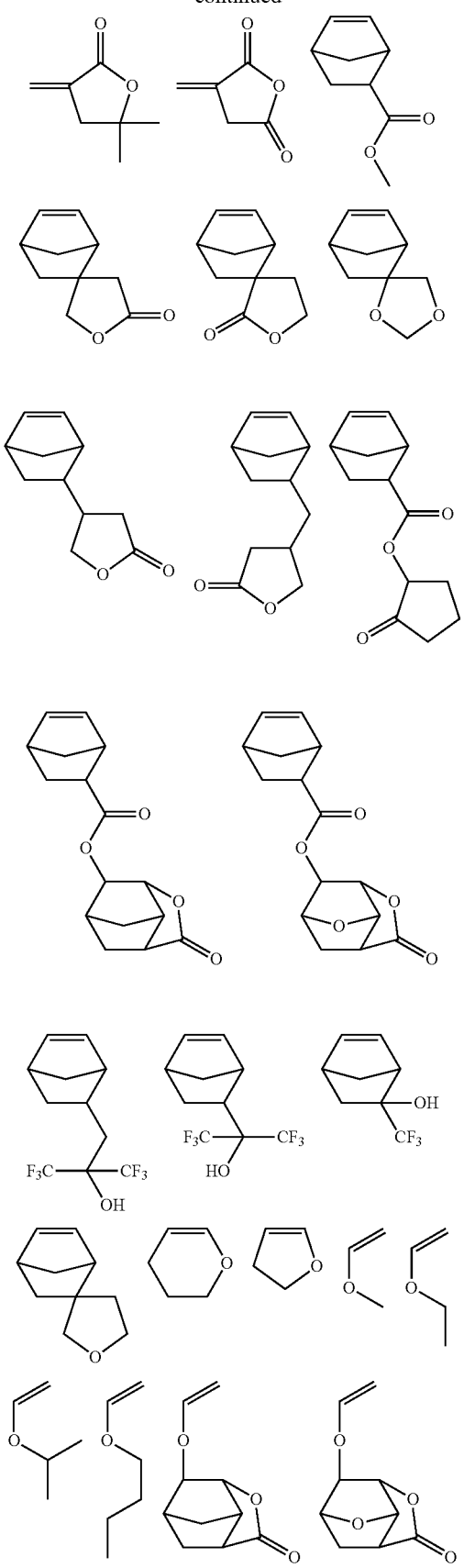
76
-continued
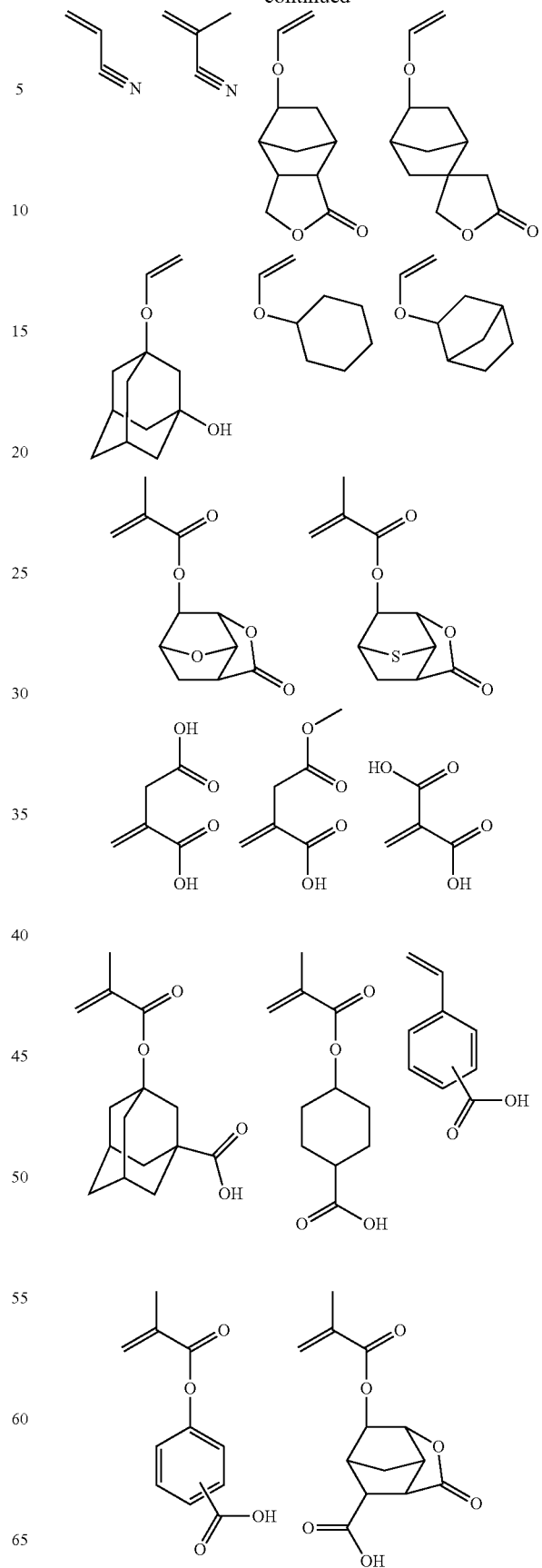

77
-continued
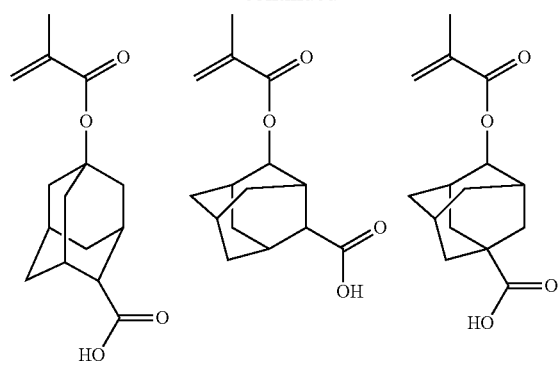
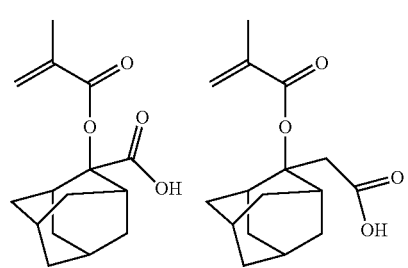
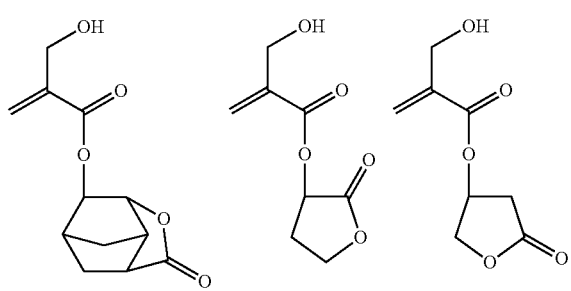
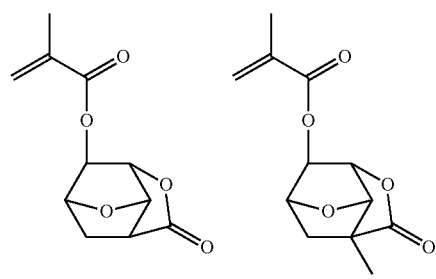
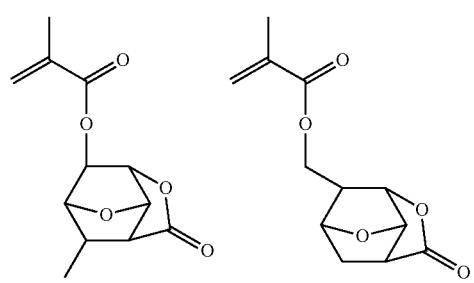
78
-continued
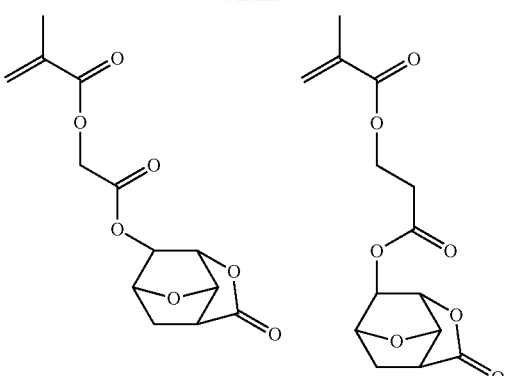
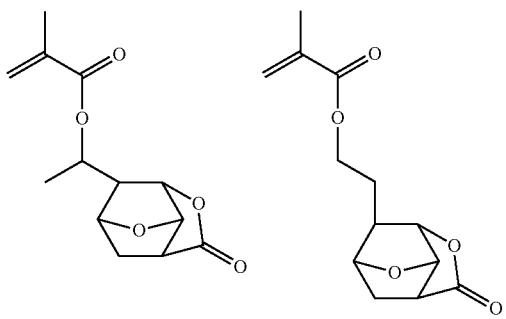
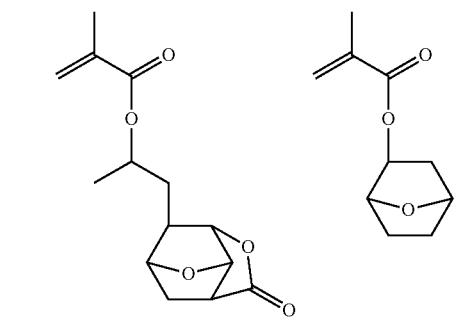
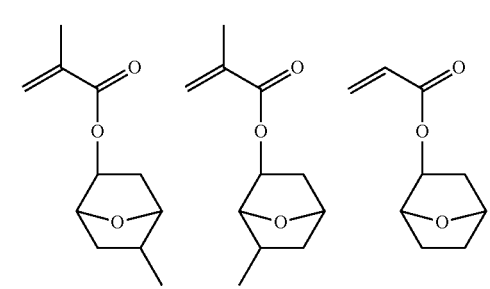
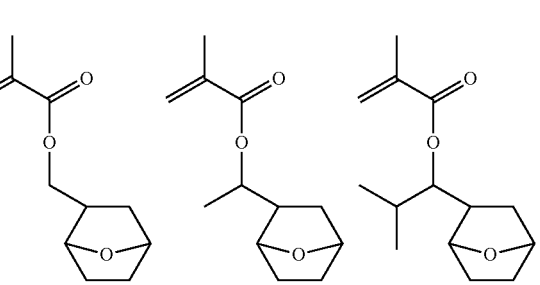

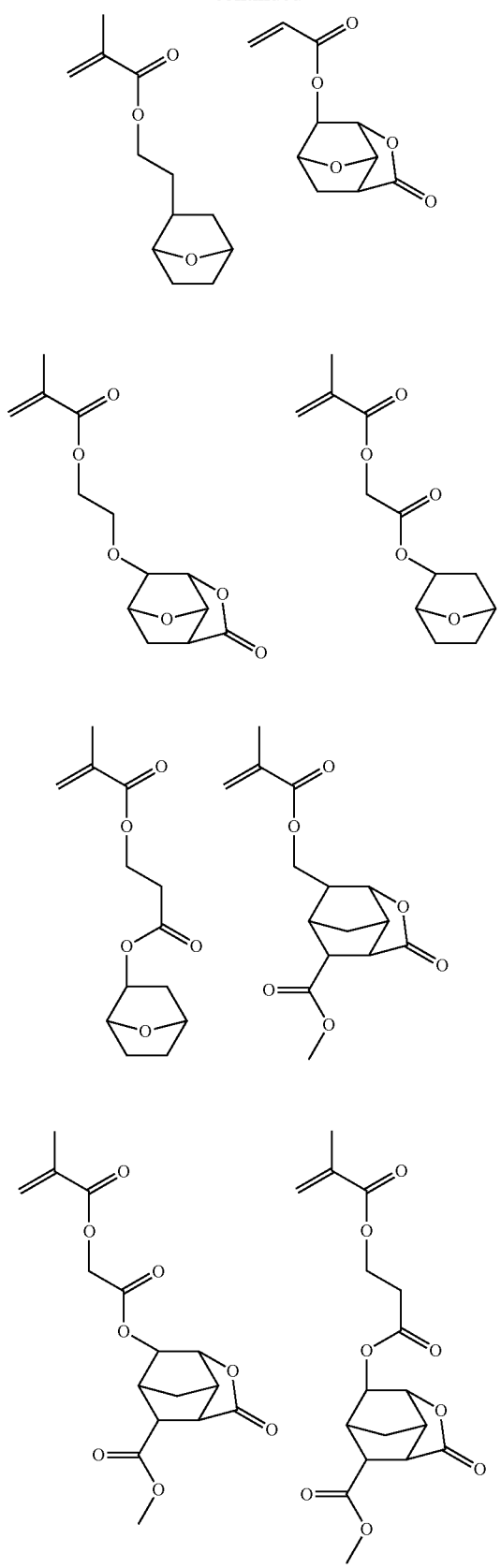
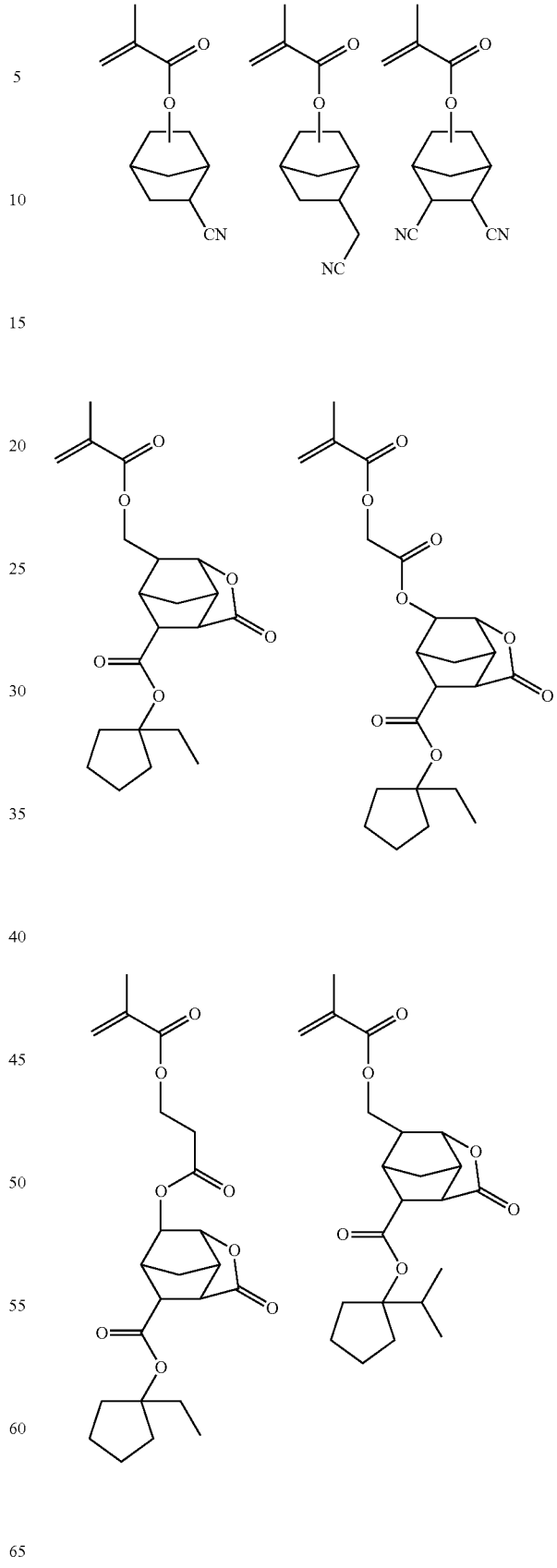

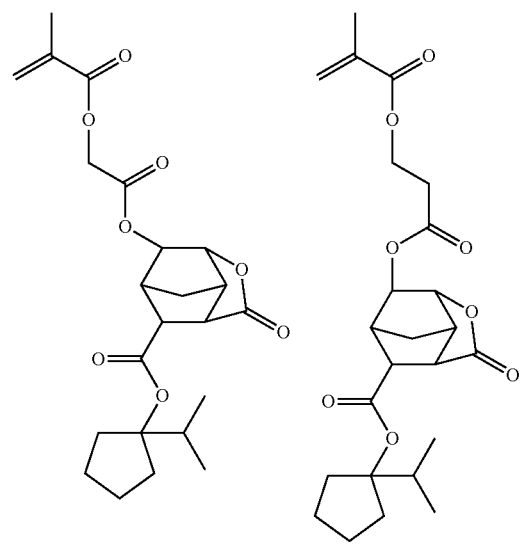
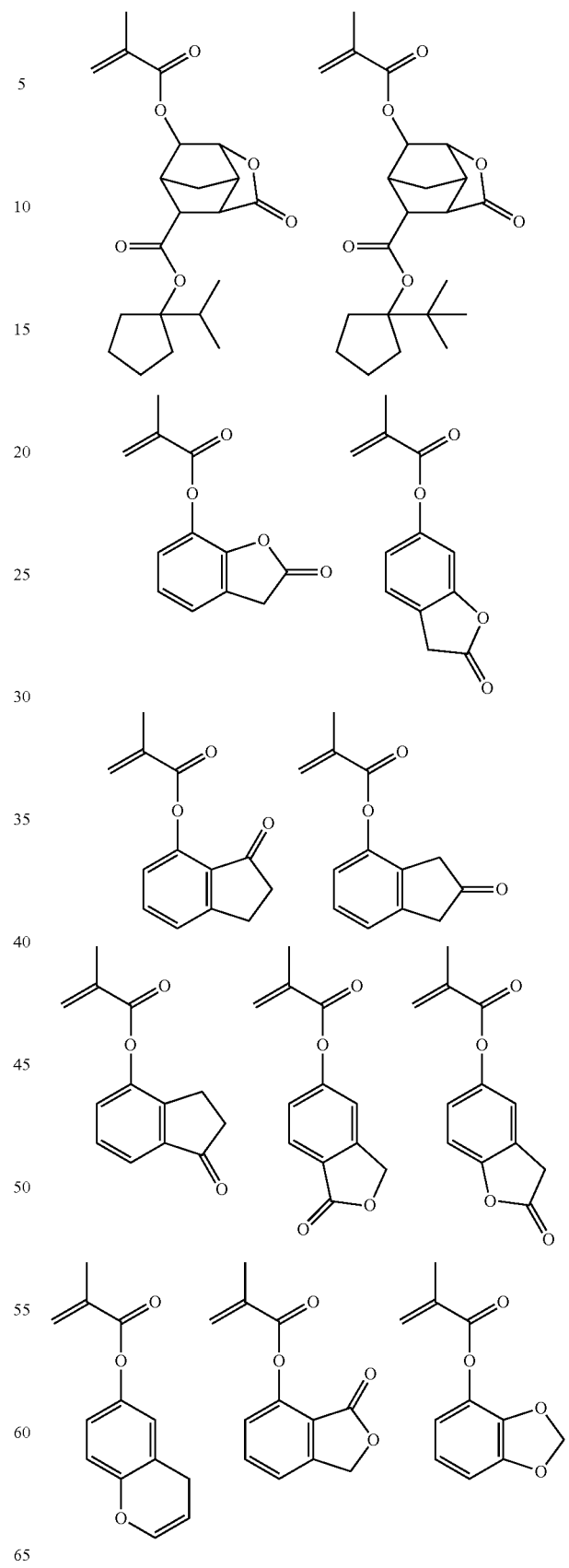

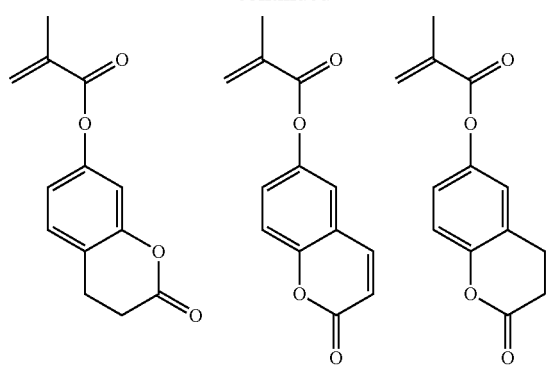
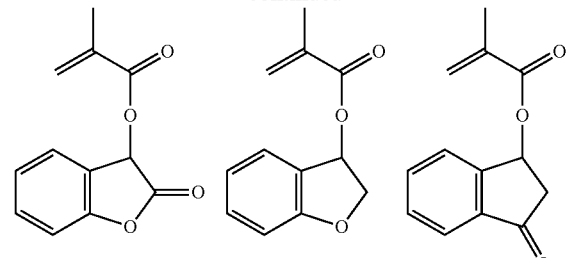
In the base resin for the second resist composition, any of recurring units (g1), (g2), and (g3) having a sulfonium salt as represented by the general formula (9) may be further copolymerized.
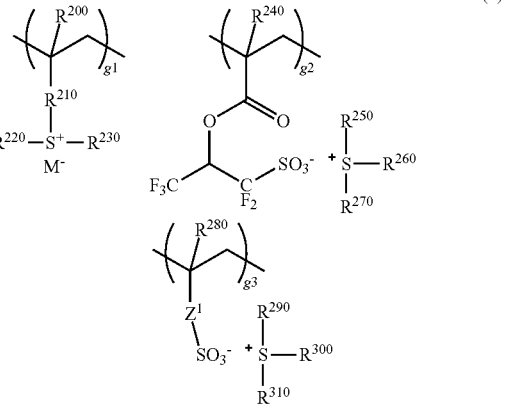
(9)

Herein $R^{200}$, $R^{240}$, and $R^{280}$ each are hydrogen or methyl. $R^{210}$ is a single bond, phenylene, —O—R— or —C(=O)—Y—R— wherein Y is an oxygen atom or NH, and R is a straight, branched or cyclic $C_1$-$C_6$ alkylene group, phenylene group or alkenylene group, which may contain a carbonyl (—CO—), ester (—COO—), ether (—O—) or hydroxy radical. $R^{220}$, $R^{230}$, $R^{250}$, $R^{260}$, $R^{270}$, $R^{290}$, $R^{300}$, and $R^{310}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group or thiophenyl group. $Z^1$ is a single bond, methylene, ethylene, phenylene, fluorinated phenylene, —O—$R^{320}$—, or —C(=O)—$Z^2$—$R^{320}$— wherein $Z^2$ is an oxygen atom or NH, and $R^{320}$ is a straight, branched or cyclic $C_1$-$C_6$ alkylene group, phenylene group or alkenylene group, which may contain a carbonyl, ester, ether or hydroxy radical. $M^-$ is a non-nucleophilic counter ion. The subscripts g1, g2 and g3 are numbers in the range: $0 \leq g1 \leq 0.3$, $0 \leq g2 \leq 0.3$, $0 \leq g3 \leq 0.3$, and $0 \leq g1+g2+g3 \leq 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide, and bis(perfluorobutylsulfonyl)imide; and methidates such as tris(trifluoromethylsulfonyl)methide and tris(perfluoroethylsulfonyl)methide.

Other non-nucleophilic counter ions include sulfonates having fluorine substituted at α-position as represented by the general formulae (K-1) and (K-2).

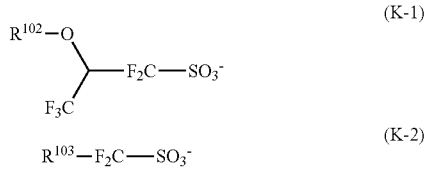

In formula (K-1), $R^{102}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl radical or lactone ring. In formula (K-2), $R^{103}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl radical or lactone ring.

As described above, the base polymer in the first resist composition used in the first patterning stage should be insoluble in the solvent consisting of a $C_3$-$C_8$ alcohol and an optional $C_6$-$C_{12}$ ether. The polymer should contain lactone-containing adhesive groups in order that the polymer be insoluble in the solvent. On the other hand, since recurring units (b), (d-1), and (d-2) facilitate dissolution in the $C_3$-$C_8$ alcohol and $C_6$-$C_{12}$ ether, these units should not be incorporated into the base polymer of the first resist composition, or if incorporated, should desirably be limited to a copolymerization proportion of up to 20 mol %.

Specifically, the base polymer in the first resist composition used in the first patterning stage should comprise recurring units (a1) or (a2) having a carbamate structure, recurring units (c) having an acid labile group, and recurring units ($b^0$) having lactone, and may have further copolymerized therein recurring units (e) having a hydroxy, carbonate, cyano, ether or ester group.

The base polymer in the first resist composition used in the first patterning stage comprises recurring units (a1) and/or (a2), ($b^0$), (c), and (e) in a copolymerization proportion: $0 \leq a1 < 1.0$, $0 \leq a2 < 1.0$, $0 < a1+a2 < 1.0$, $0 < b^0 < 1.0$, $0 < c < 1.0$, $0 \leq e < 1.0$, and $0 < a1+a2+b^0+c+e \leq 1.0$; preferably $0 \leq a1 \leq 0.5$, $0 \leq a2 \leq 0.5$, $0.01 \leq a1+a2 \leq 0.5$, $0.1 \leq b^0 \leq 0.9$, $0.1 \leq c \leq 0.8$, $0.05 \leq e \leq 0.9$, and $0.15 \leq b^0+c+e < 1.0$; more preferably $0.015 \leq a1 \leq 0.4$, $0.015 \leq a2 \leq 0.4$, $0.015 \leq a1+a2 \leq 0.4$, $0.2 \leq b^0 \leq 0.8$, $0.15 \leq c \leq 0.7$, $0.1 \leq e \leq 0.85$, and $0.2 \leq b^0+c+e \leq 1.0$.

The base polymer in the second resist composition used in the second patterning stage comprises recurring units (b), (c), (d-1), and (d-2) in a copolymerization proportion: $0 < b < 1.0$, $0 < c < 1.0$, $0 \leq (d-1) < 1.0$, $0 \leq (d-2) < 1.0$, $0 < b+c+(d-1)+(d-2) \leq 1.0$, and $0.1 \leq b+(d-1)+(d-2) \leq 0.9$; preferably $0.1 \leq b \leq 0.9$, $0.1 \leq c \leq 0.8$, $0 \leq (d-1)+(d-2) \leq 0.5$, $0.3 \leq b+c+(d-1)+(d-2) \leq 1.0$, and $0.15 \leq b+(d-1)+(d-2) \leq 0.85$; more preferably $0.2 \leq b \leq 0.8$, $0.15 \leq c \leq 0.7$, $0 \leq (d-1) \leq 0.4$, $0 \leq (d-2) \leq 0.4$, $0.4 \leq b+c+(d-1)+(d-2) \leq 1.0$, and $0.2 \leq b+(d-1)+(d-2) \leq 0.8$. Notably e is $0 \leq e < 1.0$, preferably $0 \leq e \leq 0.7$, and more preferably $0 \leq e \leq 0.6$, and $b+c+(d-1)+(d-2)+e \leq 1.0$.

The meaning of $b+c+(d-1)+(d-2)+e=1$ is that in a polymer comprising recurring units (b), (c), (d-1), (d-2), and (e), the sum of recurring units (b), (c), (d-1), (d-2), and (e) is 100 mol % based on the total amount of entire recurring units. The meaning of $b+c+(d-1)+(d-2)+e<1$ is that the sum of recurring units (b), (c), (d-1), (d-2), and (e) is less than 100 mol % based on the total amount of entire recurring units, indicating the inclusion of other recurring units, for example, units (g1), (g2) or (g3). Where recurring units (g1), (g2) or (g3) are incorporated, their proportion is preferably $0 \leq g1+g2+g3 \leq 0.2$.

The following description applies to both the first and second resist compositions.

The polymer serving as the base resin in the resist material used in the pattern forming process of the invention should preferably have a weight average molecular weight (Mw) in the range of 1,000 to 500,000, and more preferably 2,000 to 30,000, as measured by GPC using polystyrene standards. With too low a Mw, the efficiency of thermal crosslinking in the resist material after development may become low. A polymer with too high a Mw may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable. A blend of a polymer comprising recurring units having a base generator incorporated therein and an ordinary polymer free of a base generator is also acceptable.

The polymer used herein may be synthesized by any desired method, for example, by dissolving unsaturated bond-containing monomers corresponding to the respective units in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and thereafter protected or partially protected.

The polymer is not limited to one type and a mixture of two or more polymers may be added. The use of plural polymers allows for adjustment of resist properties.

The first or second positive resist composition used herein may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). The acid generator is typically used in an amount of 0.1 to 30 parts, and preferably 0.5 to 25 parts by weight per 100 parts by weight of the base polymer.

The resist composition may further comprise an organic solvent, basic compound, dissolution regulator, surfactant, and acetylene alcohol, alone or in combination.

Examples of the organic solvent added to the first resist composition are described in U.S. Pat. No. 7,537,880 or JP-A 2008-111103, paragraphs [0144] to [0145]. The organic solvent used in the first resist composition may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as PGMEA, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein. An appropriate amount of the organic solvent used is 200 to 8,000 parts, especially 400 to 6,000 parts by weight per 100 parts by weight of the base polymer.

In the second resist composition, the organic solvent comprises a $C_3$-$C_8$ alcohol and optionally a $C_6$-$C_{12}$ ether. Examples of $C_3$-$C_8$ alcohol include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol.

Of the $C_3$-$C_8$ alcohols, preferred are primary $C_4$-$C_8$ alcohols including 1-butyl alcohol, isobutyl alcohol, 1-pentanol, neopentyl alcohol, 2-methyl-1-butanol, 3-methyl-1-butanol, 1-hexanol, 3,3-dimethyl-1-butanol, 2,2-diethyl-1-butanol, 2-methyl-1-pentanol, 3-methyl-1-pentanol, 4-methyl-1-pentanol, 1-heptanol, and 1-octanol. The first pattern resist is least soluble in the $C_4$-$C_8$ alcohols whereas the fluoroalcohol-containing polymer for the second resist is highly soluble in primary alcohols.

Examples of the $C_6$-$C_{12}$ ether include methyl cyclopentyl ether, methyl cyclohexyl ether, diisopropyl ether, diisobutyl ether, diisopentyl ether, di-n-pentyl ether, methyl cyclopentyl ether, methyl cyclohexyl ether, di-n-butyl ether, di-sec-butyl ether, di-sec-pentyl ether, di-tert-amyl ether, di-n-hexyl ether, anisole, 2-methylanisole, 3-methylanisole, 4-methylanisole, 2,3-dimethylanisole, 2,4-dimethylanisole, 3,4-dimethylanisole, 2,5-dimethylanisole, 2,6-dimethylanisole, 3,5-dimethylanisole, 3,6-dimethylanisole, 2,3,4-trimethylanisole, 2,3,6-trimethylanisole, 2,4,6-trimethylanisole, 2,4,5,6-tetramethylanisole, 2-ethylanisole, 3-ethylanisole, 4-ethylanisole, 2-isopropylanisole, 3-isopropylanisole, 4-isopropylanisole, 4-propylanisole, 2-butylanisole, 3-butylanisole, 4-butylanisole, 2-tert-butylanisole, 3-tert-butylanisole, 4-tert-butylanisole, pentamethylanisole, 2-vinylanisole, 3-vinylanisole, 4-methoxystyrene, ethyl phenyl ether, propyl phenyl ether, butyl phenyl ether, ethyl 3,5-xylyl ether, ethyl 2,6-xylyl ether, ethyl 2,4-xylyl ether, ethyl 3,4-xylyl ether, ethyl 2,5-xylyl ether, methyl benzyl ether, ethyl benzyl ether, isopropyl benzyl ether, propyl benzyl ether, methyl phenethyl ether, ethyl phenethyl ether, isopropyl phenethyl ether, propyl phenethyl ether, butyl phenethyl ether, vinyl phenyl ether, allyl phenyl ether, vinyl benzyl ether, allyl benzyl ether, vinyl phenethyl ether, allyl phenethyl ether, 4-ethylphenetole, and tert-butyl phenyl ether, and mixtures of two or more of the foregoing.

Of the $C_6$-$C_{12}$ ethers, preferred are $C_8$-$C_{12}$ ethers including diisobutyl ether, diisopentyl ether, di-n-pentyl ether, di-n-butyl ether, di-sec-butyl ether, di-sec-pentyl ether, di-tert-amyl ether, di-n-hexyl ether, 2-methylanisole, 3-methylanisole, 4-methylanisole, 2,3-dimethylanisole, 2,4-dimethylanisole, 3,4-dimethylanisole, 2,5-dimethylanisole, 2,6-dimethylanisole, 3,5-dimethylanisole, 3,6-dimethylanisole, 2,3,4-trimethylanisole, 2,3,6-trimethylanisole, 2,4,6-trimethylanisole, 2,4,5,6-tetramethylanisole, 2-ethylanisole, 3-ethylanisole, 4-ethylanisole, 2-isopropylanisole, 3-isopropylanisole, 4-isopropylanisole, 4-propylanisole, 2-butylanisole, 3-butylanisole, 4-butylanisole, 2-tert-butylanisole, 3-tert-butylanisole, 4-tert-butylanisole, pentamethylanisole, 2-vinylanisole, 3-vinylanisole, 4-methoxystyrene, ethyl phenyl ether, propyl phenyl ether, butyl phenyl ether, ethyl 3,5-xylyl ether, ethyl 2,6-xylyl ether, ethyl 2,4-xylyl ether, ethyl 3,4-xylyl ether, ethyl 2,5-xylyl ether, methyl benzyl ether, ethyl benzyl ether, isopropyl benzyl ether, propyl benzyl ether, methyl phenethyl ether, ethyl phenethyl ether, isopropyl phenethyl ether, propyl phenethyl ether, butyl phenethyl ether, vinyl phenyl ether, allyl phenyl ether, vinyl benzyl ether, allyl benzyl ether, vinyl phenethyl ether, allyl phenethyl ether, 4-ethylphenetole, and tert-butyl phenyl ether.

The $C_8$-$C_{12}$ ethers are characterized by a substantial insolubility of the first pattern therein. The polymer for use in the second resist composition does not dissolve in a $C_8$-$C_{12}$ ether when used alone, but dissolves in a mixture of a $C_8$-$C_{12}$ ether and a $C_3$-$C_8$ alcohol. Since alcohols generally have a high viscosity, a photoresist composition containing a polymer in an alcohol solvent is less amenable to spin coating. On the other hand, ethers have a low viscosity. Then a solvent mixture of alcohol and ether is effective in reducing the viscosity of the resist composition, thereby facilitating the coating operation thereof. Of the alcohols used in the second resist composition, isobutyl alcohol, 2-methyl-1-butanol and 3-methyl-1-butanol exhibit a high solubility, but have a low boiling point and hence, a high evaporation rate during spin coating. In one version of the immersion lithography wherein a topcoat resist film is used in the absence of a protective film, it is a common practice to add a polymeric substance capable of improving water repellency to the resist composition. During film formation by spin coating, the water repellent substance segregates at the resist surface. If the solvent has a low boiling point, the resist film will solidify before sufficient segregation of the water repellent substance occurs, resulting in only a slight improvement in water repellency. This problem is solved by blending a solvent having a high solubility and a low boiling point with a solvent having a high boiling point. The high boiling solvents used are primary $C_6$-$C_8$ alcohols and $C_8$-$C_{12}$ ethers.

The solvent consisting of a $C_3$-$C_8$ alcohol or a $C_3$-$C_8$ alcohol and a $C_6$-$C_{12}$ ether should not dissolve away the first resist pattern, whereas components of the second resist composition should be dissolvable therein. The standard by which the solvent consisting of a $C_3$-$C_8$ alcohol or a $C_3$-$C_8$ alcohol and a $C_6$-$C_{12}$ ether is judged as not dissolving away the first resist pattern is that the first resist film experiences a slimming of not more than 10 nm when the solvent is dispensed on the first resist film for 30 seconds and then removed by spin drying and baking at a temperature not higher than 130° C.

Of various components for use in the first and second resist compositions, exemplary basic compounds are described in JP-A 2008-111103 (U.S. Pat. No. 7,537,880), paragraphs [0146] to [0164], including primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amides, imides, and carbamates. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

While the invention provides a pattern forming process using a resist composition based on a polymer having copolymerized therein recurring units having a base generating mechanism, a base generator may be added to the resist composition. The base generator typically includes the compounds having the general formulae (10) to (15).

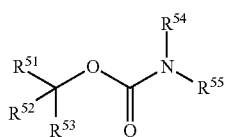
(10)

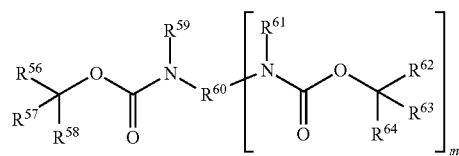
(11)

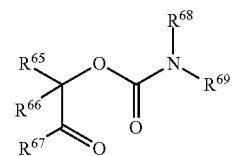
(12)

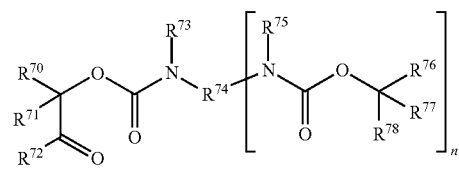
(13)

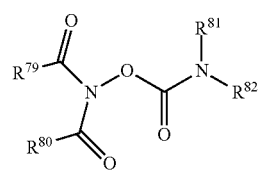
(14)

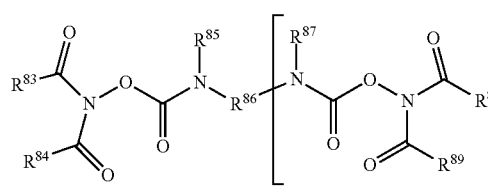
(15)

Herein $R^{51}$, $R^{52}$, $R^{53}$, $R^{56}$, $R^{57}$, $R^{58}$, $R^{62}$, $R^{63}$, $R^{64}$, $R^{65}$, $R^{66}$, $R^{67}$, $R^{70}$, $R^{71}$, $R^{72}$, $R^{76}$, $R^{77}$ and $R^{78}$ are each independently hydrogen, a straight, branched or cyclic $C_1$-$C_6$ alkyl group, or a $C_6$-$C_{14}$ aryl group, which may be substituted with a straight, branched or cyclic $C_1$-$C_6$ alkyl or alkoxy group, nitro, halogen, cyano or trifluoromethyl group, at least one of $R^{51}$ to $R^{53}$, $R^{56}$ to $R^{58}$, $R^{62}$ to $R^{64}$, $R^{65}$ to $R^{67}$, $R^{70}$ to $R^{72}$, and $R^{76}$ to $R^{78}$ is an aryl or alkenyl group, and at least one is hydrogen, or at least two of $R^{51}$ to $R^{53}$, $R^{56}$ to $R^{58}$, $R^{62}$ to $R^{64}$, $R^{65}$ to $R^{67}$, $R^{70}$ to $R^{72}$, and $R^{76}$ to $R^{78}$ may bond together to form a non-aromatic ring with the carbon atom to which they are attached. $R^{54}$, $R^{55}$, $R^{59}$, $R^{61}$, $R^{68}$, $R^{69}$, $R^{73}$, $R^{75}$, $R^{81}$, $R^{82}$, $R^{85}$, and $R^{87}$ are each independently hydrogen or a straight, branched or cyclic $C_1$-$C_{12}$ alkyl group which may contain a double bond, ether, amino, carbonyl, hydroxyl or ester group, or a pair of $R^{54}$ and $R^{55}$, $R^{59}$ and $R^{61}$, $R^{59}$ and $R^{60}$, $R^{61}$ and $R^{60}$, $R^{68}$ and $R^{69}$, $R^{73}$ and $R^{74}$, $R^{74}$ and $R^{75}$, $R^{73}$ and $R^{75}$, $R^{81}$ and $R^{82}$, $R^{85}$ and $R^{86}$, $R^{85}$ and $R^{87}$, and $R^{86}$ and $R^{87}$ may bond together to form a ring with the nitrogen atom or atoms to which they are attached. $R^{60}$, $R^{74}$ and $R^{86}$ are a single bond, a straight, branched or cyclic $C_1$-$C_{20}$ alkylene or alkyne group, $C_6$-$C_{20}$ arylene, $C_2$-$C_{12}$ alkenylene, or $C_2$-$C_{12}$ alkynylene group, which may contain a double bond, ether, amino, carbonyl, hydroxyl or ester group. $R^{79}$, $R^{80}$, $R^{83}$, $R^{84}$, $R^{88}$, and $R^{89}$ are a straight or branched $C_1$-$C_6$ alkyl group, or a pair of $R^{79}$ and $R^{80}$, $R^{83}$ and $R^{84}$, and $R^{88}$ and $R^{89}$ may bond together to form a ring with the carbon and nitrogen atoms to which they are attached, the ring optionally containing a benzene ring, naphthalene ring, double bond or ether bond. The subscripts m, n, and r are 1 or 2.

The use of the base generator of any one of formulae (10) to (15) affords an amine propagating mechanism that an amine is generated from the compound comprising recurring units of formula (1) by utilizing as a catalyst an amine compound generated by the base generator of any one of formulae (10) to (15). This mechanism has the advantage of more efficient amine generation.

Process

Now, the double patterning process is described. FIGS. 4 to 6 illustrate prior art double patterning processes.

Referring to FIG. 4, one exemplary double patterning process I is illustrated. A photoresist film 30 is coated and formed on a processable layer 20 on a substrate 10. To prevent the photoresist pattern from collapsing, the technology intends to reduce the thickness of photoresist film. One approach taken to compensate for a lowering of etch resistance of thinner film is to process the processable layer using a hard mask. The double patterning process illustrated in FIG. 4 uses a multilayer coating in which a hard mask 40 is laid between the photoresist film 30 and the processable layer 20 as shown in FIG. 4A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON, p-Si or TiN, for example. The resist material used in double patterning process I is a positive resist composition. In the process, the resist film 30 is exposed and developed (FIG. 4B), the hard mask 40 is then dry etched (FIG. 4C), the photoresist film is stripped, and a second photoresist film 50 is coated, formed, exposed, and developed (FIG. 4D). Then the processable layer 20 is dry etched (FIG. 4E). Since this etching is performed using the hard mask pattern and the second photoresist pattern as a mask, variations occur in the pattern size after etching of the processable layer due to a difference in etch resistance between hard mask 40 and photoresist film 50.

To solve the above problem, a double patterning process II illustrated in FIG. 5 involves laying two layers of hard mask 41 and 42. The upper layer of hard mask 42 is processed using a first resist pattern, the lower layer of hard mask 41 is processed using a second resist pattern, and the processable layer is dry etched using the two hard mask patterns. It is essential to establish a high etching selectivity between first hard mask 41 and second hard mask 42. Thus the process is rather complex.

FIG. 6 illustrates a double patterning process III using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials. The trench process requires a very high accuracy of alignment because any misalignment between the first and second trenches leads to a variation in the width of the finally remaining lines.

The double patterning processes I to III described above have the drawback that two hard mask etchings are involved.

FIG. 1 illustrates the double patterning process of the invention. FIG. 1A shows a structure wherein a first resist film 30 of the first resist composition is formed on a processable layer 20 on a substrate 10 via a hard mask 40 as in FIG. 4A. The first resist film 30 is exposed patternwise and developed to form a first resist pattern (FIG. 1B). The first resist film 30 is then baked whereby the base generator moiety is decomposed to generate a base for thereby inactivating the first resist film 30 to acid, yielding an inactivated resist pattern 30a (FIG. 1C). The preferred baking is at 100 to 200° C. for 3 to 200 seconds. A temperature higher than 200° C. is undesired because the resist pattern may be deformed due to thermal flow or shrunk as a result of deprotection of acid labile groups. At temperatures below 100° C., the base generator moiety is little decomposed. The heating or baking temperature is preferably 100° C. to 180° C., more preferably 110° C. to 160° C., and even more preferably 110° C. to 150° C. The pattern is little deformed if baking is at or below 150° C.

Next, the second resist composition is coated on the substrate to form a second resist film. Through patternwise exposure and development of the second resist film, a second resist pattern 50 is formed in an area where features of the first resist film 30 (inactivated first resist pattern 30a) have not been formed (FIG. 1D). Thereafter, the hard mask 40 is etched (FIG. 1E). The processable layer 20 is dry etched, and finally, the inactivated first resist pattern 30a and second resist pattern 50 are removed (FIG. 1F).

Figure 2B:
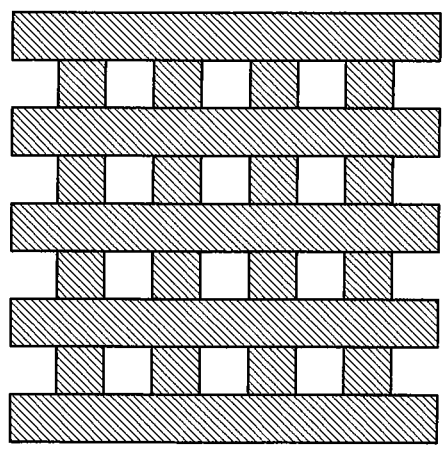
FIG. 2B shows a second pattern being formed.
Figure 3A:
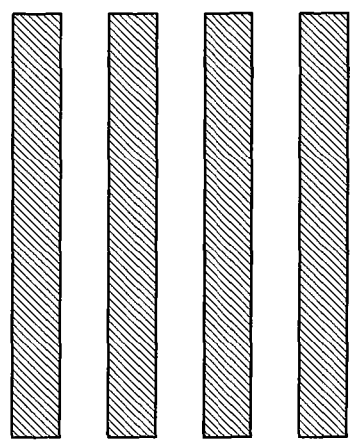
FIG. 3A shows a first pattern being formed.
Figure 3B:
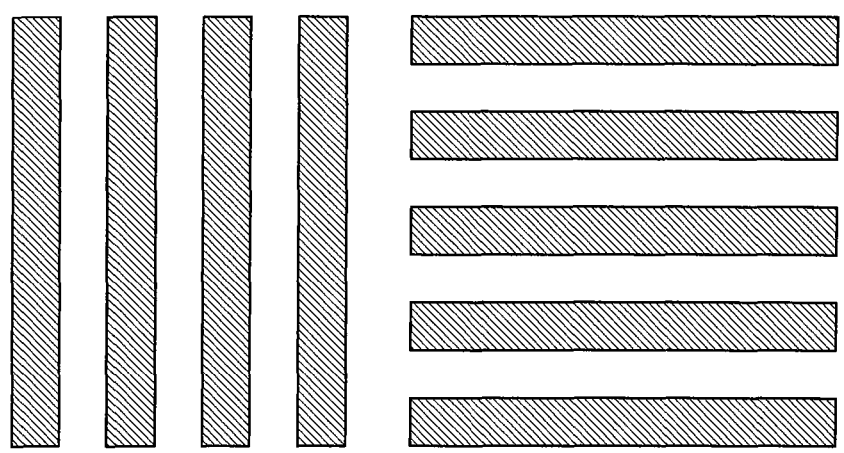
FIG. 3B shows a second pattern being formed.
Figure 5A:
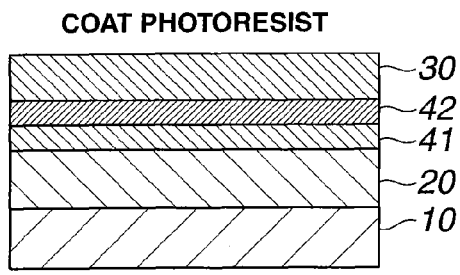
FIG. 5A shows a laminate of substrate, processable layer, 1st and 2nd hard masks and resist film.
Figure 5B:
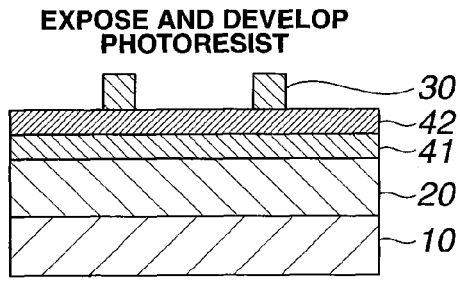
FIG. 5B shows the resist film being exposed and developed.
Figure 5C:
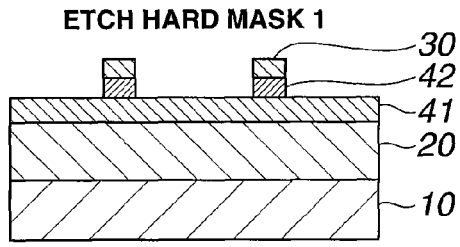
FIG. 5C shows the 2nd hard mask being etched.
Figure 5D:
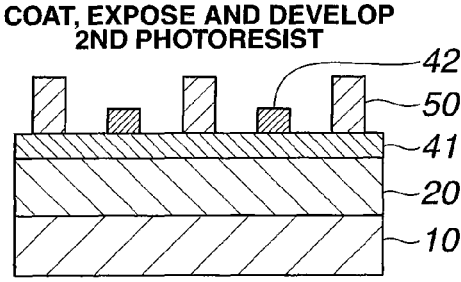
FIG. 5D shows, after removal of the first resist film, a second resist film being formed, exposed and developed.
Figure 5E:
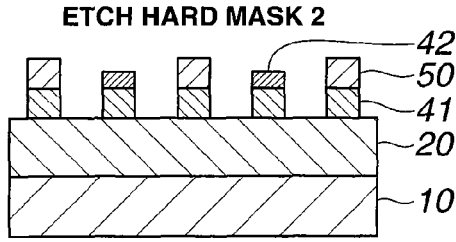
FIG. 5E shows the 1st hard mask being etched.
Figure 5F:
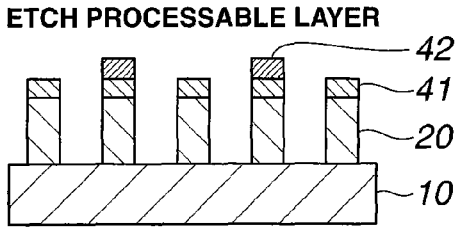
FIG. 5F shows the processable layer being etched.

Although the process illustrated in FIG. 1 forms the second pattern between lines of the first pattern, it is also acceptable to form the second pattern so as to cross the first pattern orthogonally as shown in FIG. 2. Although such a pattern may be formed through a single exposure step, an orthogonal line pattern may be formed at a very high contrast by a combination of dipolar illumination with polarized illumination. Specifically, pattern lines in Y-direction are formed as shown in FIG. 2A and then protected from dissolution by the process of the invention. Thereafter, a second resist is coated and processed to form pattern lines in X-direction as shown in FIG. 2B. Combining X and Y lines defines a lattice-like pattern while empty areas become holes. The pattern that can be formed by such a process is not limited to the orthogonal pattern, and may include a T-shaped pattern (not shown) or a separated pattern as shown in FIG. 3B.

The substrate 10 used herein is generally a silicon substrate. The processable layer 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above. Understandably, an undercoat film in the form of a carbon film and an intermediate intervening layer in the form of a silicon-containing intermediate film or organic antireflective coating may be formed instead of the hard mask.

In the process of the invention, a first resist film of a first positive resist composition is formed on the processable layer directly or via an intermediate intervening layer such as the hard mask. The first resist film preferably has a thickness of 10 to 1,000 nm, and more preferably 20 to 500 nm. The first resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by patternwise exposure. For the exposure, preference is given to high-energy radiation having a wavelength of 140 to 250 nm, and especially ArF excimer laser radiation of 193 nm. The exposure may be done either in a dry atmosphere such as air or nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with deionized water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

To the first resist composition, an additive for rendering the resist surface water repellent may be added. A typical additive is a polymer having a fluoroalcohol group. After spin coating, the polymer segregates toward the resist surface to reduce the surface energy, thereby improving water slip. Such additives are described in JP-A 2007-297590 and JP-A 2008-122932.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle or spray techniques. In this way, a desired resist pattern is formed on the substrate.

With respect to the second resist pattern, the second resist composition is coated, exposed and developed in a standard way. In one preferred embodiment, the second resist pattern is formed in an area where features of the first resist pattern have not been formed, thereby reducing the distance between pattern features to one half. The conditions of exposure and development and the thickness of the second resist film may be the same as described above.

Next, using the inactivated first resist film and the second resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the first and second resist films are removed. Removal of these films may be carried out after etching of the intermediate intervening layer of hard mask or the like. It is noted that removal of the first resist film may be achieved by dry etching with oxygen or radicals, and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. For all polymers, Mw and Mn are determined by GPC versus polystyrene standards.

Synthesis Examples

Polymers to be added to resist compositions were prepared by combining various monomers, effecting copolymerization reaction in tetrahydrofuran medium, crystallization in methanol, repeatedly washing with hexane, isolation, and drying. The resulting polymers (Polymers 1-1 to 1-11, 2-1 to 2-18, Comparative Polymer 1) had the composition shown below. The composition of each polymer was analyzed by $^1$H-NMR, and the Mw and Mw/Mn determined by GPC.

Polymer 1-1

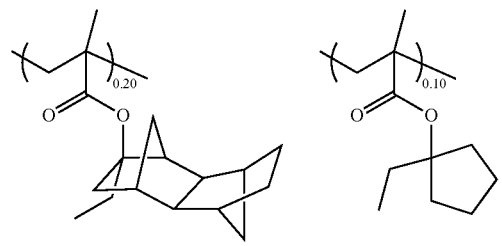

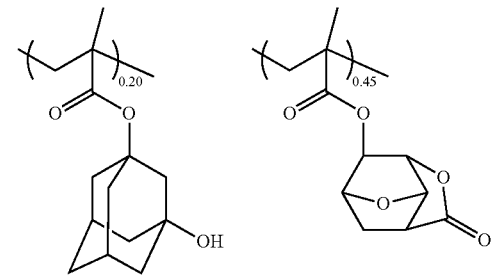

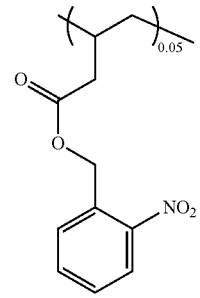

Mw = 8,300
Mw/Mn = 1.76

Polymer 1-2
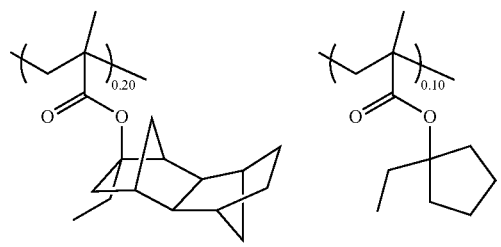
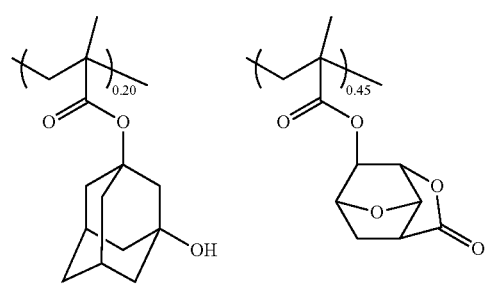
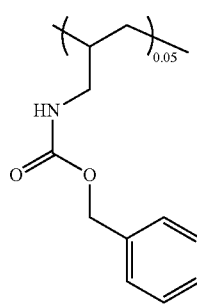
Mw = 8,800
Mw/Mn = 1.77
Polymer 1-3
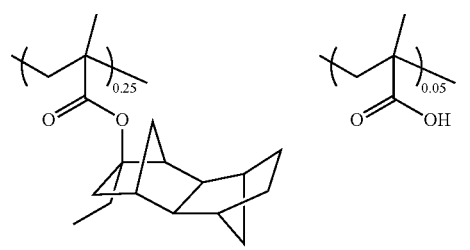
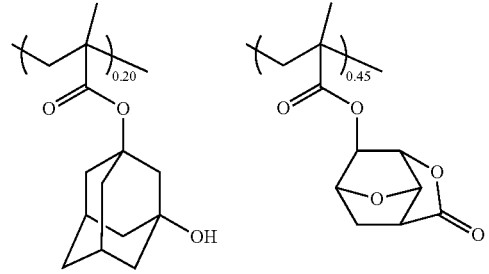
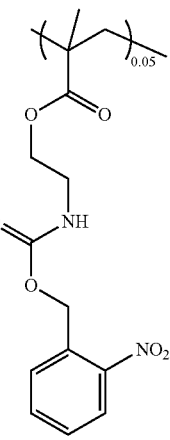
Mw = 7,600
Mw/Mn = 1.79
Polymer 1-4
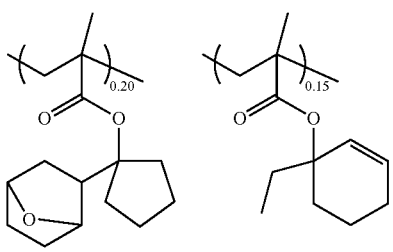
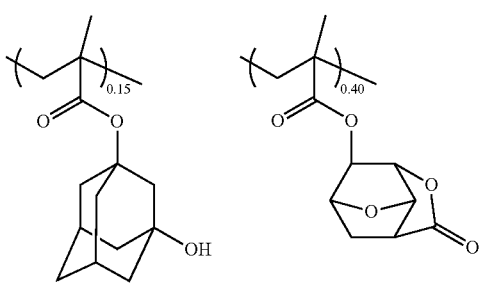
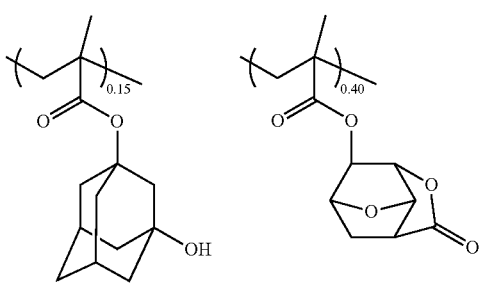
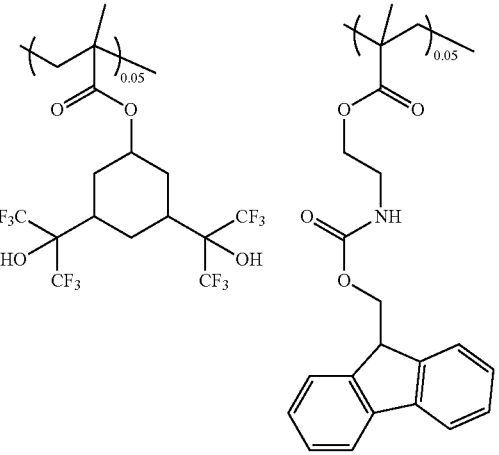
Mw = 8,600
Mw/Mn = 1.93

Polymer 1-5
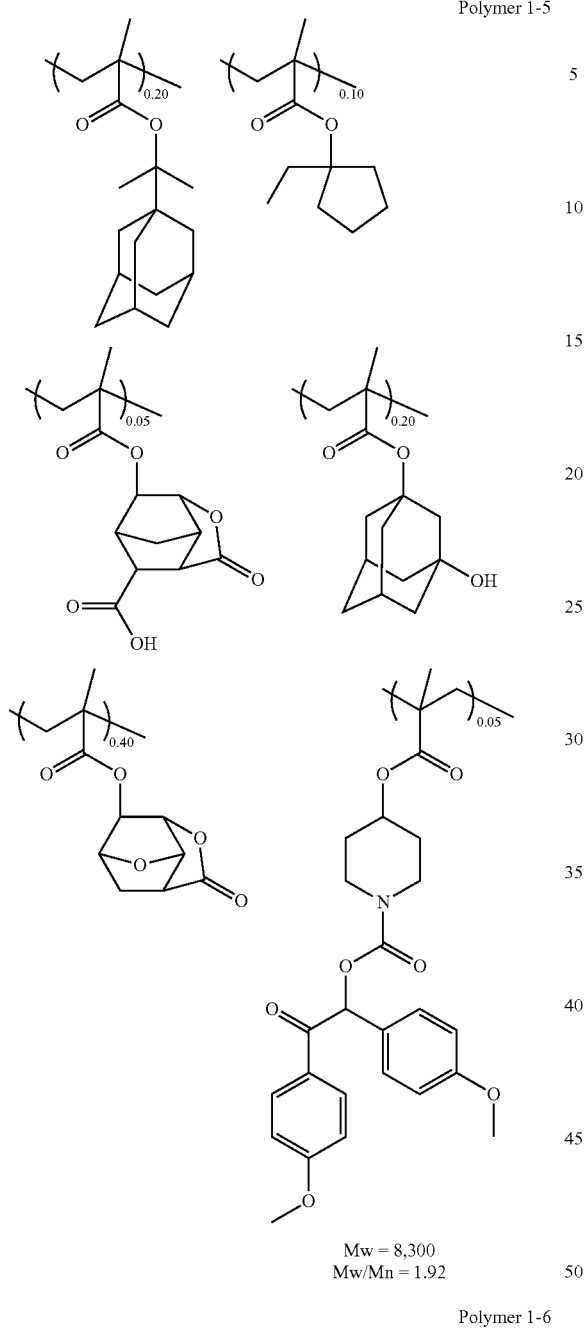
Mw = 8,300
Mw/Mn = 1.92
Polymer 1-6
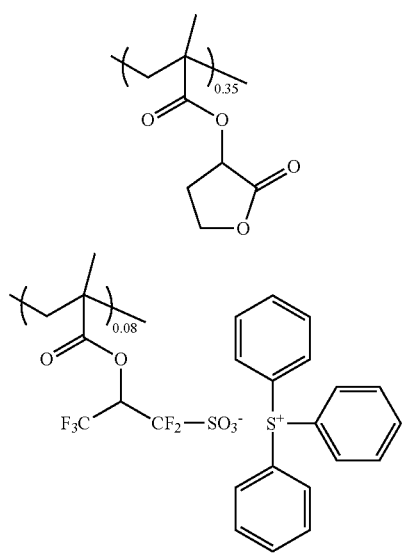
Mw = 8,900
Mw/Mn = 1.83
Polymer 1-7
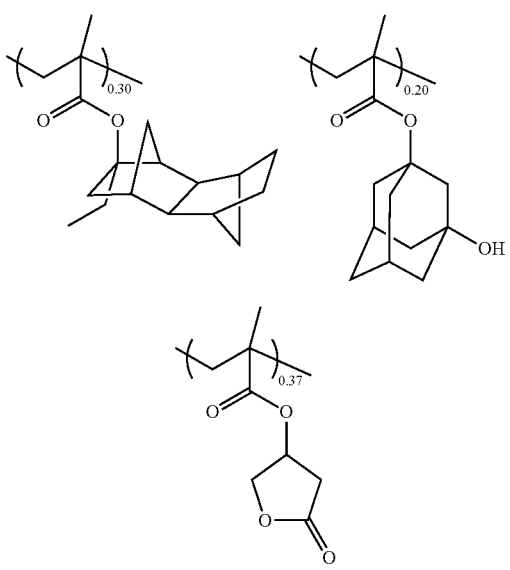

-continued
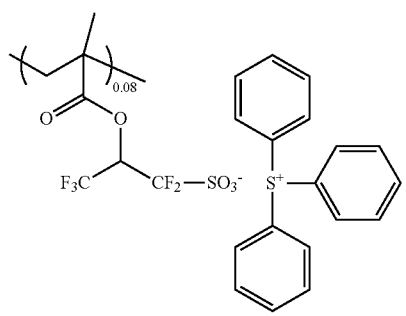
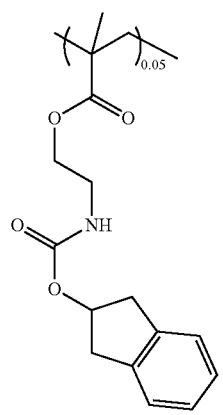
Mw = 8,200
Mw/Mn = 1.76
Polymer 1-8
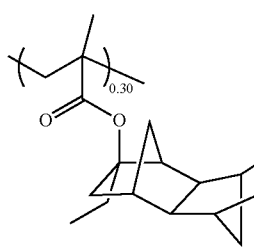
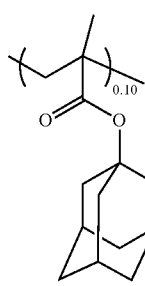
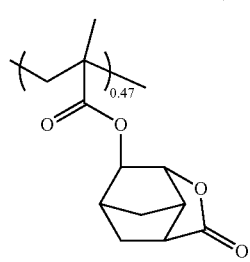
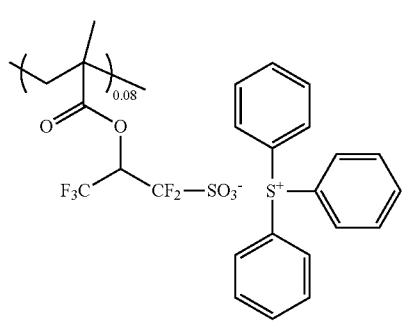
-continued
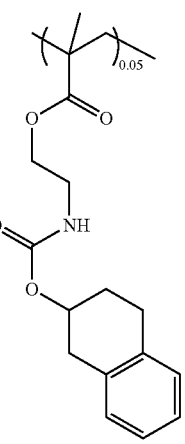
Mw = 8,400
Mw/Mn = 1.88
Polymer 1-9
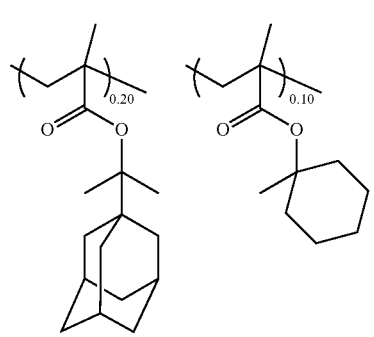
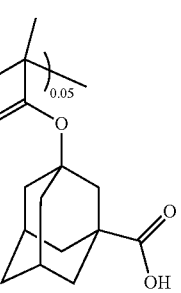
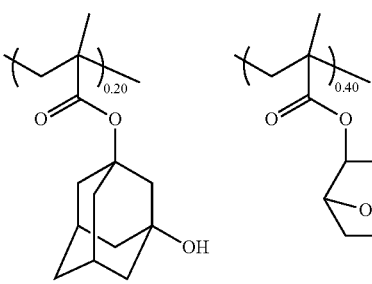

-continued
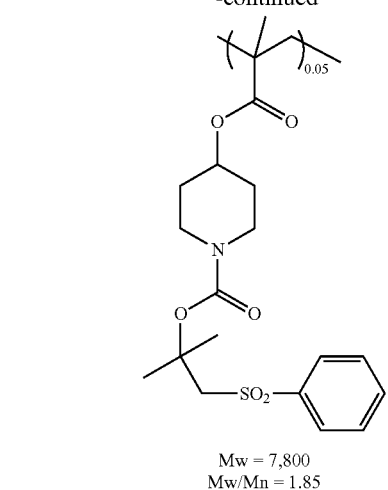
Mw = 7,800
Mw/Mn = 1.85
Polymer 1-10
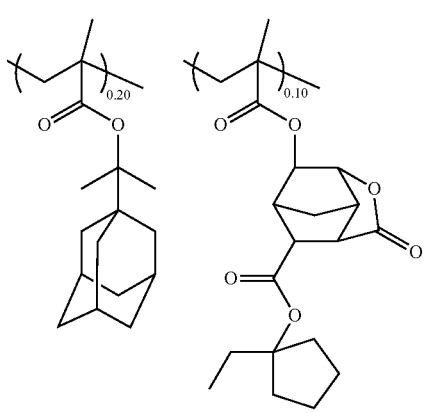
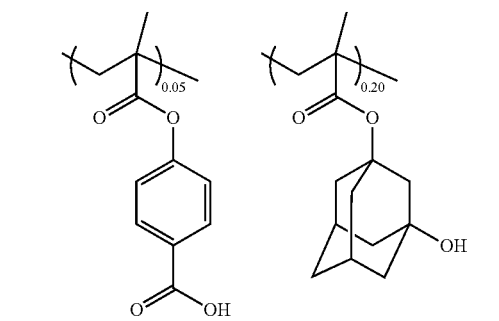
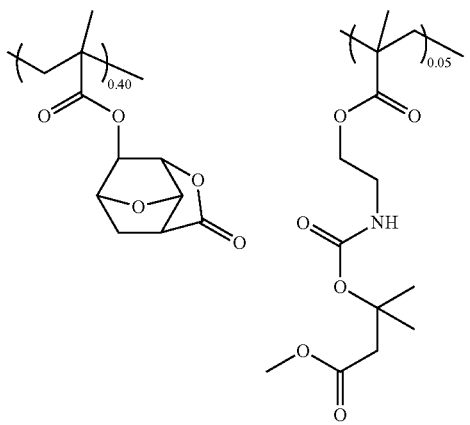
Mw = 7,300
Mw/Mn = 1.81
-continued
Polymer 1-11
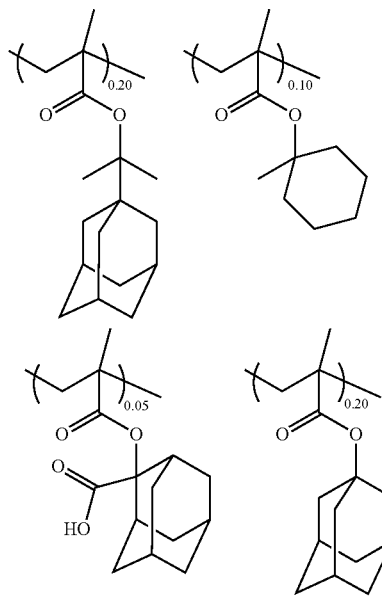
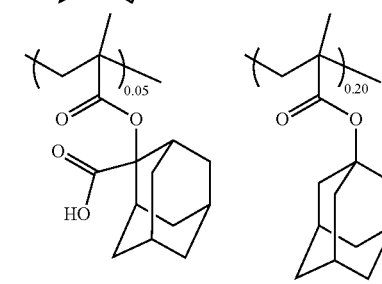
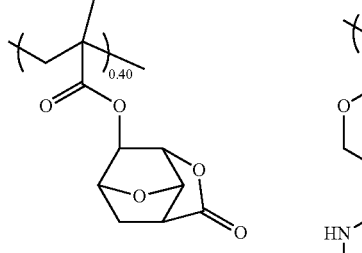
Mw = 8,300
Mw/Mn = 1.79
Polymer 2-1
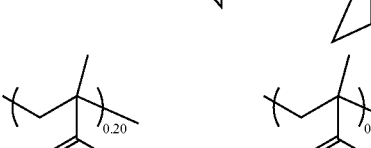
Mw = 8,100
Mw/Mn = 1.83

Polymer 2-2
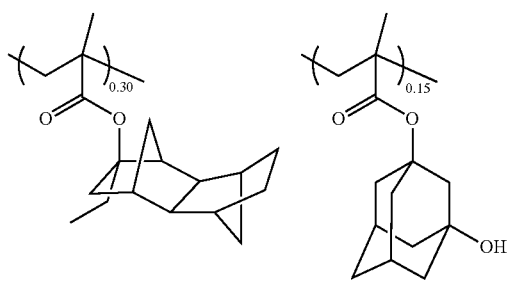
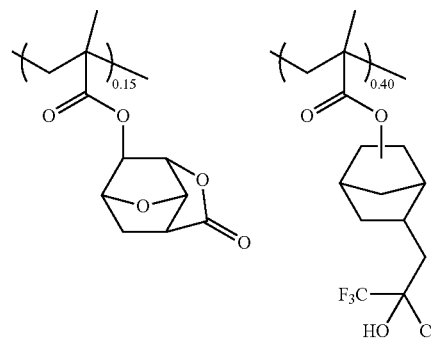
Mw = 8,300
Mw/Mn = 1.89
Polymer 2-3
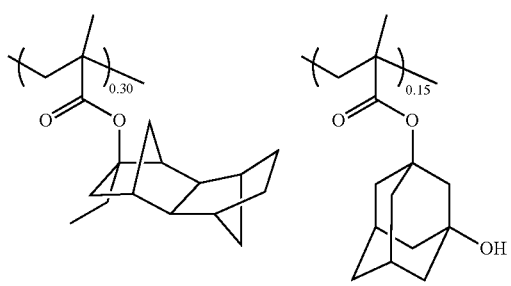
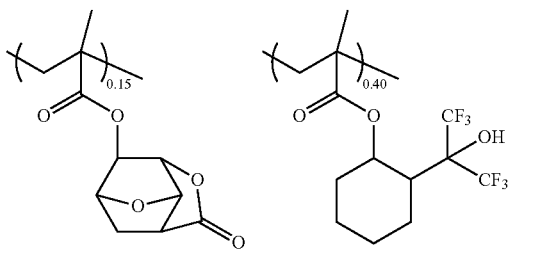
Mw = 8,600
Mw/Mn = 1.82
Polymer 2-4
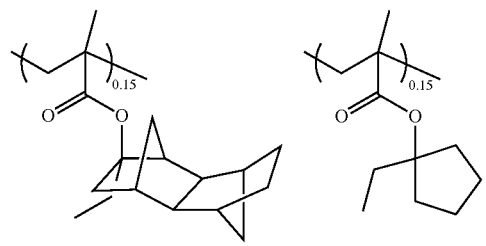
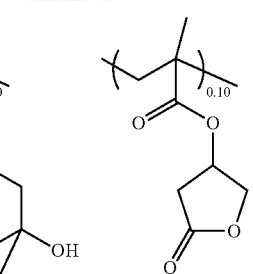
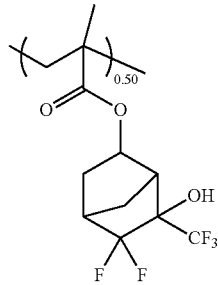
Mw = 8,600
Mw/Mn = 1.82
Polymer 2-5
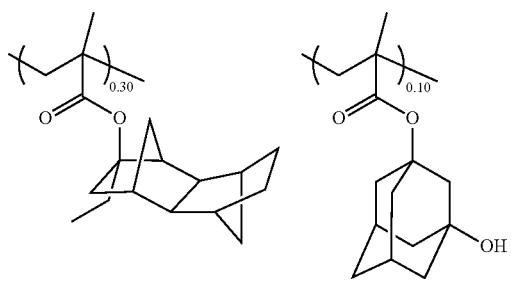
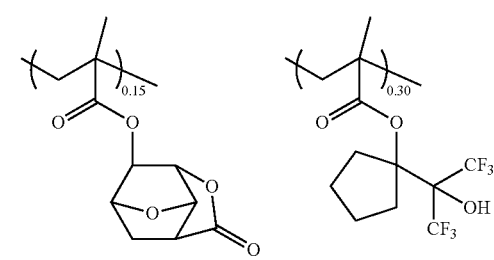
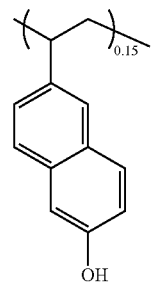
Mw = 8,100
Mw/Mn = 1.83

Polymer 2-6
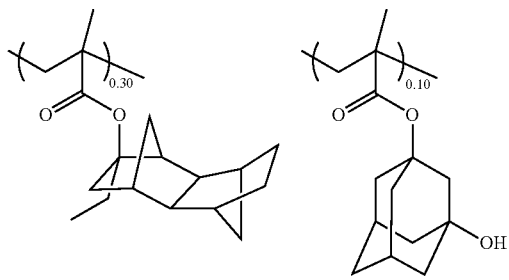
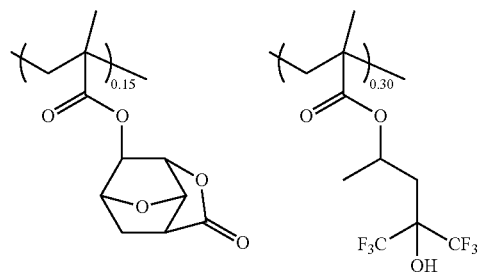
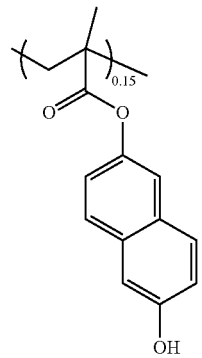
Mw = 8,300
Mw/Mn = 1.94
Polymer 2-7
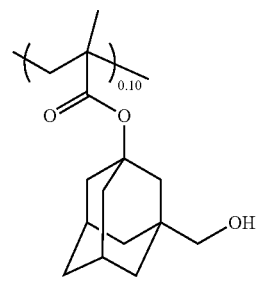
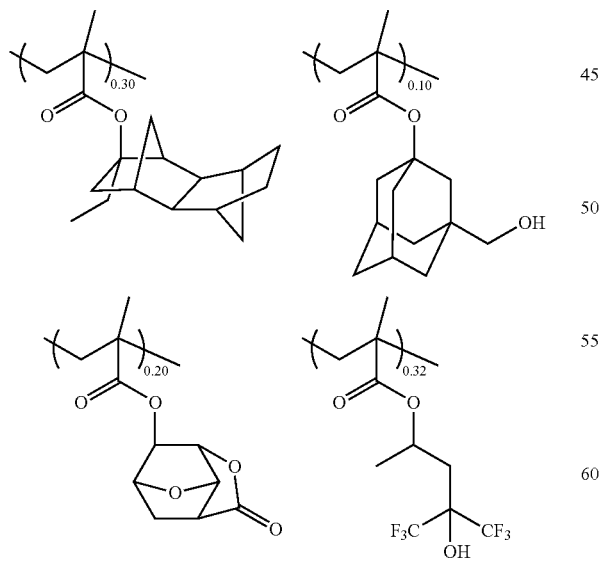
Polymer 2-8
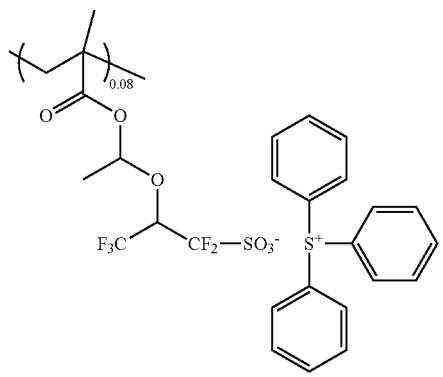
Mw = 8,100
Mw/Mn = 1.90
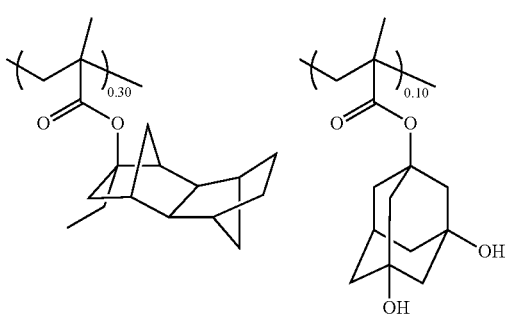
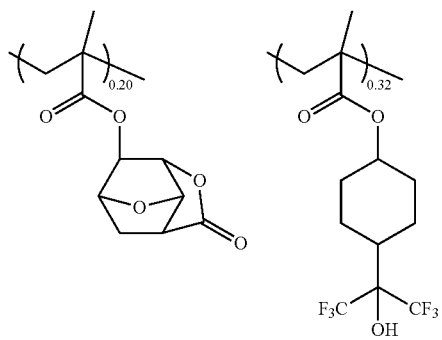
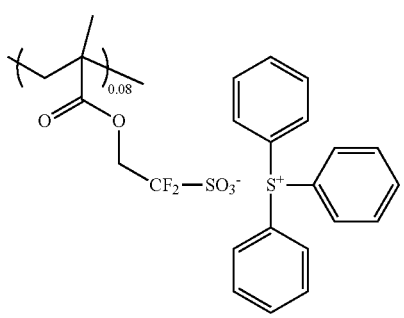
Mw = 8,000
Mw/Mn = 1.83

Polymer 2-9
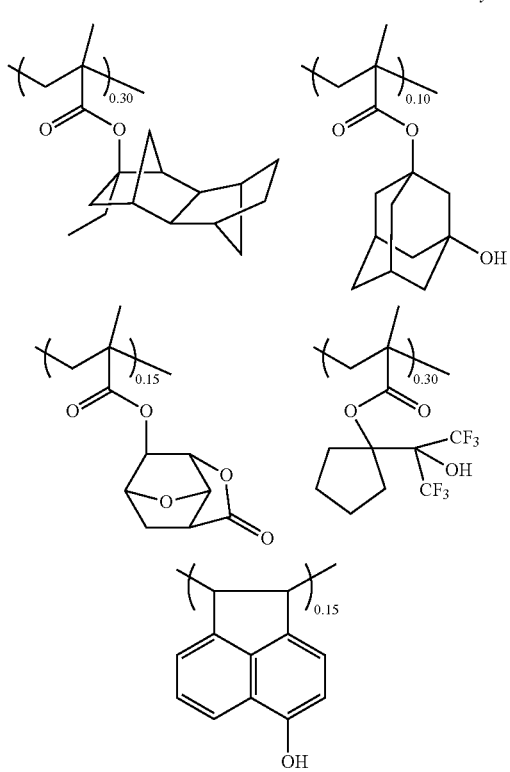
Mw = 7,100
Mw/Mn = 1.88
Polymer 2-10
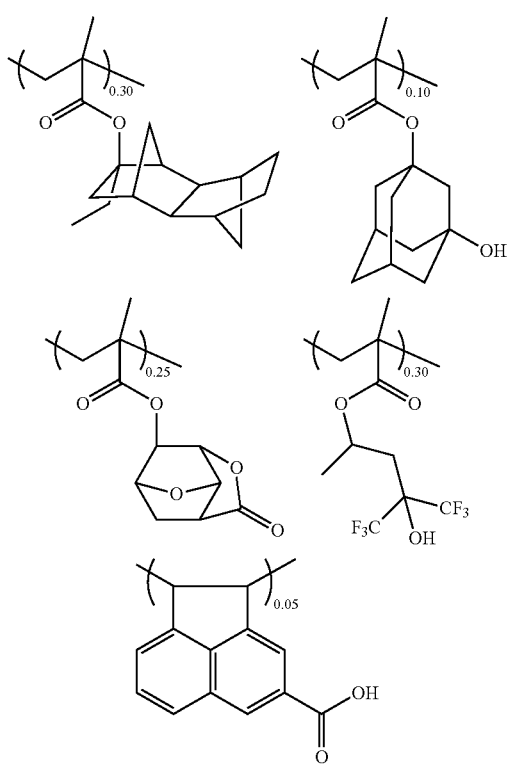
Mw = 7,600
Mw/Mn = 1.81
Polymer 2-11
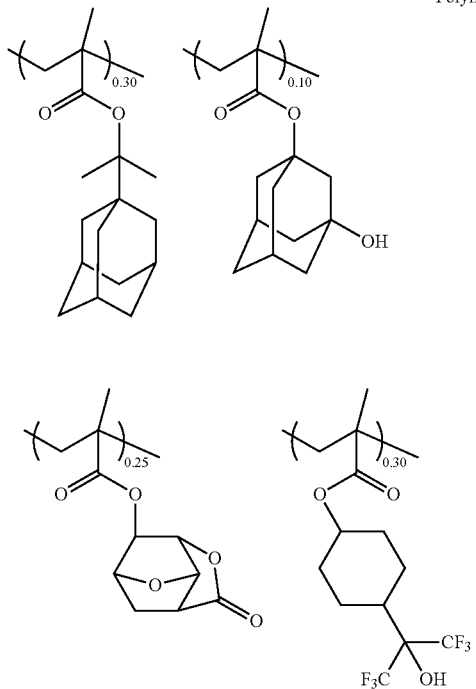
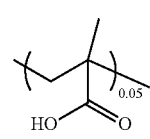
Mw = 9,100
Mw/Mn = 1.92
Polymer 2-12
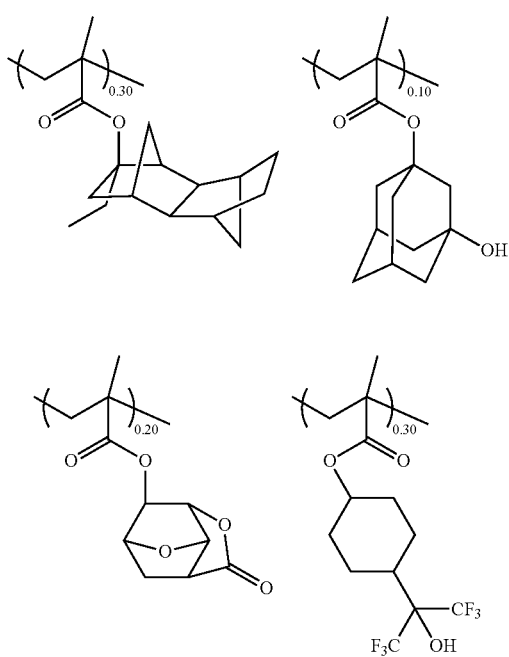

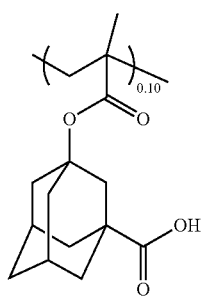
Mw = 8,200
Mw/Mn = 1.95
Polymer 2-13
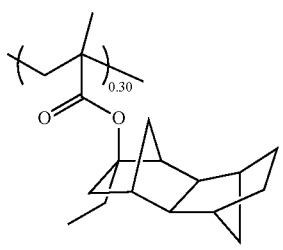
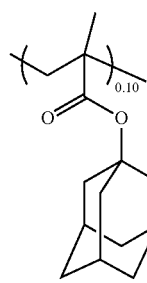
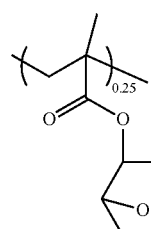
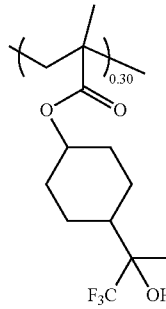
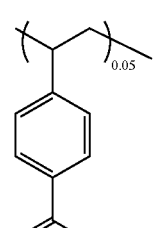
Mw = 8,600
Mw/Mn = 1.99
Polymer 2-14
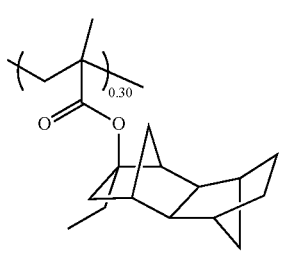
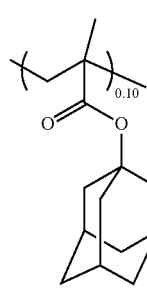
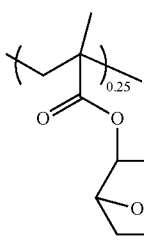
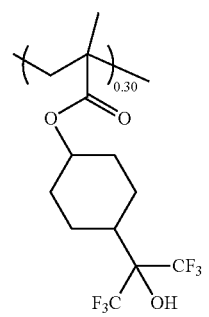
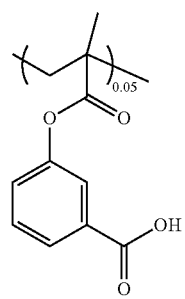
Mw = 8,300
Mw/Mn = 1.82
Polymer 2-15
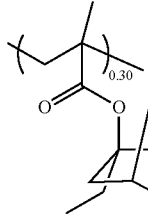
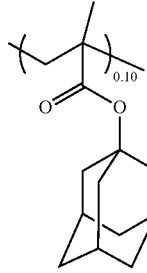
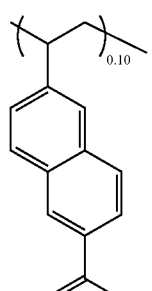
Mw = 7,600
Mw/Mn = 1.92

-continued

Polymer 2-16

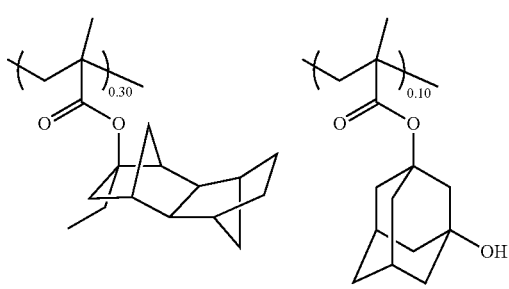
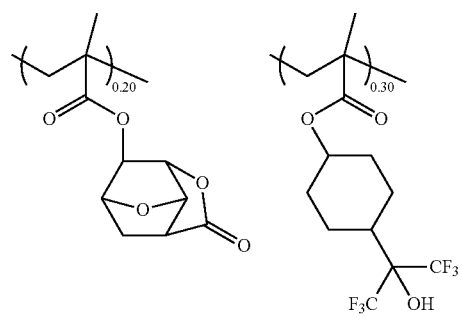
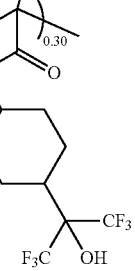
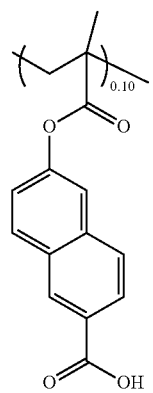

Mw = 7,900
Mw/Mn = 1.77

Polymer 2-17

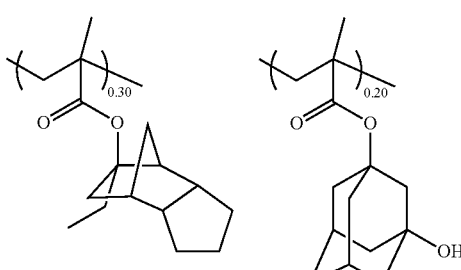
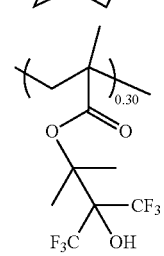

Mw = 7,300
Mw/Mn = 1.71

-continued

Polymer 2-18

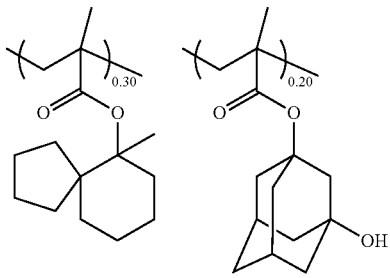
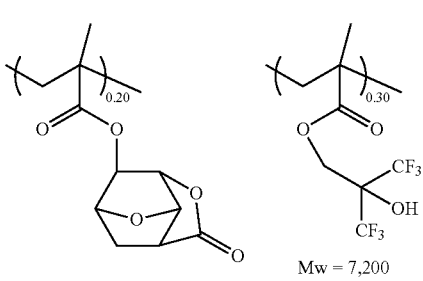

Mw = 7,200
Mw/Mn = 1.74

Comparative Polymer 1

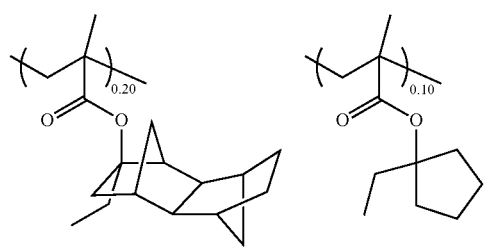
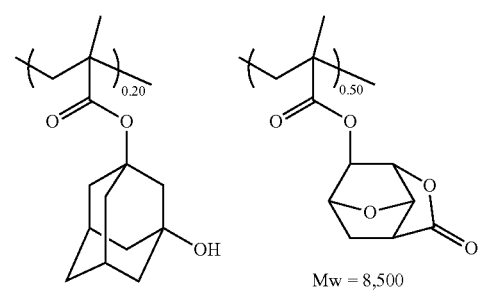

Mw = 8,500
Mw/Mn = 1.73

Preparation of First Resist Composition

A resist solution was prepared by dissolving each polymer (Polymers 1-1 to 1-11, 2-1, Comparative Polymer 1), an acid generator (PAG1), a base generator (BG1 to 4), a basic compound (amine quencher), and a repellent (for rendering the resist film surface water repellent) in a solvent in accordance with the recipe shown in Table 1, and filtering through a Teflon® filter with a pore size of 0.2 μm. The solvent contained 50 ppm of surfactant FC-4430 (3M-Sumitomo Co., Ltd.). Note that in Comparative Resist 1-3, Polymer 1-3 could not be dissolved in the solvent.

The components in Table 1 are identified below.
Photoacid Generator: PAG1

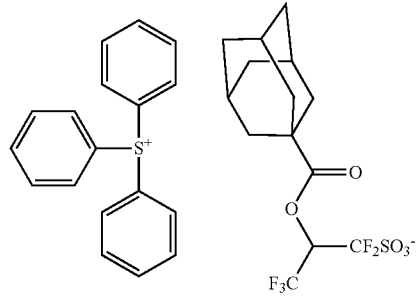

Basic Compound (Amine Quencher): Quencher 1

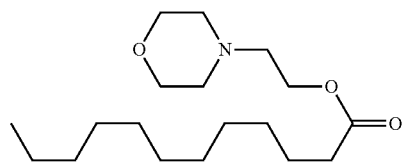

Base Generator: BG1 to BG4

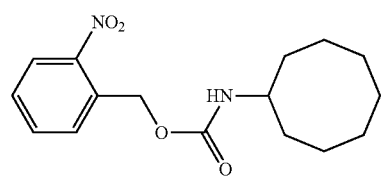

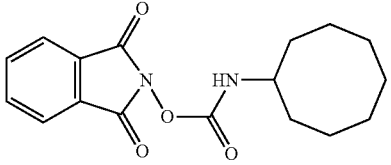

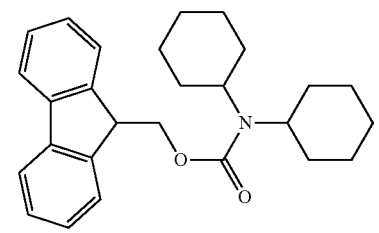

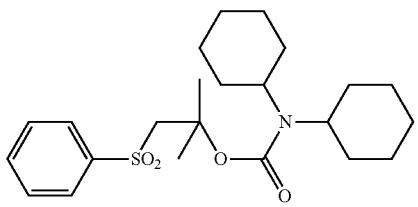

Repellent: Repellent Polymers 1 and 2

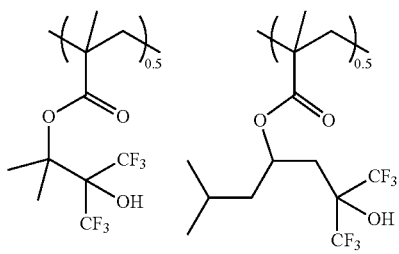

Repellent Polymer 1
Mw = 8,900
Mw/Mn = 1.96

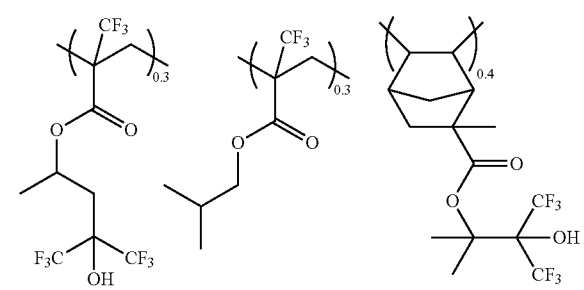

Repellent Polymer 2
Mw = 8,300
Mw/Mn = 1.53

Organic Solvent:
  propylene glycol monomethyl ether acetate (PGMEA)
  cyclohexanone (CyH)
  propylene glycol monomethyl ether (PGME)

TABLE 1

| | | Polymer (pbw) | Base generator (pbw) | Acid generator (pbw) | Basic compound (pbw) | Repellent (pbw) | Organic solvent (pbw) |
|---|---|---|---|---|---|---|---|
| Resist | 1-1 | Polymer 1-1 (100) | — | PAG1 (14.0) | Quencher 1 (1.60) | Repellent Polymer 1 (4.0) | PGMEA (1,500) CyH (500) |

TABLE 1-continued

| | | Polymer (pbw) | Base generator (pbw) | Acid generator (pbw) | Basic compound (pbw) | Repellent (pbw) | Organic solvent (pbw) |
|---|---|---|---|---|---|---|---|
| | 1-2 | Polymer 1-2 (100) | — | PAG1 (14.0) | Quencher 1 (1.60) | Repellent Polymer 1 (4.0) | PGMEA (1,500) CyH (500) |
| | 1-3 | Polymer 1-3 (100) | — | PAG1 (14.0) | Quencher 1 (1.60) | Repellent Polymer 1 (4.0) | PGMEA (1,500) CyH (500) |
| | 1-4 | Polymer 1-4 (100) | BG1 (2.0) | PAG1 (14.0) | Quencher 1 (1.60) | Repellent Polymer 1 (4.0) | PGMEA (1,500) CyH (500) |
| | 1-5 | Polymer 1-5 (100) | — | PAG1 (14.0) | Quencher 1 (1.60) | Repellent Polymer 1 (4.0) | PGMEA (1,500) CyH (500) |
| | 1-6 | Polymer 1-6 (100) | BG1 (2.0) | — | Quencher 1 (1.60) | Repellent Polymer 1 (4.0) | PGMEA (1,800) PGME (200) |
| | 1-7 | Polymer 1-7 (100) | BG1 (2.0) | — | Quencher 1 (1.60) | Repellent Polymer 1 (4.0) | PGMEA (1,500) CyH (500) |
| | 1-8 | Polymer 1-8 (100) | BG1 (2.0) | — | Quencher 1 (1.60) | Repellent Polymer 1 (4.0) | PGMEA (1,500) CyH (500) |
| | 1-9 | Polymer 1-9 (100) | BG1 (2.0) | PAG1 (14.0) | Quencher 1 (1.60) | Repellent Polymer 1 (4.0) | PGMEA (1,500) CyH (500) |
| | 1-10 | Polymer 1-10 (100) | BG1 (2.0) | PAG1 (14.0) | Quencher 1 (1.60) | Repellent Polymer 1 (4.0) | PGMEA (1,500) CyH (500) |
| | 1-11 | Polymer 1-11 (70) Comparative Polymer 1 (30) | BG2 (1.2) | PAG1 (14.0) | Quencher 1 (1.60) | Repellent Polymer 1 (4.0) | PGMEA (1,500) CyH (500) |
| | 1-12 | Polymer 1-3 (100) | BG3 (2.0) | PAG1 (14.0) | Quencher 1 (1.60) | Repellent Polymer 1 (4.0) | PGMEA (1,500) CyH (500) |
| | 1-13 | Polymer 1-3 (100) | BG4 (2.0) | PAG1 (14.0) | Quencher 1 (1.60) | Repellent Polymer 1 (4.0) | PGMEA (1,500) CyH (500) |
| Comparative Resist | 1-1 | Comparative Polymer 1 (100) | — | PAG1 (14.0) | Quencher 1 (1.60) | Repellent Polymer 1 (4.0) | PGMEA (1,500) CyH (500) |
| | 1-2 | Polymer 2-1 (100) | — | PAG1 (14.0) | Quencher1 (1.60) | Repellent Polymer 1 (4.0) | 2-methyl-1-butanol (2,100) |
| | 1-3 | Polymer 1-3 (100) | — | PAG1 (14.0) | Quencher1 (1.60) | Repellent Polymer 1 (4.0) | 2-methyl-1-butanol (2,100) |

Preparation of Second Resist Composition

A resist solution was prepared by dissolving each polymer (Polymers 2-1 to 2-18), an acid generator, a basic compound (amine quencher), and a repellent (for rendering the resist film surface water repellent) in a solvent in accordance with the recipe shown in Table 2, and filtering through a Teflon® filter with a pore size of 0.2 μm. The solvent contained 50 ppm of surfactant FC-4430 (3M-Sumitomo Co., Ltd.).

TABLE 2

| | | Polymer (pbw) | Acid generator (pbw) | Basic compound (pbw) | Repellent (pbw) | Organic solvent (pbw) |
|---|---|---|---|---|---|---|
| Resist | 2-1 | Polymer 2-1 (100) | PAG1 (14.0) | Quencher 1 (1.60) | Repellent Polymer 2 (4.0) | 4-methyl-2-pentanol (3,000) |
| | 2-2 | Polymer 2-2 (100) | PAG1 (14.0) | Quencher 1 (1.60) | Repellent Polymer 2 (4.0) | 3-methyl-1-butanol (3,000) |
| | 2-3 | Polymer 2-3 (100) | PAG1 (14.0) | Quencher 1 (1.60) | Repellent Polymer 2 (4.0) | 2-methyl-1-butanol (2,400) diisoamyl ether (600) |
| | 2-4 | Polymer 2-4 (100) | PAG1 (14.0) | Quencher 1 (1.60) | Repellent Polymer 2 (4.0) | isobutyl alcohol (1,200) 4-methyl-2-pentanol (1,800) |
| | 2-5 | Polymer 2-4 (100) | PAG1 (14.0) | Quencher 1 (1.60) | Repellent Polymer 2 (4.0) | 2-methyl-1-butanol (2,100) 1-heptanol (600) 2,6-dimethylanisole (300) |
| | 2-6 | Polymer 2-4 (100) | PAG1 (14.0) | Quencher 1 (1.60) | Repellent Polymer 2 (4.0) | 2-methyl-1-butanol (2,100) 1-heptanol (600) 2,6-dimethylanisole (300) |

TABLE 2-continued

| | Polymer (pbw) | Acid generator (pbw) | Basic compound (pbw) | Repellent (pbw) | Organic solvent (pbw) |
|---|---|---|---|---|---|
| 2-7 | Polymer 2-4 (100) | PAG1 (14.0) | Quencher 1 (1.60) | Repellent Polymer 2 (5.0) | 2-methyl-1-butanol (2,100) 2-pentanol (600) di-n-butyl ether (300) |
| 2-8 | Polymer 2-4 (100) | PAG1 (14.0) | Quencher 1 (1.60) | Repellent Polymer 2 (5.0) | 3-methyl-1-butanol (2,700) 4-allylanisole (300) |
| 2-9 | Polymer 2-4 (100) | PAG1 (14.0) | Quencher 1 (1.60) | Repellent Polymer 2 (4.0) | 2-methyl-1-butanol (2,100) 2-hexanol (600) 2-ethylanisole (300) |
| 2-10 | Polymer 2-5 (100) | PAG1 (14.0) | Quencher 1 (1.60) | Repellent Polymer 2 (4.0) | 1-heptanol (2,400) di-n-hexyl ether (600) |
| 2-11 | Polymer 2-6 (100) | PAG1 (14.0) | Quencher 1 (1.60) | Repellent Polymer 2 (4.0) | 2-methyl-1-butanol (2,700) n-butyl phenyl ether (300) |
| 2-12 | Polymer 2-7 (100) | — | Quencher 1 (1.60) | Repellent Polymer 2 (4.0) | 2-methyl-1-butanol (2,100) 2-heptanol (600) 4-methoxytoluene (300) |
| 2-13 | Polymer 2-8 (100) | — | Quencher 1 (1.60) | Repellent Polymer 2 (4.0) | 2-methyl-1-butanol (2,400) 4-ethylanisole (200) |
| 2-14 | Polymer 2-9 (100) | PAG1 (14.0) | Quencher 1 (1.60) | Repellent Polymer 2 (4.0) | 2-methyl-1-butanol (2,100) isobutyl alcohol (600) n-pentanol (300) |
| 2-15 | Polymer 2-10 (100) | PAG1 (14.0) | Quencher 1 (1.60) | Repellent Polymer 2 (4.0) | 2-methyl-1-butanol (2,400) 4-ethylanisole (600) |
| 2-16 | Polymer 2-11 (100) | PAG1 (14.0) | Quencher 1 (1.60) | Repellent Polymer 2 (4.0) | 2-methyl-1-butanol (2,700) 4-ethylphenetole (300) |
| 2-17 | Polymer 2-12 (100) | PAG1 (14.0) | Quencher 1 (1.60) | Repellent Polymer 2 (4.0) | 2-methyl-1-butanol (2,400) 3,5-dimethylanisole (600) |
| 2-18 | Polymer 2-13 (100) | PAG1 (14.0) | Quencher 1 (1.60) | Repellent Polymer 2 (4.0) | 2-methyl-1-butanol (2,400) 2,6-dimethylanisole (600) |
| 2-19 | Polymer 2-14 (100) | PAG1 (14.0) | Quencher 1 (1.60) | Repellent Polymer 2 (4.0) | 2-methyl-1-butanol (2,400) 2,4-dimethylanisole (600) |
| 2-20 | Polymer 2-15 (100) | PAG1 (14.0) | Quencher 1 (1.60) | Repellent Polymer 2 (4.0) | 2-methyl-1-butanol (3,000) |
| 2-21 | Polymer 2-16 (100) | PAG1 (14.0) | Quencher 1 (1.60) | Repellent Polymer 2 (4.0) | 2-methyl-1-butanol (3,000) |
| 2-22 | Polymer 2-17 (100) | PAG1 (14.0) | Quencher 1 (1.60) | Repellent Polymer 2 (4.0) | 2-methyl-1-butanol (3,000) |
| 2-23 | Polymer 2-18 (100) | PAG1 (14.0) | Quencher 1 (1.60) | Repellent Polymer 2 (4.0) | 2-methyl-1-butanol (3,000) |

EXAMPLES AND COMPARATIVE EXAMPLES

Slimming of First Resist Film by Solvent

Each of the first resist compositions shown in Table 1 was coated on a silicon wafer and baked at 100° C. for 60 seconds to form a resist film of 100 nm thick. A solvent (shown in Table 3) was statically dispensed on the resist film for 20 seconds, followed by spin drying and baking at 100° C. for 60 seconds for evaporating off the solvent. The thickness of the resist film was measured for determining a film thickness reduction (slimming) before and after solvent dispensing. The results are shown in Table 3.

TABLE 3

| | Solvent (weight ratio) | Slimming (nm) |
|---|---|---|
| Resist 1-1 | 4-methyl-2-pentanol | 1.5 |
| Resist 1-1 | 3-methyl-1-butanol | 1.6 |
| Resist 1-1 | 2-methyl-1-butanol:diisoamyl ether = 8:2 | 0.6 |
| Resist 1-1 | isobutyl alcohol:4-methyl-2-pentanol = 4:6 | 1.6 |
| Resist 1-1 | 3-methyl-1-butanol:4-allylanisole = 9:1 | 0.5 |
| Resist 1-1 | 1-heptanol:2,3,5-trimethylanisole = 9:1 | 0.6 |
| Resist 1-1 | 2-methyl-1-butanol:2-pentanol:di-n-butyl ether = 7:2:1 | 0.6 |
| Resist 1-1 | 2-methyl-1-butanol:2-heptanol:4-methoxytoluene = 7:2:1 | 0.6 |
| Resist 1-1 | 2-methyl-1-butanol:2-hexanol:2-ethylanisole = 7:2:1 | 0.9 |
| Resist 1-1 | 1-heptanol:di-n-hexyl ether = 8:2 | 0.8 |
| Resist 1-1 | 2-methyl-1-butanol:n-butyl phenyl ether = 9:1 | 0.6 |
| Resist 1-1 | 2-methyl-1-butanol:isobutyl alcohol:n-pentanol = 7:2:1 | 1.4 |
| Resist 1-1 | 2-methyl-1-butanol:4-ethylanisole = 8:2 | 1.0 |
| Resist 1-1 | 2-methyl-1-butanol:4-ethylphenetole = 9:1 | 0.6 |
| Resist 1-1 | 2-methyl-1-butanol:3,5-dimethylanisole = 8:2 | 0.6 |
| Resist 1-1 | 2-methyl-1-butanol:2,6-dimethylanisole = 8:2 | 0.5 |
| Resist 1-1 | 2-methyl-1-butanol:2,4-dimethylanisole = 8:2 | 0.4 |
| Resist 1-1 | PGMEA | 100 |
| Resist 1-1 | CyH | 100 |
| Resist 1-1 | 2-methyl-1-butanol | 1.5 |
| Resist 1-2 | 2-methyl-1-butanol | 1.6 |
| Resist 1-3 | 2-methyl-1-butanol | 2.1 |
| Resist 1-4 | 2-methyl-1-butanol | 2.5 |
| Resist 1-5 | 2-methyl-1-butanol | 2.1 |
| Resist 1-6 | 2-methyl-1-butanol | 2.0 |
| Resist 1-7 | 2-methyl-1-butanol | 2.0 |
| Resist 1-8 | 2-methyl-1-butanol | 1.8 |
| Resist 1-8 | 2-methyl-1-butanol | 1.6 |
| Resist 1-10 | 2-methyl-1-butanol | 1.5 |
| Resist 1-11 | 2-methyl-1-butanol | 1.3 |
| Resist 1-12 | 2-methyl-1-butanol | 1.9 |
| Resist 1-13 | 2-methyl-1-butanol | 1.9 |
| Comparative Resist 1-1 | 2-methyl-1-butanol | 1.8 |
| Comparative Resist 1-2 | 2-methyl-1-butanol | 100 |

It was demonstrated that Resists 1-1 to 1-13 were insoluble in the alcohol solvents and alcohol/ether mixed solvents.

Double Patterning Test I

On a substrate (silicon wafer) having an antireflective coating (ARC-29A, Nissan Chemical Industries Ltd.) of 80 nm thick, each of the first resist compositions shown in Table 1 was spin coated, then baked on a hot plate at 100° C. for 60 seconds to form a resist film of 100 nm thick. Using an ArF excimer laser scanner model NSR-S610C (Nikon Corp., NA 1.30, σ 0.98/0.78, 35° cross-pole illumination, 6% halftone phase shift mask) with azimuthally polarized illumination, the coated substrate was exposed to a Y-direction 40-nm line/160-nm pitch pattern. After exposure, the resist film was baked (PEB) at 100° C. for 60 seconds in Examples 1-1 to 1-35 and Comparative Examples 1-1 and 1-2 or at 80° C. for 60 seconds in Comparative Examples 1-3 and 1-4 and then developed for 30 seconds with a 2.38 wt % TMAH aqueous solution, obtaining a first line-and-space pattern having a line-to-space ratio of 1:3 and a line size of 40 nm.

Then the first resist pattern-bearing substrate was baked for 60 seconds at the temperature shown in Tables 4 and 5, causing the base generator moiety to generate an amine compound.

Figure 7:
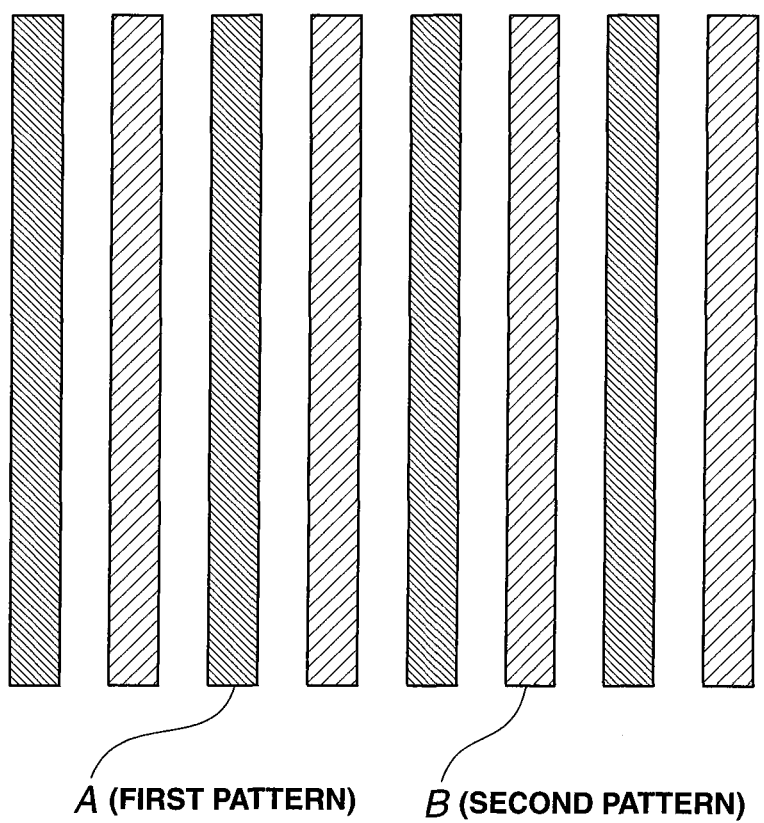
FIG. 7 is a plan view of a resist pattern evaluated by double patterning test I.

Next, each of the second resist compositions shown in Table 2 was coated onto the first resist pattern-bearing substrate and baked at 100° C. for 60 seconds to form a resist film of 80 nm thick on the flat substrate. Using an ArF excimer laser scanner model NSR-S610C (Nikon Corp., NA 1.30, σ 0.98/0.78, 35° cross-pole illumination, 6% halftone phase shift mask) with azimuthally polarized illumination, the coated substrate was exposed to a Y-direction 40-nm line/160-nm pitch pattern which was shifted 80 nm from the first pattern in X-direction. After exposure, the second resist film was baked (PEB) at 80° C. for 60 seconds in all Examples, but at 100° C. for 60 seconds in Comparative Example 1-2 and then developed for 30 seconds with a 2.38 wt % TMAH aqueous solution, obtaining a second line-and-space pattern having a line size of 40 nm. There were formed parallel extending first pattern lines A and second pattern lines B as illustrated in FIG. 7. The line width of the first and second patterns was measured by a measuring SEM (S-9380, Hitachi, Ltd.). The results are also shown in Tables 4 and 5.

TABLE 4

|  |  | 1st resist composition | Baking temp. (° C.) | 2nd resist composition | Size of 1st pattern as developed | Size of 1st pattern after formation of 2nd pattern | Size of 2nd pattern |
|---|---|---|---|---|---|---|---|
| Example | 1-1 | Resist 1-1 | 140 | Resist 2-1 | 41 nm | 38 nm | 40 nm |
|  | 1-2 | Resist 1-2 | 140 | Resist 2-1 | 40 nm | 40 nm | 41 nm |
|  | 1-3 | Resist 1-3 | 140 | Resist 2-1 | 40 nm | 37 nm | 41 nm |
|  | 1-4 | Resist 1-4 | 140 | Resist 2-1 | 40 nm | 36 nm | 41 nm |
|  | 1-5 | Resist 1-5 | 130 | Resist 2-1 | 40 nm | 36 nm | 41 nm |
|  | 1-6 | Resist 1-6 | 150 | Resist 2-1 | 40 nm | 40 nm | 41 nm |
|  | 1-7 | Resist 1-7 | 150 | Resist 2-1 | 40 nm | 40 nm | 41 nm |
|  | 1-8 | Resist 1-8 | 150 | Resist 2-1 | 42 nm | 40 nm | 42 nm |
|  | 1-9 | Resist 1-9 | 150 | Resist 2-1 | 40 nm | 40 nm | 41 nm |
|  | 1-10 | Resist 1-10 | 150 | Resist 2-1 | 41 nm | 40 nm | 41 nm |
|  | 1-11 | Resist 1-11 | 150 | Resist 2-1 | 41 nm | 40 nm | 42 nm |
|  | 1-12 | Resist 1-3 | 140 | Resist 2-2 | 41 nm | 39 nm | 41 nm |
|  | 1-13 | Resist 1-3 | 140 | Resist 2-3 | 40 nm | 40 nm | 41 nm |
|  | 1-14 | Resist 1-3 | 140 | Resist 2-4 | 40 nm | 40 nm | 41 nm |
|  | 1-15 | Resist 1-3 | 120 | Resist 2-5 | 40 nm | 40 nm | 41 nm |
|  | 1-16 | Resist 1-3 | 140 | Resist 2-6 | 40 nm | 42 nm | 41 nm |
|  | 1-17 | Resist 1-3 | 140 | Resist 2-7 | 40 nm | 42 nm | 40 nm |
|  | 1-18 | Resist 1-3 | 140 | Resist 2-8 | 40 nm | 42 nm | 40 nm |
|  | 1-19 | Resist 1-3 | 140 | Resist 2-9 | 40 nm | 42 nm | 40 nm |
|  | 1-20 | Resist 1-3 | 140 | Resist 2-10 | 40 nm | 43 nm | 41 nm |
|  | 1-21 | Resist 1-3 | 150 | Resist 2-11 | 40 nm | 40 nm | 41 nm |
|  | 1-22 | Resist 1-3 | 140 | Resist 2-12 | 40 nm | 40 nm | 41 nm |
|  | 1-23 | Resist 1-3 | 160 | Resist 2-13 | 40 nm | 40 nm | 41 nm |
|  | 1-24 | Resist 1-3 | 140 | Resist 2-14 | 40 nm | 40 nm | 41 nm |
|  | 1-25 | Resist 1-3 | 130 | Resist 2-15 | 40 nm | 40 nm | 41 nm |
|  | 1-26 | Resist 1-3 | 140 | Resist 2-16 | 40 nm | 39 nm | 41 nm |
|  | 1-27 | Resist 1-3 | 130 | Resist 2-17 | 40 nm | 38 nm | 41 nm |
|  | 1-28 | Resist 1-3 | 130 | Resist 2-18 | 40 nm | 39 nm | 41 nm |
|  | 1-29 | Resist 1-3 | 140 | Resist 2-19 | 40 nm | 40 nm | 41 nm |
|  | 1-30 | Resist 1-3 | 130 | Resist 2-20 | 40 nm | 39 nm | 41 nm |
|  | 1-31 | Resist 1-3 | 140 | Resist 2-21 | 41 nm | 38 nm | 42 nm |
|  | 1-32 | Resist 1-12 | 140 | Resist 2-1 | 41 nm | 40 nm | 40 nm |
|  | 1-33 | Resist 1-13 | 140 | Resist 2-1 | 40 nm | 40 nm | 41 nm |
|  | 1-34 | Resist 1-12 | 140 | Resist 2-22 | 41 nm | 40 nm | 40 nm |
|  | 1-35 | Resist 1-12 | 140 | Resist 2-23 | 41 nm | 40 nm | 40 nm |

TABLE 5

|  |  | 1st resist composition | Baking temp. (° C.) | 2nd resist composition | Size of 1st pattern as developed | Size of 1st pattern after formation of 2nd pattern | Size of 2nd pattern |
|---|---|---|---|---|---|---|---|
| Comparative Example | 1-1 | Resist 1-3 | — | Resist 2-1 | 40 nm | 27 nm | 41 nm |
|  | 1-2 | Resist 1-3 | 140 | Resist 1-3 | 40 nm | pattern vanished | 41 nm |
|  | 1-3 | Comparative Resist 1-1 | 140 | Resist 2-1 | 40 nm | 23 nm | 41 nm |
|  | 1-4 | Comparative Resist 1-2 | 140 | Resist 2-1 | 40 nm | pattern vanished | 40 nm |

Double Patterning Test II

On a substrate (silicon wafer) having an antireflective coating (ARC-29A) of 80 nm thick, each of the first resist compositions shown in Table 1 was spin coated, then baked on a hot plate at 100° C. for 60 seconds to form a resist film of 100 nm thick. Using an ArF excimer laser scanner model NSR-S610C (Nikon Corp., NA 1.30, σ 0.98/0.78, 20° dipole illumination, 6% halftone phase shift mask) with s-polarized illumination, the coated substrate was exposed to a X-direction 40-nm line/80 nm pitch line-and-space pattern. After exposure, the resist film was baked (PEB) at 100° C. for 60 seconds in Examples 2-1 to 2-35 and Comparative Examples 2-1 and 2-2 or at 80° C. for 60 seconds in Comparative Examples 2-3 and 2-4 and then developed for 30 seconds with a 2.38 wt % TMAH aqueous solution, obtaining a first line-and-space pattern having a line size of 40 nm.

Then the first resist pattern-bearing substrate was baked for 60 seconds at the temperature shown in Tables 6 and 7, causing the base generator moiety to generate an amine compound.

Figure 8:
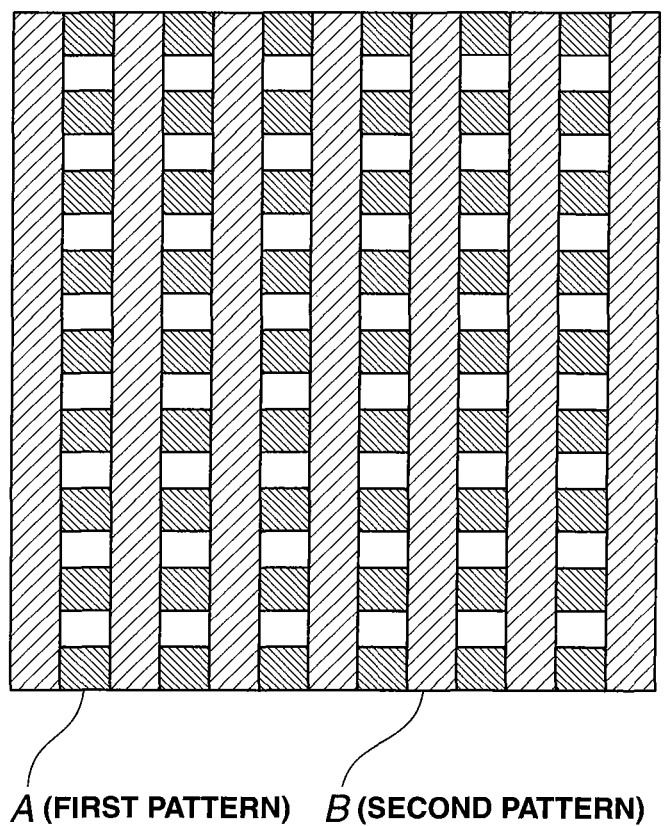
FIG. 8 is a plan view of a resist pattern evaluated by double patterning test II.

Next, each of the second resist compositions shown in Table 2 was coated onto the first resist pattern-bearing substrate and baked at 100° C. for 60 seconds to form a resist film of 60 nm thick on the flat substrate. Using an ArF excimer laser scanner model NSR-S610C (Nikon Corp., NA 1.30, σ 0.98/0.78, 20° dipole illumination, 6% halftone phase shift mask) with s-polarized illumination, the coated substrate was exposed to a Y-direction 40-nm line/80 nm pitch line-and-space pattern. After exposure, the second resist film was baked (PEB) at 80° C. for 60 seconds in all Examples, but at 100° C. for 60 seconds in Comparative Example 2-2 and then developed for 30 seconds with a 2.38 wt % TMAH aqueous solution, obtaining a second line-and-space pattern having a line size of 40 nm. There were formed orthogonally crossing first pattern lines A and second pattern lines B as illustrated in FIG. 8. The line width of the first and second patterns was measured by a measuring SEM (S-9380, Hitachi, Ltd.). The results are shown in Tables 6 and 7.

TABLE 6

|  |  | 1st resist composition | Baking temp. (° C.) | 2nd resist composition | Size of 1st pattern as developed | Size of 1st pattern after formation of 2nd pattern | Size of 2nd pattern |
|---|---|---|---|---|---|---|---|
| Example | 2-1 | Resist 1-1 | 140 | Resist 2-1 | 41 nm | 37 nm | 40 nm |
|  | 2-2 | Resist 1-2 | 140 | Resist 2-1 | 40 nm | 39 nm | 41 nm |
|  | 2-3 | Resist 1-3 | 140 | Resist 2-1 | 40 nm | 37 nm | 41 nm |
|  | 2-4 | Resist 1-4 | 140 | Resist 2-1 | 41 nm | 37 nm | 41 nm |
|  | 2-5 | Resist 1-5 | 130 | Resist 2-1 | 42 nm | 36 nm | 41 nm |
|  | 2-6 | Resist 1-6 | 150 | Resist 2-1 | 43 nm | 40 nm | 41 nm |
|  | 2-7 | Resist 1-7 | 130 | Resist 2-1 | 42 nm | 36 nm | 41 nm |
|  | 2-8 | Resist 1-8 | 150 | Resist 2-1 | 43 nm | 40 nm | 41 nm |
|  | 2-9 | Resist 1-6 | 150 | Resist 2-1 | 41 nm | 40 nm | 41 nm |
|  | 2-10 | Resist 1-7 | 130 | Resist 2-1 | 42 nm | 40 nm | 41 nm |
|  | 2-11 | Resist 1-8 | 150 | Resist 2-1 | 41 nm | 40 nm | 41 nm |
|  | 2-12 | Resist 1-3 | 140 | Resist 2-2 | 41 nm | 40 nm | 41 nm |
|  | 2-13 | Resist 1-3 | 140 | Resist 2-3 | 42 nm | 40 nm | 41 nm |
|  | 2-14 | Resist 1-3 | 140 | Resist 2-4 | 41 nm | 40 nm | 41 nm |
|  | 2-15 | Resist 1-3 | 120 | Resist 2-5 | 42 nm | 40 nm | 41 nm |
|  | 2-16 | Resist 1-3 | 140 | Resist 2-6 | 42 nm | 40 nm | 41 nm |
|  | 2-17 | Resist 1-3 | 140 | Resist 2-7 | 40 nm | 38 nm | 41 nm |
|  | 2-18 | Resist 1-3 | 140 | Resist 2-8 | 40 nm | 39 nm | 41 nm |
|  | 2-19 | Resist 1-3 | 140 | Resist 2-9 | 40 nm | 38 nm | 42 nm |
|  | 2-20 | Resist 1-3 | 140 | Resist 2-10 | 40 nm | 39 nm | 41 nm |
|  | 2-21 | Resist 1-3 | 150 | Resist 2-11 | 40 nm | 40 nm | 40 nm |
|  | 2-22 | Resist 1-3 | 140 | Resist 2-12 | 40 nm | 38 nm | 41 nm |
|  | 2-23 | Resist 1-3 | 160 | Resist 2-13 | 40 nm | 38 nm | 41 nm |
|  | 2-24 | Resist 1-3 | 140 | Resist 2-14 | 40 nm | 38 nm | 41 nm |
|  | 2-25 | Resist 1-3 | 130 | Resist 2-15 | 42 nm | 39 nm | 41 nm |

TABLE 6-continued

|  | 1st resist composition | Baking temp. (° C.) | 2nd resist composition | Size of 1st pattern as developed | Size of 1st pattern after formation of 2nd pattern | Size of 2nd pattern |
|---|---|---|---|---|---|---|
| 2-26 | Resist 1-3 | 140 | Resist 2-16 | 41 nm | 38 nm | 41 nm |
| 2-27 | Resist 1-3 | 130 | Resist 2-17 | 40 nm | 39 nm | 41 nm |
| 2-28 | Resist 1-3 | 130 | Resist 2-18 | 41 nm | 38 nm | 42 nm |
| 2-29 | Resist 1-3 | 140 | Resist 2-19 | 43 nm | 39 nm | 41 nm |
| 2-30 | Resist 1-3 | 130 | Resist 2-20 | 42 nm | 39 nm | 40 nm |
| 2-31 | Resist 1-3 | 140 | Resist 2-21 | 41 nm | 39 nm | 41 nm |
| 2-32 | Resist 1-12 | 140 | Resist 2-1 | 41 nm | 38 nm | 40 nm |
| 2-33 | Resist 1-13 | 140 | Resist 2-1 | 40 nm | 39 nm | 41 nm |
| 2-34 | Resist 1-12 | 140 | Resist 2-22 | 41 nm | 39 nm | 40 nm |
| 2-35 | Resist 1-12 | 140 | Resist 2-23 | 40 nm | 40 nm | 41 nm |

TABLE 7

|  |  | 1st resist composition | Baking temp. (° C.) | 2nd resist composition | Size of 1st pattern as developed | Size of 1st pattern after formation of 2nd pattern | Size of 2nd pattern |
|---|---|---|---|---|---|---|---|
| Comparative Example | 2-1 | Resist 1-3 | — | Resist 2-1 | 40 nm | pattern vanished | 41 nm |
|  | 2-2 | Resist 1-3 | 140 | Resist 1-3 | 40 nm | pattern vanished | 41 nm |
|  | 2-3 | Comparative Resist 1-1 | 140 | Resist 2-1 | 40 nm | pattern vanished | 41 nm |
|  | 2-4 | Comparative Resist 1-2 | 140 | Resist 2-1 | 40 nm | pattern vanished | 40 nm |

In the patterning process of Examples 1-1 to 1-35, the formation of a second resist pattern having lines located between lines of a first resist pattern was observed. In the patterning process of Examples 2-1 to 2-35, the formation of a second resist pattern having lines crossing lines of a first resist pattern was observed.

In Comparative Examples 1-1 and 2-1, the first resist pattern was dissolved away in the developer during formation of the second resist pattern because of a lack of pyrolysis of the base generator by baking after first pattern formation.

In Comparative Examples 1-2, 1-4, 2-2 and 2-4, the first resist pattern was dissolved away upon coating of the second resist material. In Comparative Examples 1-3 and 2-3, the first resist pattern was dissolved away during second development because the base polymer having no amine generator copolymerized was used in the first resist material.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2009-181504 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of:
    coating a first positive resist composition comprising a copolymer comprising recurring units having lactone as an adhesive group, recurring units having an acid labile group, and recurring units having a carbamate structure, and a photoacid generator onto a substrate to form a first resist film, exposing the first resist film to high-energy radiation, post-exposure baking, and developing the first resist film with a developer to form a first resist pattern,
    heating the first resist pattern at 100 to 200° C. for 3 to 200 seconds for inactivating the first resist pattern to acid,
    coating a second positive resist composition comprising a solvent containing an alcohol of 3 to 8 carbon atoms and an optional ether of 6 to 12 carbon atoms onto the first resist pattern-bearing substrate to form a second resist film, exposing the second resist film to high-energy radiation, post-exposure baking, and developing the second resist film with a developer to form a second resist pattern,
    wherein said recurring units having a carbamate structure are represented by formula (a1) or (a2) in the following general formula (1):

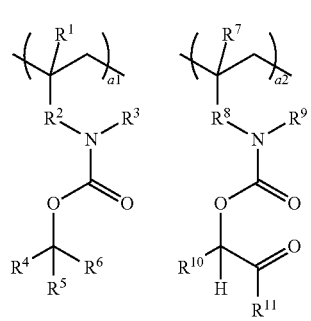

(1)

wherein $R^1$ and $R^7$ are hydrogen or methyl, $R^2$ and $R^8$ are a single bond, methylene, ethylene, phenylene, phenylmethylene, phenylethylene, phenylpropylene, or —C(=O)—$R^{12}$—, wherein $R^{12}$ is a straight, branched or cyclic $C_1$-$C_{10}$ alkylene, $C_6$-$C_{10}$ arylene, or $C_2$-$C_{12}$ alkenylene group, $R^3$ and $R^9$ are hydrogen or a straight, branched or cyclic $C_1$-$C_{10}$ alkyl, or when $R^2$ and $R^8$ are —C(=O)—$R^{12}$—, and $R^3$ and $R^9$ may bond with $R^{12}$ to form a ring with the nitrogen atom to which they are attached, $R^4$, $R^5$ and $R^6$ are hydrogen or a straight, branched or cyclic $C_1$-$C_{10}$ alkyl, $C_6$-$C_{14}$ aryl, or $C_7$-$C_{14}$ alkenyl group, which may contain a straight, branched or cyclic $C_1$-$C_6$ alkyl, nitro, halogen, cyano, trifluoromethyl, carbonyl, ester, lactone ring, carbonate, maleimide, amide, $C_1$-$C_6$ alkoxy, or sulfo group, $R^4$ and $R^5$, $R^5$ and $R^6$, or $R^4$ and $R^6$ may bond together to form a ring with the carbon atom to which they are attached, exclusive of the case where all of $R^4$, $R^5$ and $R^6$ are hydrogen or alkyl, $R^{10}$ and $R^{11}$ are a $C_6$-$C_{14}$ aryl or $C_7$-$C_{14}$ aralkyl group, which may contain a straight, branched or cyclic $C_1$-$C_6$ alkyl, nitro, halogen, cyano, trifluoromethyl, $C_1$-$C_6$ alkoxy, or carbonyl group.

2. The process of claim 1 wherein the first resist pattern includes spaces where no pattern features are formed, and the second resist pattern is formed in the spaces of the first resist pattern, thereby reducing the distance between the first and second pattern features.

3. The process of claim 1 wherein the second resist pattern is formed so as to cross the first resist pattern.

4. The process of claim 1 wherein the second resist pattern is formed in an area where the first resist pattern is not formed and in a different direction from the first resist pattern.

5. The process of claim 1 wherein one or both of the exposure steps to form the first and second resist patterns are by immersion lithography using water.

6. The process of claim 1 wherein said second positive resist composition comprises a base polymer having a 2,2,2-trifluoro-1-hydroxyethyl group.

7. The process of claim 6 wherein the base polymer in said second positive resist composition comprises recurring units having a 2,2,2-trifluoro-1-hydroxyethyl group, represented by the general formula (2):

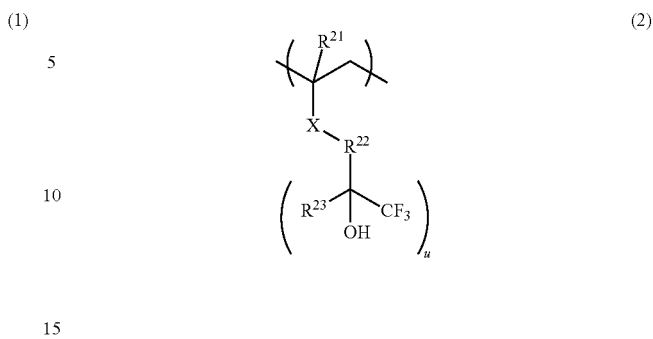

(2)

wherein $R^{21}$ is hydrogen or methyl, X is a single bond, —O— or —C(=O)—O—, u is 1 or 2, in the case of u=1, $R^{22}$ is a straight, branched or cyclic $C_1$-$C_{10}$ alkylene group which may contain an ester group, ether group or fluorine atom, or $R^{22}$ may bond with $R^{23}$ to form a ring with the carbon atom to which they are attached, and in the case of u=2, $R^{22}$ is the foregoing alkylene group, with one carbon-bonded hydrogen atom eliminated, and $R^{23}$ is hydrogen, $C_1$-$C_6$ alkyl or trifluoromethyl, or $R^{23}$ is $C_1$-$C_6$ alkylene when it bonds with $R^{22}$.

8. The process of claim 6 wherein the base polymer in said second positive resist composition is a copolymer comprising recurring units (b) having a 2,2,2-trifluoro-1-hydroxyethyl group and recurring units (c) having an acid labile group, represented by the general formula (3):

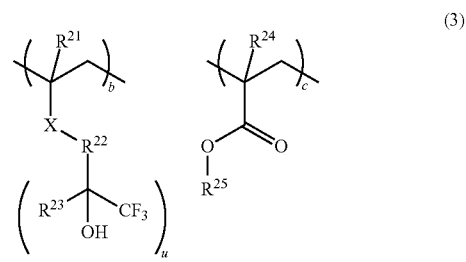

(3)

wherein $R^{21}$ is hydrogen or methyl, X is a single bond, —O— or —C(=O)—O—, u is 1 or 2, in the case of u=1, $R^{22}$ is a straight, branched or cyclic $C_1$-$C_{10}$ alkylene group which may contain an ester group, ether group or fluorine atom, or $R^{22}$ may bond with $R^{23}$ to form a ring with the carbon atom to which they are attached, and in the case of u=2, $R^{22}$ is the foregoing alkylene group, with one carbon-bonded hydrogen atom eliminated, $R^{23}$ is hydrogen, $C_1$-$C_6$ alkyl or trifluoromethyl, or $R^{23}$ is $C_1$-$C_6$ alkylene when it bonds with $R^{22}$, $R^{24}$ is hydrogen or methyl, $R^{25}$ is an acid labile group, b and c are numbers in the range: 0<b<1.0, 0<c<1.0, and 0<b+c ≦1.0.

9. The process of claim 6 wherein the base polymer in said second positive resist composition is a copolymer comprising recurring units (b) having a 2,2,2-trifluoro-1-hydroxyethyl group, recurring units (c) having an acid labile group, and recurring units (d-1) having a phenol, carboxyphenyl, hydroxynaphthyl or carboxynaphthyl group, represented by the general formula (4):

(4)

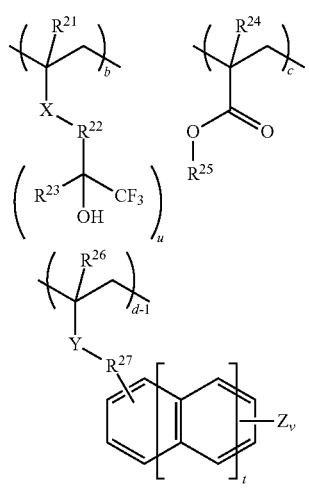

wherein $R^{21}$ is hydrogen or methyl, X is a single bond, —O— or —C(=O)—O—, u is 1 or 2, in the case of u=1, $R^{22}$ is a straight, branched or cyclic $C_1$-$C_{10}$ alkylene group which may contain an ester group, ether group or fluorine atom, or $R^{22}$ may bond with $R^{23}$ to form a ring with the carbon atom to which they are attached, and in the case of u=2, $R^{22}$ is the foregoing alkylene group, with one carbon-bonded hydrogen atom eliminated, $R^{23}$ is hydrogen, $C_1$-$C_6$ alkyl or trifluoromethyl, or $R^{23}$ is $C_1$-$C_6$ alkylene when it bonds with $R^{22}$, $R^{24}$ is hydrogen or methyl, $R^{25}$ is an acid labile group, $R^{26}$ is hydrogen or methyl, Y is a single bond, —C(=O)—O— or —C(=O)—NH—, $R^{27}$ is a single bond or a straight or branched $C_1$-$C_6$ alkylene group, Z is hydroxyl or carboxyl, t is 0 or 1, v is 1 or 2, b, c and d-1 are numbers in the range: $0<b<1.0$, $0<c<1.0$, $0<(d-1)<1.0$, and $0<b+c+(d-1)\leq 1.0$.

10. The process of claim 6 wherein the base polymer in said second positive resist composition is a copolymer comprising recurring units (b) having a 2,2,2-trifluoro-1-hydroxyethyl group, recurring units (c) having an acid labile group, and recurring units (d-2) derived from hydroxyacenaphthylene or carboxyacenaphthylene, represented by the general formula (5):

(5)

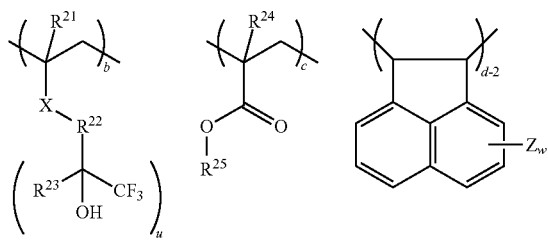

wherein $R^{21}$ is hydrogen or methyl, X is a single bond, —O— or —C(=O)—O—, u is 1 or 2, in the case of u=1, $R^{22}$ is a straight, branched or cyclic $C_1$-$C_{10}$ alkylene group which may contain an ester group, ether group or fluorine atom, or $R^{22}$ may bond with $R^{23}$ to form a ring with the carbon atom to which they are attached, and in the case of u=2, $R^{22}$ is the foregoing alkylene group, with one carbon-bonded hydrogen atom eliminated, $R^{23}$ is hydrogen, $C_1$-$C_6$ alkyl or trifluoromethyl, or $R^{23}$ is $C_1$-$C_6$ alkylene when it bonds with $R^{22}$, $R^{24}$ is hydrogen or methyl, $R^{25}$ is an acid labile group, Z is hydroxyl or carboxyl, w is 1 or 2, b, c and d-2 are numbers in the range: $0<b<1.0$, $0<c<1.0$, $0<(d-2)<1.0$, and $0<b+c+(d-2)\leq 1.0$.

11. The process of claim 1 wherein the alcohol of 3 to 8 carbon atoms is selected from the group consisting of n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol, and mixtures of two or more of the foregoing.

12. The process of claim 1 wherein the ether of 6 to 12 carbon atoms is selected from the group consisting of methyl cyclopentyl ether, methyl cyclohexyl ether, diisopropyl ether, diisobutyl ether, diisopentyl ether, di-n-pentyl ether, methyl cyclopentyl ether, methyl cyclohexyl ether, di-n-butyl ether, di-sec-butyl ether, di-sec-pentyl ether, di-tert-amyl ether, di-n-hexyl ether, anisole, 2-methylanisole, 3-methylanisole, 4-methylanisole, 2,3-dimethylanisole, 2,4-dimethylanisole, 3,4-dimethylanisole, 2,5-dimethylanisole, 2,6-dimethylanisole, 3,5-dimethylanisole, 3,6-dimethylanisole, 2,3,4-trimethylanisole, 2,3,6-trimethylanisole, 2,4,6-trimethylanisole, 2,4,5,6-tetramethylanisole, 2-ethylanisole, 3-ethylanisole, 4-ethylanisole, 2-isopropylanisole, 3-isopropylanisole, 4-isopropylanisole, 4-propylanisole, 2-butylanisole, 3-butylanisole, 4-butylanisole, 2-tert-butylanisole, 3-tert-butylanisole, 4-tert-butylanisole, pentamethylanisole, 2-vinylanisole, 3-vinylanisole, 4-methoxystyrene, ethyl phenyl ether, propyl phenyl ether, butyl phenyl ether, ethyl 3,5-xylyl ether, ethyl 2,6-xylyl ether, ethyl 2,4-xylyl ether, ethyl 3,4-xylyl ether, ethyl 2,5-xylyl ether, methyl benzyl ether, ethyl benzyl ether, isopropyl benzyl ether, propyl benzyl ether, methyl phenethyl ether, ethyl phenethyl ether, isopropyl phenethyl ether, propyl phenethyl ether, butyl phenethyl ether, vinyl phenyl ether, allyl phenyl ether, vinyl benzyl ether, allyl benzyl ether, vinyl phenethyl ether, allyl phenethyl ether, 4-ethylphenetole, and tert-butyl phenyl ether, and mixtures of two or more of the foregoing.

13. The process of claim 1 wherein in said second positive resist composition, the solvent containing an alcohol of 3 to 8 carbon atoms and an optional ether of 6 to 12 carbon atoms does not dissolve away the first resist pattern, allows components of the second resist composition to be dissolved therein, and is such that the first resist film experiences a slimming of not more than 10 nm when the solvent is dispensed on the first resist film for 30 seconds and then removed by spin drying and baking at a temperature not higher than 130° C.

* * * * *